United States Patent
Miyairi et al.

(10) Patent No.: US 12,477,781 B2
(45) Date of Patent: Nov. 18, 2025

(54) SEMICONDUCTOR DEVICE AND METHOD FOR MANUFACTURING THE SAME

(71) Applicant: SEMICONDUCTOR ENERGY LABORATORY CO., LTD., Atsugi (JP)

(72) Inventors: Hidekazu Miyairi, Kanagawa (JP); Takeshi Osada, Kanagawa (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/736,777

(22) Filed: Jun. 7, 2024

(65) Prior Publication Data

US 2024/0413250 A1 Dec. 12, 2024

Related U.S. Application Data

(63) Continuation of application No. 18/098,769, filed on Jan. 19, 2023, now Pat. No. 12,009,434, which is a (Continued)

(30) Foreign Application Priority Data

Oct. 24, 2008 (JP) ................ 2008-274540

(51) Int. Cl.
*H10D 30/67* (2025.01)
*H01L 21/02* (2006.01)
(Continued)

(52) U.S. Cl.
CPC ... *H10D 30/6755* (2025.01); *H01L 21/02565* (2013.01); *H01L 21/47635* (2013.01);
(Continued)

(58) Field of Classification Search
CPC ........... H10D 30/6755; H10D 30/6734; H10D 30/673; H10D 30/6715; H10D 30/6733;
(Continued)

(56) References Cited

U.S. PATENT DOCUMENTS 4,615,102 A 10/1986 Suzuki et al.
5,053,347 A 10/1991 Wu
(Continued)

FOREIGN PATENT DOCUMENTS

CN 001527243 A 9/2004
CN 001554974 A 12/2004
(Continued)

OTHER PUBLICATIONS

Takahashi.K et al., "4p-N-10 Back-channel control in amorphous In—Ga—Zn—O TFTs", 69th Japan Society of Applied Physics, Sep. 1, 2008, No. 2, p. 851.
(Continued)

*Primary Examiner* — Eric W Jones
(74) *Attorney, Agent, or Firm* — Fish & Richardson P.C.

(57) ABSTRACT

As a display device has a higher definition, the number of pixels, gate lines, and signal lines are increased. When the number of the gate lines and the signal lines are increased, a problem of higher manufacturing cost, because it is difficult to mount an IC chip including a driver circuit for driving of the gate and signal lines by bonding or the like. A pixel portion and a driver circuit for driving the pixel portion are provided over the same substrate, and at least part of the driver circuit includes a thin film transistor using an oxide semiconductor interposed between gate electrodes provided above and below the oxide semiconductor. Therefore, when the pixel portion and the driver portion are provided over the same substrate, manufacturing cost can be reduced.

13 Claims, 26 Drawing Sheets

Related U.S. Application Data continuation of application No. 17/002,971, filed on Aug. 26, 2020, now Pat. No. 11,563,124, which is a continuation of application No. 16/180,565, filed on Nov. 5, 2018, now Pat. No. 10,763,372, which is a continuation of application No. 15/814,919, filed on Nov. 16, 2017, now Pat. No. 10,153,380, which is a continuation of application No. 15/443,096, filed on Feb. 27, 2017, now Pat. No. 10,170,632, which is a continuation of application No. 15/071,674, filed on Mar. 16, 2016, now Pat. No. 9,601,603, which is a continuation of application No. 14/694,212, filed on Apr. 23, 2015, now Pat. No. 9,318,512, which is a continuation of application No. 13/302,222, filed on Nov. 22, 2011, now Pat. No. 9,029,851, which is a continuation of application No. 12/581,918, filed on Oct. 20, 2009, now Pat. No. 8,067,775.

(51) Int. Cl.
| | |
|---|---|
| *H01L 21/4763* | (2006.01) |
| *H01L 21/477* | (2006.01) |
| *H10D 62/80* | (2025.01) |
| *H10D 64/27* | (2025.01) |
| *H10D 64/62* | (2025.01) |
| *H10D 86/01* | (2025.01) |
| *H10D 86/40* | (2025.01) |
| *H10D 86/60* | (2025.01) |
| *H10D 99/00* | (2025.01) |

(52) U.S. Cl.
CPC ....... *H01L 21/477* (2013.01); *H10D 30/6715* (2025.01); *H10D 30/6729* (2025.01); *H10D 30/673* (2025.01); *H10D 30/6733* (2025.01); *H10D 30/6734* (2025.01); *H10D 62/80* (2025.01); *H10D 64/512* (2025.01); *H10D 64/62* (2025.01); *H10D 86/021* (2025.01); *H10D 86/423* (2025.01); *H10D 86/471* (2025.01); *H10D 86/60* (2025.01); *H10D 99/00* (2025.01)

(58) Field of Classification Search
CPC .. H10D 30/6729; H10D 99/00; H10D 86/471; H10D 86/60; H10D 86/021; H10D 86/423; H10D 64/512; H10D 62/80; H01L 21/02565; H01L 21/47635; H01L 21/477
USPC .............................................. 257/40, 43, 59
See application file for complete search history.

(56) References Cited

U.S. PATENT DOCUMENTS

| | | | |
|---|---|---|---|
| 5,079,606 A | 1/1992 | Yamamura et al. | |
| 5,338,959 A | 8/1994 | Kim et al. | |
| 5,526,304 A | 6/1996 | Kawamura | |
| 5,677,550 A | 10/1997 | Lee | |
| 5,731,856 A | 3/1998 | Kim et al. | |
| 5,744,823 A | 4/1998 | Harkin et al. | |
| 5,744,864 A | 4/1998 | Cillessen et al. | |
| 5,847,410 A | 12/1998 | Nakajima | |
| 5,895,956 A | 4/1999 | Oowaki et al. | |
| 6,096,582 A | 8/2000 | Inoue et al. | |
| 6,130,461 A | 10/2000 | Oowaki et al. | |
| 6,172,733 B1 | 1/2001 | Hong et al. | |
| 6,294,274 B1 | 9/2001 | Kawazoe et al. | |
| 6,342,408 B1 | 1/2002 | Oowaki et al. | |
| 6,372,558 B1 | 4/2002 | Yamanaka et al. | |
| 6,407,463 B2 | 6/2002 | Kumagai et al. | |
| 6,469,356 B2 | 10/2002 | Kumagai et al. | |
| 6,545,323 B2 | 4/2003 | Oowaki et al. | |
| 6,563,174 B2 | 5/2003 | Kawasaki et al. | |
| 6,580,475 B2 | 6/2003 | Yamazaki et al. | |
| 6,586,346 B1 | 7/2003 | Yamazaki et al. | |
| 6,639,246 B2 | 10/2003 | Honda | |
| 6,670,595 B1 | 12/2003 | Sasaki et al. | |
| 6,681,992 B2 | 1/2004 | Iihama | |
| 6,727,522 B1 | 4/2004 | Kawasaki et al. | |
| 6,734,505 B2 | 5/2004 | Suzuki et al. | |
| 6,737,306 B2 | 5/2004 | Yamazaki et al. | |
| 6,740,938 B2 | 5/2004 | Tsunoda et al. | |
| 6,759,678 B2 | 7/2004 | Yamazaki et al. | |
| 6,788,567 B2 | 9/2004 | Fujimori | |
| 6,800,883 B2 | 10/2004 | Furuya et al. | |
| 6,815,772 B2 | 11/2004 | Takemura | |
| 6,906,344 B2 | 6/2005 | Yamazaki et al. | |
| 6,927,456 B2 | 8/2005 | Honda | |
| 6,960,812 B2 | 11/2005 | Yamazaki et al. | |
| 7,002,181 B2 | 2/2006 | Suzuki et al. | |
| 7,023,410 B2 | 4/2006 | Lee et al. | |
| 7,026,713 B2 | 4/2006 | Hoffman et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,067,843 B2 | 6/2006 | Carcia et al. | |
| 7,084,019 B2 | 8/2006 | Yamazaki et al. | |
| 7,105,868 B2 | 9/2006 | Nause et al. | |
| 7,106,292 B2 * | 9/2006 | Moon | G11C 19/28 345/204 |
| 7,112,817 B2 | 9/2006 | Yamazaki et al. | |
| 7,122,835 B1 * | 10/2006 | Ikeda | G02F 1/13454 257/E27.113 |
| 7,145,174 B2 | 12/2006 | Chiang et al. | |
| 7,154,119 B2 | 12/2006 | Yamazaki et al. | |
| 7,161,179 B2 | 1/2007 | Yamazaki et al. | |
| 7,211,825 B2 | 5/2007 | Shih et al. | |
| 7,225,986 B2 | 6/2007 | Mizutani et al. | |
| 7,229,862 B2 | 6/2007 | Yamazaki et al. | |
| 7,230,601 B2 | 6/2007 | Yamazaki et al. | |
| 7,235,810 B1 * | 6/2007 | Yamazaki | H10D 30/6739 257/E29.279 |
| 7,262,463 B2 | 8/2007 | Hoffman | |
| 7,279,714 B2 | 10/2007 | Koo et al. | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,301,211 B2 | 11/2007 | Yamazaki et al. | |
| 7,317,205 B2 * | 1/2008 | Yamazaki | H01L 21/02532 257/66 |
| 7,317,497 B2 * | 1/2008 | Shimizu | G02F 1/1362 349/44 |
| 7,323,356 B2 | 1/2008 | Hosono et al. | |
| 7,330,234 B2 * | 2/2008 | Murakami | H10D 30/6725 257/E29.283 |
| 7,333,586 B2 | 2/2008 | Jang | |
| 7,385,224 B2 | 6/2008 | Ishii et al. | |
| 7,402,506 B2 | 7/2008 | Levy et al. | |
| 7,405,716 B2 | 7/2008 | Lee et al. | |
| 7,411,209 B2 | 8/2008 | Endo et al. | |
| 7,427,776 B2 | 9/2008 | Hoffman et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,465,957 B2 * | 12/2008 | Arao | H10D 86/441 257/E21.414 |
| 7,468,304 B2 | 12/2008 | Kaji et al. | |
| 7,470,607 B2 | 12/2008 | Carcia et al. | |
| 7,491,987 B2 | 2/2009 | Genrikh et al. | |
| 7,501,293 B2 | 3/2009 | Ito et al. | |
| 7,507,618 B2 | 3/2009 | Dunbar | |
| 7,529,334 B2 | 5/2009 | Jang | |
| 7,535,022 B2 | 5/2009 | Yamazaki et al. | |
| 7,544,967 B2 | 6/2009 | Kim et al. | |
| 7,560,732 B2 | 7/2009 | Yamazaki et al. | |
| 7,564,058 B2 | 7/2009 | Yamazaki et al. | |
| 7,566,904 B2 | 7/2009 | Ishii | |
| 7,572,688 B2 | 8/2009 | Yamazaki et al. | |
| 7,575,966 B2 | 8/2009 | Lai et al. | |
| 7,576,394 B2 | 8/2009 | Furuta et al. | |

(56) References Cited

U.S. PATENT DOCUMENTS

| | | |
|---|---|---|
| 7,601,984 B2 | 10/2009 | Sano et al. |
| 7,602,215 B2 | 10/2009 | Osame et al. |
| 7,608,531 B2 | 10/2009 | Isa et al. |
| 7,609,349 B2 * | 10/2009 | Yang ............... G02F 1/134363 |
| | | 349/147 |
| 7,622,371 B2 | 11/2009 | Pan et al. |
| 7,627,076 B2 | 12/2009 | Tobita |
| 7,635,889 B2 | 12/2009 | Isa et al. |
| 7,645,478 B2 | 1/2010 | Thelss et al. |
| 7,652,294 B2 * | 1/2010 | Yamazaki ............... H10D 86/60 |
| | | 438/149 |
| 7,663,302 B2 | 2/2010 | Shin et al. |
| 7,674,650 B2 | 3/2010 | Akimoto et al. |
| 7,687,807 B2 | 3/2010 | Koo et al. |
| 7,687,808 B2 | 3/2010 | Umezaki |
| 7,691,666 B2 | 4/2010 | Levy et al. |
| 7,705,354 B2 * | 4/2010 | Yamazaki ............... H10D 86/60 |
| | | 257/E27.131 |
| 7,709,843 B2 | 5/2010 | Yamazaki et al. |
| 7,714,975 B1 * | 5/2010 | Yamazaki ......... G02F 1/136204 |
| | | 349/157 |
| 7,732,251 B2 | 6/2010 | Hoffman et al. |
| 7,732,819 B2 | 6/2010 | Akimoto et al. |
| 7,733,015 B2 | 6/2010 | Saito |
| 7,733,312 B2 * | 6/2010 | Moon ............... G09G 3/006 |
| | | 345/94 |
| 7,745,824 B2 | 6/2010 | Yamazaki et al. |
| 7,767,106 B2 | 8/2010 | Chang |
| 7,772,021 B2 | 8/2010 | Lee et al. |
| 7,781,770 B2 | 8/2010 | Yamazaki et al. |
| 7,790,521 B2 | 9/2010 | Asano |
| 7,791,072 B2 | 9/2010 | Kumomi et al. |
| 7,791,082 B2 | 9/2010 | Iwasaki |
| 7,795,613 B2 | 9/2010 | Ito et al. |
| 7,829,444 B2 | 11/2010 | Yabuta et al. |
| 7,842,952 B2 * | 11/2010 | Koo ............... H10K 19/10 |
| | | 257/E29.29 |
| 7,843,217 B2 | 11/2010 | Osame et al. |
| 7,847,287 B2 | 12/2010 | Kim et al. |
| 7,859,187 B2 | 12/2010 | Yamazaki et al. |
| 7,859,510 B2 | 12/2010 | Umezaki |
| 7,863,611 B2 | 1/2011 | Abe et al. |
| 7,867,636 B2 | 1/2011 | Nakagawara et al. |
| 7,868,326 B2 | 1/2011 | Sano et al. |
| 7,872,259 B2 | 1/2011 | Den et al. |
| 7,872,504 B2 | 1/2011 | Kim et al. |
| 7,884,360 B2 | 2/2011 | Takechi et al. |
| 7,910,490 B2 | 3/2011 | Akimoto et al. |
| 7,923,722 B2 | 4/2011 | Ryu et al. |
| 7,932,521 B2 | 4/2011 | Akimoto et al. |
| 7,935,641 B2 | 5/2011 | Kim et al. |
| 7,939,822 B2 | 5/2011 | Maekawa. et al. |
| 7,940,085 B2 | 5/2011 | Kim et al. |
| 7,960,730 B2 | 6/2011 | Lee et al. |
| 7,964,876 B2 | 6/2011 | Umezaki |
| 7,978,274 B2 | 7/2011 | Umezaki et al. |
| 8,023,610 B2 * | 9/2011 | Miyayama ............... G11C 19/28 |
| | | 377/79 |
| 8,031,158 B2 | 10/2011 | Jang et al. |
| 8,035,415 B2 | 10/2011 | Osame et al. |
| 8,054,279 B2 | 11/2011 | Umezaki et al. |
| 8,067,775 B2 * | 11/2011 | Miyairi ............... H10D 30/6715 |
| | | 257/E29.291 |
| 8,089,445 B2 | 1/2012 | Shin et al. |
| 8,102,340 B2 | 1/2012 | Lee et al. |
| 8,106,400 B2 | 1/2012 | Miyairi et al. |
| 8,124,973 B2 | 2/2012 | Yamazaki et al. |
| 8,134,156 B2 | 3/2012 | Akimoto |
| 8,143,678 B2 | 3/2012 | Kim et al. |
| 8,158,464 B2 | 4/2012 | Akimoto |
| 8,178,880 B2 | 5/2012 | Yamazaki et al. |
| 8,203,144 B2 | 6/2012 | Hoffman et al. |
| 8,203,146 B2 | 6/2012 | Abe et al. |
| 8,217,680 B2 | 7/2012 | Kim et al. |
| 8,232,552 B2 | 7/2012 | Yano et al. |
| 8,274,077 B2 | 9/2012 | Akimoto et al. |
| 8,300,201 B2 * | 10/2012 | Yamazaki ............... H10D 30/67 |
| | | 349/151 |
| 8,330,492 B2 | 12/2012 | Umezaki |
| 8,368,079 B2 | 2/2013 | Akimoto |
| 8,456,396 B2 | 6/2013 | Umezaki |
| 8,462,100 B2 | 6/2013 | Umezaki |
| 8,502,944 B2 | 8/2013 | Ahn et al. |
| 8,513,661 B2 | 8/2013 | Takahashi et al. |
| 8,520,159 B2 | 8/2013 | Umezaki et al. |
| 8,525,165 B2 | 9/2013 | Akimoto |
| 8,558,323 B2 | 10/2013 | Kim et al. |
| 8,581,260 B2 | 11/2013 | Yamazaki et al. |
| 8,581,825 B2 | 11/2013 | Jang et al. |
| 8,586,979 B2 * | 11/2013 | Son ............... H10D 30/6755 |
| | | 257/369 |
| 8,598,591 B2 | 12/2013 | Umezaki |
| 8,633,488 B2 | 1/2014 | Yamazaki et al. |
| 8,643,586 B2 | 2/2014 | Umezaki |
| 8,647,031 B2 | 2/2014 | Hoffman et al. |
| 8,664,976 B2 | 3/2014 | Osame et al. |
| 8,742,811 B2 | 6/2014 | Umezaki |
| 8,743,044 B2 | 6/2014 | Umezaki et al. |
| 8,866,724 B2 * | 10/2014 | Moon ............... G09G 3/3677 |
| | | 377/64 |
| 8,902,145 B2 | 12/2014 | Umezaki et al. |
| 8,908,115 B2 | 12/2014 | Umezaki et al. |
| 9,029,851 B2 * | 5/2015 | Miyairi ............... H10D 86/471 |
| | | 257/43 |
| 9,070,593 B2 | 6/2015 | Umezaki |
| 9,099,361 B2 | 8/2015 | Yamazaki et al. |
| 9,184,183 B2 | 11/2015 | Umezaki |
| 9,214,473 B2 | 12/2015 | Umezaki |
| 9,245,891 B2 | 1/2016 | Umezaki |
| 9,263,468 B2 | 2/2016 | Umezaki et al. |
| 9,312,285 B2 * | 4/2016 | Lee ............... H10D 86/441 |
| 9,318,512 B2 * | 4/2016 | Miyairi ............... H01L 21/47635 |
| 9,335,599 B2 | 5/2016 | Umezaki |
| 9,406,699 B2 | 8/2016 | Umezaki |
| 9,419,026 B2 | 8/2016 | Yamazaki et al. |
| 9,461,071 B2 | 10/2016 | Umezaki |
| 9,583,513 B2 | 2/2017 | Umezaki |
| 9,601,603 B2 * | 3/2017 | Miyairi ............... H10D 86/021 |
| 9,606,408 B2 | 3/2017 | Umezaki et al. |
| 9,684,215 B2 | 6/2017 | Umezaki |
| 9,780,124 B2 | 10/2017 | Yamazaki et al. |
| 9,954,010 B2 | 4/2018 | Umezaki |
| 10,088,725 B2 | 10/2018 | Umezaki |
| 10,153,380 B2 * | 12/2018 | Miyairi ............... H10D 86/423 |
| 10,170,632 B2 * | 1/2019 | Miyairi ............... H10D 99/00 |
| 10,304,868 B2 | 5/2019 | Umezaki |
| 10,325,932 B2 | 6/2019 | Umezaki |
| 10,401,699 B2 | 9/2019 | Umezaki |
| 10,720,452 B2 | 7/2020 | Umezaki |
| 11,133,335 B2 | 9/2021 | Umezaki |
| 11,189,647 B2 | 11/2021 | Umezaki |
| 11,563,037 B2 | 1/2023 | Umezaki |
| 11,563,124 B2 * | 1/2023 | Miyairi ............... H10D 30/673 |
| 11,664,388 B2 | 5/2023 | Umezaki |
| 12,009,434 B2 * | 6/2024 | Miyairi ............... H10D 30/6734 |
| 2001/0030323 A1 | 10/2001 | Ikeda |
| 2001/0046027 A1 | 11/2001 | Tai et al. |
| 2002/0014624 A1 | 2/2002 | Yamazaki et al. |
| 2002/0043660 A1 | 4/2002 | Yamazaki et al. |
| 2002/0043662 A1 | 4/2002 | Yamazaki et al. |
| 2002/0044111 A1 | 4/2002 | Yamazaki et al. |
| 2002/0056838 A1 | 5/2002 | Ogawa |
| 2002/0132454 A1 | 9/2002 | Ohtsu et al. |
| 2002/0139978 A1 | 10/2002 | Yamazaki et al. |
| 2002/0149053 A1 | 10/2002 | Tsunoda et al. |
| 2002/0158829 A1 | 10/2002 | Yamazaki et al. |
| 2003/0030381 A1 | 2/2003 | Yamazaki et al. |
| 2003/0089913 A1 | 5/2003 | Takayama. et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0051823 A1 | 3/2004 | Choi |
| 2004/0127038 A1 | 7/2004 | Carcia et al. |

(56) References Cited

U.S. PATENT DOCUMENTS

| | | |
|---|---|---|
| 2004/0184027 A1 | 9/2004 | Mizutani et al. |
| 2005/0017302 A1 | 1/2005 | Hoffman |
| 2005/0156859 A1 | 7/2005 | Jang et al. |
| 2005/0162579 A1 | 7/2005 | Jeong. et al. |
| 2005/0168491 A1 | 8/2005 | Takahara et al. |
| 2005/0199959 A1 | 9/2005 | Chiang et al. |
| 2005/0199960 A1 | 9/2005 | Hoffman et al. |
| 2005/0201508 A1 | 9/2005 | Shin et al. |
| 2005/0239238 A1 | 10/2005 | Schuele |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0054893 A1 | 3/2006 | Nathan et al. |
| 2006/0091397 A1 | 5/2006 | Akimoto et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0125098 A1 | 6/2006 | Hoffman et al. |
| 2006/0166415 A1 | 7/2006 | Afentakis et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0205126 A1* | 9/2006 | Yen .................. H10D 86/60 438/164 |
| 2006/0208977 A1 | 9/2006 | Kimura |
| 2006/0228974 A1* | 10/2006 | Thelss .................. H10K 71/18 445/24 |
| 2006/0231882 A1 | 10/2006 | Kim et al. |
| 2006/0238135 A1 | 10/2006 | Kimura |
| 2006/0244107 A1 | 11/2006 | Sugihara. et al. |
| 2006/0262054 A1* | 11/2006 | Yamazaki ................ G09G 3/20 345/77 |
| 2006/0262066 A1* | 11/2006 | Yamazaki ............ G09G 3/3688 345/98 |
| 2006/0284171 A1 | 12/2006 | Levy et al. |
| 2006/0284172 A1 | 12/2006 | Ishii |
| 2006/0286737 A1* | 12/2006 | Levy .................. H10D 30/6755 438/493 |
| 2006/0292726 A1 | 12/2006 | Akimoto et al. |
| 2006/0292777 A1 | 12/2006 | Dunbar |
| 2007/0018163 A1 | 1/2007 | Chiang et al. |
| 2007/0024187 A1 | 2/2007 | Shin et al. |
| 2007/0040786 A1* | 2/2007 | Chung ................ G11C 19/184 345/92 |
| 2007/0046191 A1 | 3/2007 | Saito |
| 2007/0052025 A1 | 3/2007 | Yabuta |
| 2007/0054507 A1* | 3/2007 | Kaji .................. H01L 21/02554 438/795 |
| 2007/0072439 A1* | 3/2007 | Akimoto ............ H10D 30/6755 438/795 |
| 2007/0080910 A1* | 4/2007 | Park .................. G09G 3/3208 345/77 |
| 2007/0085961 A1* | 4/2007 | Jeong .................. H10K 59/131 349/149 |
| 2007/0087534 A1* | 4/2007 | Yasukawa ............ H10D 86/421 257/E21.415 |
| 2007/0090365 A1 | 4/2007 | Hayashi et al. |
| 2007/0096816 A1 | 5/2007 | Paul et al. |
| 2007/0103063 A1* | 5/2007 | Kim .................... H10K 59/131 313/504 |
| 2007/0108446 A1 | 5/2007 | Akimoto |
| 2007/0120457 A1* | 5/2007 | Goh .................... H10K 59/805 313/463 |
| 2007/0122649 A1* | 5/2007 | Lee .................... H10D 86/60 257/E29.147 |
| 2007/0152217 A1* | 7/2007 | Lai .................... H10D 30/6755 438/149 |
| 2007/0172591 A1 | 7/2007 | Seo et al. |
| 2007/0181421 A1* | 8/2007 | Wei .................... C23C 14/354 204/298.02 |
| 2007/0187678 A1* | 8/2007 | Hirao ................ H01L 21/02595 257/E21.462 |
| 2007/0187760 A1 | 8/2007 | Furuta et al. |
| 2007/0194379 A1 | 8/2007 | Hosono et al. |
| 2007/0205976 A1* | 9/2007 | Takatori .................... G09G 3/20 345/100 |
| 2007/0222380 A1 | 9/2007 | Yamazaki et al. |
| 2007/0252928 A1 | 11/2007 | Ito et al. |
| 2007/0257252 A1* | 11/2007 | Wang .................. H10K 10/462 257/40 |
| 2007/0272922 A1 | 11/2007 | Kim et al. |
| 2007/0272948 A1* | 11/2007 | Koo .................... H10D 86/00 257/E27.111 |
| 2007/0287296 A1 | 12/2007 | Chang |
| 2008/0006877 A1 | 1/2008 | Mardilovich et al. |
| 2008/0023703 A1* | 1/2008 | Hoffman ............ H10D 30/6755 257/E29.295 |
| 2008/0035927 A1* | 2/2008 | Yamazaki ............ H10D 86/60 257/E27.113 |
| 2008/0038882 A1 | 2/2008 | Takechi et al. |
| 2008/0038929 A1* | 2/2008 | Chang .................. H10F 77/244 257/E21.31 |
| 2008/0042217 A1 | 2/2008 | Jeong et al. |
| 2008/0050595 A1 | 2/2008 | Nakagawara. et al. |
| 2008/0073653 A1 | 3/2008 | Iwasaki |
| 2008/0080221 A1 | 4/2008 | Koo et al. |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0135947 A1* | 6/2008 | Koo .................... H10K 19/10 438/99 |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0299689 A1 | 12/2008 | Yamazaki |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0033818 A1 | 2/2009 | Nakajima et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0085909 A1 | 4/2009 | Chen et al. |
| 2009/0091678 A1 | 4/2009 | Jeong et al. |
| 2009/0102829 A1* | 4/2009 | Abe ........................ G09G 3/325 345/55 |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0167974 A1 | 7/2009 | Choi et al. |
| 2009/0174834 A1* | 7/2009 | Choi .................... H10D 86/441 445/35 |
| 2009/0186445 A1 | 7/2009 | Akimoto |
| 2009/0189155 A1 | 7/2009 | Akimoto |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0003783 A1 | 1/2010 | Akimoto |
| 2010/0025678 A1 | 2/2010 | Yamazaki et al. |
| 2010/0051937 A1 | 3/2010 | Kaji et al. |
| 2010/0065844 A1 | 3/2010 | Tokunaga |
| 2010/0084650 A1 | 4/2010 | Yamazaki et al. |
| 2010/0084651 A1 | 4/2010 | Yamazaki et al. |

(56) References Cited

U.S. PATENT DOCUMENTS

| | | | |
|---|---|---|---|
| 2010/0085081 A1 | 4/2010 | Ofuji et al. | |
| 2010/0092800 A1 | 4/2010 | Itagaki et al. | |
| 2010/0102313 A1* | 4/2010 | Miyairi | H01L 21/02565 |
| | | | 257/E29.291 |
| 2010/0102314 A1 | 4/2010 | Miyairi et al. | |
| 2010/0109002 A1 | 5/2010 | Itagaki et al. | |
| 2010/0117079 A1 | 5/2010 | Miyairi et al. | |
| 2010/0127279 A1* | 5/2010 | Takahashi | H10F 39/195 |
| | | | 250/367 |
| 2010/0136743 A1 | 6/2010 | Akimoto et al. | |
| 2010/0244022 A1 | 9/2010 | Takahashi et al. | |
| 2010/0252826 A1* | 10/2010 | Yamazaki | H10D 86/423 |
| | | | 257/E29.296 |
| 2010/0301326 A1 | 12/2010 | Miyairi et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0122988 A1* | 5/2011 | Miyayama | G11C 19/28 |
| | | | 377/64 |
| 2011/0163311 A1 | 7/2011 | Akimoto et al. | |
| 2011/0221475 A1 | 9/2011 | Koyama et al. | |
| 2012/0061668 A1* | 3/2012 | Miyairi | H10D 62/80 |
| | | | 257/E27.06 |
| 2012/0104386 A1 | 5/2012 | Miyairi et al. | |
| 2012/0205671 A1 | 8/2012 | Yamazaki et al. | |
| 2013/0295701 A1 | 11/2013 | Ahn et al. | |
| 2015/0137118 A1 | 5/2015 | Umezaki et al. | |
| 2015/0228677 A1* | 8/2015 | Miyairi | H10D 64/512 |
| | | | 438/104 |
| 2016/0197166 A1* | 7/2016 | Miyairi | H10D 86/021 |
| | | | 438/104 |
| 2017/0170328 A1* | 6/2017 | Miyairi | H10D 30/6715 |
| 2017/0176794 A1 | 6/2017 | Umezaki et al. | |
| 2017/0207241 A1 | 7/2017 | Umezaki | |
| 2018/0076331 A1* | 3/2018 | Miyairi | H10D 30/6733 |
| 2019/0074379 A1* | 3/2019 | Miyairi | H10D 64/62 |
| 2021/0050453 A1* | 2/2021 | Miyairi | H10D 86/60 |
| 2023/0155033 A1* | 5/2023 | Miyairi | H10D 30/6734 |
| | | | 257/43 |
| 2023/0268352 A1 | 8/2023 | Umezaki | |
| 2024/0413250 A1* | 12/2024 | Miyairi | H10D 86/021 |

FOREIGN PATENT DOCUMENTS

| | | |
|---|---|---|
| CN | 001614486 A | 5/2005 |
| CN | 001941299 A | 4/2007 |
| CN | 101036232 A | 9/2007 |
| EP | 0553775 A | 8/1993 |
| EP | 0810652 A | 12/1997 |
| EP | 1132960 A | 9/2001 |
| EP | 1178536 A | 2/2002 |
| EP | 1544907 A | 6/2005 |
| EP | 1624333 A | 2/2006 |
| EP | 1624489 A | 2/2006 |
| EP | 1737044 A | 12/2006 |
| EP | 1770788 A | 4/2007 |
| EP | 1895545 A | 3/2008 |
| EP | 1906414 A | 4/2008 |
| EP | 1995787 A | 11/2008 |
| EP | 1998373 A | 12/2008 |
| EP | 1998374 A | 12/2008 |
| EP | 1998375 A | 12/2008 |
| EP | 2104110 A | 9/2009 |
| EP | 2172972 A | 4/2010 |
| EP | 2226847 A | 9/2010 |
| EP | 2270849 A | 1/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 63-301565 A | 12/1988 |
| JP | 02-156676 A | 6/1990 |
| JP | 03-231472 A | 10/1991 |
| JP | 05-053147 A | 3/1993 |
| JP | 05-218326 A | 8/1993 |
| JP | 05-251705 A | 9/1993 |
| JP | 05-289632 A | 11/1993 |
| JP | 06-202156 A | 7/1994 |
| JP | 06-291283 A | 10/1994 |
| JP | 07-183403 A | 7/1995 |
| JP | 07-312426 A | 11/1995 |
| JP | 08-213564 A | 8/1996 |
| JP | 08-264794 A | 10/1996 |
| JP | 10-290012 A | 10/1998 |
| JP | 11-505377 | 5/1999 |
| JP | 11-288007 A | 10/1999 |
| JP | 2000-044236 A | 2/2000 |
| JP | 2000-068514 A | 3/2000 |
| JP | 2000-150900 A | 5/2000 |
| JP | 2001-111021 A | 4/2001 |
| JP | 2001-176988 A | 6/2001 |
| JP | 2001-326362 A | 11/2001 |
| JP | 2001-358231 A | 12/2001 |
| JP | 2002-014628 A | 1/2002 |
| JP | 2002-076356 A | 3/2002 |
| JP | 2002-289859 A | 10/2002 |
| JP | 2002-319665 A | 10/2002 |
| JP | 2002-328617 A | 11/2002 |
| JP | 2003-023161 A | 1/2003 |
| JP | 2003-051599 A | 2/2003 |
| JP | 2003-069022 A | 3/2003 |
| JP | 2003-086000 A | 3/2003 |
| JP | 2003-086808 A | 3/2003 |
| JP | 2003-115595 A | 4/2003 |
| JP | 2003-243658 A | 8/2003 |
| JP | 2003-273228 A | 9/2003 |
| JP | 2003-280034 A | 10/2003 |
| JP | 2003-309266 A | 10/2003 |
| JP | 2004-047566 A | 2/2004 |
| JP | 2004-079705 A | 3/2004 |
| JP | 2004-103957 A | 4/2004 |
| JP | 2004-157508 A | 6/2004 |
| JP | 2004-235180 A | 8/2004 |
| JP | 2004-273614 A | 9/2004 |
| JP | 2004-273732 A | 9/2004 |
| JP | 2005-051228 A | 2/2005 |
| JP | 2005-057167 A | 3/2005 |
| JP | 2005-085905 A | 3/2005 |
| JP | 2005-109325 A | 4/2005 |
| JP | 2005-150685 A | 6/2005 |
| JP | 2005-183984 A | 7/2005 |
| JP | 2006-080494 A | 3/2006 |
| JP | 2006-114596 A | 4/2006 |
| JP | 2006-165532 A | 6/2006 |
| JP | 2006-190437 A | 7/2006 |
| JP | 2007-096055 A | 4/2007 |
| JP | 2007-115807 A | 5/2007 |
| JP | 2007-115902 A | 5/2007 |
| JP | 2007-123861 A | 5/2007 |
| JP | 2007-150158 A | 6/2007 |
| JP | 2007-207413 A | 8/2007 |
| JP | 2007-250983 A | 9/2007 |
| JP | 2007-279748 A | 10/2007 |
| JP | 2007-529117 | 10/2007 |
| JP | 2007-529119 | 10/2007 |
| JP | 2007-299913 A | 11/2007 |
| JP | 2007-318061 A | 12/2007 |
| JP | 2007-324425 A | 12/2007 |
| JP | 2008-009393 A | 1/2008 |
| JP | 2008-072011 A | 3/2008 |
| JP | 2008-083692 A | 4/2008 |
| JP | 2008-085048 A | 4/2008 |
| JP | 2008-089874 A | 4/2008 |
| JP | 2008-089915 A | 4/2008 |
| JP | 2008-107807 A | 5/2008 |
| JP | 2008-117863 A | 5/2008 |
| JP | 2008-124215 A | 5/2008 |
| JP | 2008-140490 A | 6/2008 |
| JP | 2008-193545 A | 8/2008 |
| JP | 2008-199005 A | 8/2008 |

(56) References Cited

FOREIGN PATENT DOCUMENTS

| | | |
|---|---|---|
| JP | 2008-218495 A | 9/2008 |
| JP | 2008-235876 A | 10/2008 |
| JP | 2008-243928 A | 10/2008 |
| JP | 2010-087518 A | 4/2010 |
| KR | 1992-0008944 A | 5/1992 |
| KR | 2006-0000614 A | 1/2006 |
| KR | 2006-0052371 A | 5/2006 |
| KR | 2006-0123332 A | 12/2006 |
| KR | 2006-0132720 A | 12/2006 |
| KR | 2006-0133980 A | 12/2006 |
| KR | 2007-0024709 A | 3/2007 |
| KR | 2007-0081255 A | 8/2007 |
| KR | 2007-0087520 A | 8/2007 |
| KR | 2008-0029796 A | 4/2008 |
| KR | 2008-0048936 A | 6/2008 |
| KR | 2008-0070811 A | 7/2008 |
| KR | 2008-0106049 A | 12/2008 |
| WO | WO-1993/021659 | 10/1993 |
| WO | WO-2001/009960 | 2/2001 |
| WO | WO-2003/087921 | 10/2003 |
| WO | WO-2003/104879 | 12/2003 |
| WO | WO-2004/114391 | 12/2004 |
| WO | WO-2005/041310 | 5/2005 |
| WO | WO-2005/048221 | 5/2005 |
| WO | WO-2005/093847 | 10/2005 |
| WO | WO-2005/093850 | 10/2005 |
| WO | WO-2005/122178 | 12/2005 |
| WO | WO-2006/041578 | 4/2006 |
| WO | WO-2007/058329 | 5/2007 |
| WO | WO-2007/080813 | 7/2007 |
| WO | WO-2007/119386 | 10/2007 |
| WO | WO-2008/105250 | 9/2008 |
| WO | WO-2008/143304 | 11/2008 |

OTHER PUBLICATIONS

International Search Report (Application No. PCT/JP2009/067289) Dated Nov. 2, 2009.

Written Opinion (Application No. PCT/JP2009/067289) Dated Nov. 2, 2009.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350", Journal of Solid State Chemistry, Aug. 1, 1991, vol. 93, No. 2, pp. 298-315, Elsevier.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178, Elsevier.

Nomura.K et al., "Thin-Film Transistor Fabricated in Single-Crystalline Transparent Oxide Semiconductor", Science, May 23, 2003, vol. 300, No. 5623, pp. 1269-1272.

Osada.T et al., "15.2: Development of Driver-Integrated Panel using Amorphous In-Ga-Zn-Oxide TFT", SID Digest '09 : SID International Symposium Digest of Technical Papers, May 31, 2009, vol. 40, pp. 184-187.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355, Elsevier.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", IEEE Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, the Japan Society of Applied Physics.

Coates.D et al., "Optical Studies of the Amorphous Liquid-Cholesteric Liquid Crystal Transition: the "Blue Phase"", Physics Letters A, Sep. 10, 1973, vol. 45, No. 2, pp. 115-116.

Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4: Excellent Performance of Indium-Oxide-Based Thin-Film Transistors by DC Sputtering", SID Digest '09 : SID International Symposium Digest of Technical Papers, May 31, 2009, pp. 191-193.

Jin. D et al., "65.2: Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size Amoled", AM-FPD '08 Digest of Technical Papers, Jul. 2, 2008, pp. 275-278.

Park.S et al., "Challenge to Future Displays: Transparent AM-OLED Driven By Peald Grown ZNO TFT", IMID 2007 (International Meeting on Information Display), 2007, pp. 1249-1252.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

(56) References Cited

OTHER PUBLICATIONS

Ohara.H et al., "21.3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07: SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "SPINEL,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu, or Zn] at Temperatures Over 1000° C", Journal of Solid State Chemistry, 1985, vol. 60, pp. 382-384, Elsevier.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", Nirim Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m<4):a Zn4s conductor", Philosophical Magazine, 2001, vol. 81, No. 5, pp. 501-515.
Janotti.A et al., "Oxygen Vacancies In ZnO", Appl. Phys. Lett. (Applied Physics Letters) , 2005, vol. 87, pp. 122102-1-122102-3.
Clark.S et al., "First Principles Methods Using CASTEP", Zeitschrift fur Kristallographie, 2005, vol. 220, pp. 567-570.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects In ZnO", Phys. Rev. B (Physical Review. B), Oct. 4, 2007, vol. 76, No. 16, pp. 165202-1-165202-22.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Oba.F et al., "Defect energetics in ZnO: A hybrid Hartree-Fock density functional study", Phys. Rev. B (Physical Review. B), 2008, vol. 77, pp. 245202-1-245202-6.
Kim.S et al., "High-Performance oxide thin film transistors passivated by various gas plasmas", 214th ECS Meeting Abstract, 2008, No. 2317, ECS.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Mo.Y et al., "Amorphous Oxide TFT Backplanes for Large Size AMOLED Displays", IDW '08 : Proceedings of the 16th International Display Workshops, Dec. 3, 2008, pp. 581-584.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Ueno.K et al., "Field-Effect Transistor On SrTiO3 With Sputtered Al2O3 Gate Insulator", Appl. Phys. Lett. (Applied Physics Letters) , Sep. 1, 2003, vol. 83, No. 9, pp. 1755-1757.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Cho.Y et al., "Characteristics of a-Si:H Dual-Gate TFTs Using ITO Electrode for LCD Driver", AM-FPD '08 Digest of Technical Papers, Jul. 2, 2008, pp. 229-232.

(56) References Cited

OTHER PUBLICATIONS

Chinese Office Action (Application No. 200980142763.7) Dated Oct. 26, 2012.
Chinese Office Action (Application No. 201110317572.9) Dated Sep. 16, 2013.
Chinese Office Action (Application No. 201110421039.7) Dated Dec. 20, 2013.
Taiwanese Office Action (Application No. 100138627) Dated Feb. 24, 2014.
Chinese Office Action (Application No. 201110317572.9) Dated Apr. 16, 2014.
Taiwanese Office Action (Application No. 100146379) Dated Oct. 20, 2014.
Korean Office Action (Application No. 2011-7011663) Dated Sep. 14, 2015.
Korean Office Action (Application No. 2016-7015835) Dated Sep. 27, 2016.
Taiwanese Office Action (Application No. 105114129) Dated Dec. 12, 2016.
Korean Office Action (Application No. 2016-7015835) Dated May 8, 2017.
The transparent conductive film, Dec. 20, 2012, vol. 2, No. 6-7, pp. 85-91,129.
Taiwanese Office Action (Application No. 105114129) Dated May 23, 2017.
Korean Office Action (Application No. 2017-7022152) Dated Sep. 29, 2017.
Petition, Dated Jul. 11, 2018, p. 68.
Declaration of Richard A. Flasck, Dated Jul. 11, 2018, p. 89.
Power of Attorney, Dated Jul. 11, 2018, p. 2.
Ex. 1001 U.S. Pat. No. 9,601,603 B2, Dated Jul. 11, 2018, p. 54.
Ex. 1002 Prosecution History of U.S. Pat. No. 9,601,603 B2, Dated Jul. 11, 2018, Jul. 11, 2018, p. 341.
Ex. 1004 US Patent Application Publication No. 20060278873 A1, Dated Jul. 11, 2018, p. 16.
Mandatory Notice, Dated Aug. 1, 2018, p. 4.
Power of Attorney, Dated Aug. 1, 2018, p. 1.
Notice of Accord Filing Date, Dated Aug. 31, 2018, p. 5.

\* cited by examiner

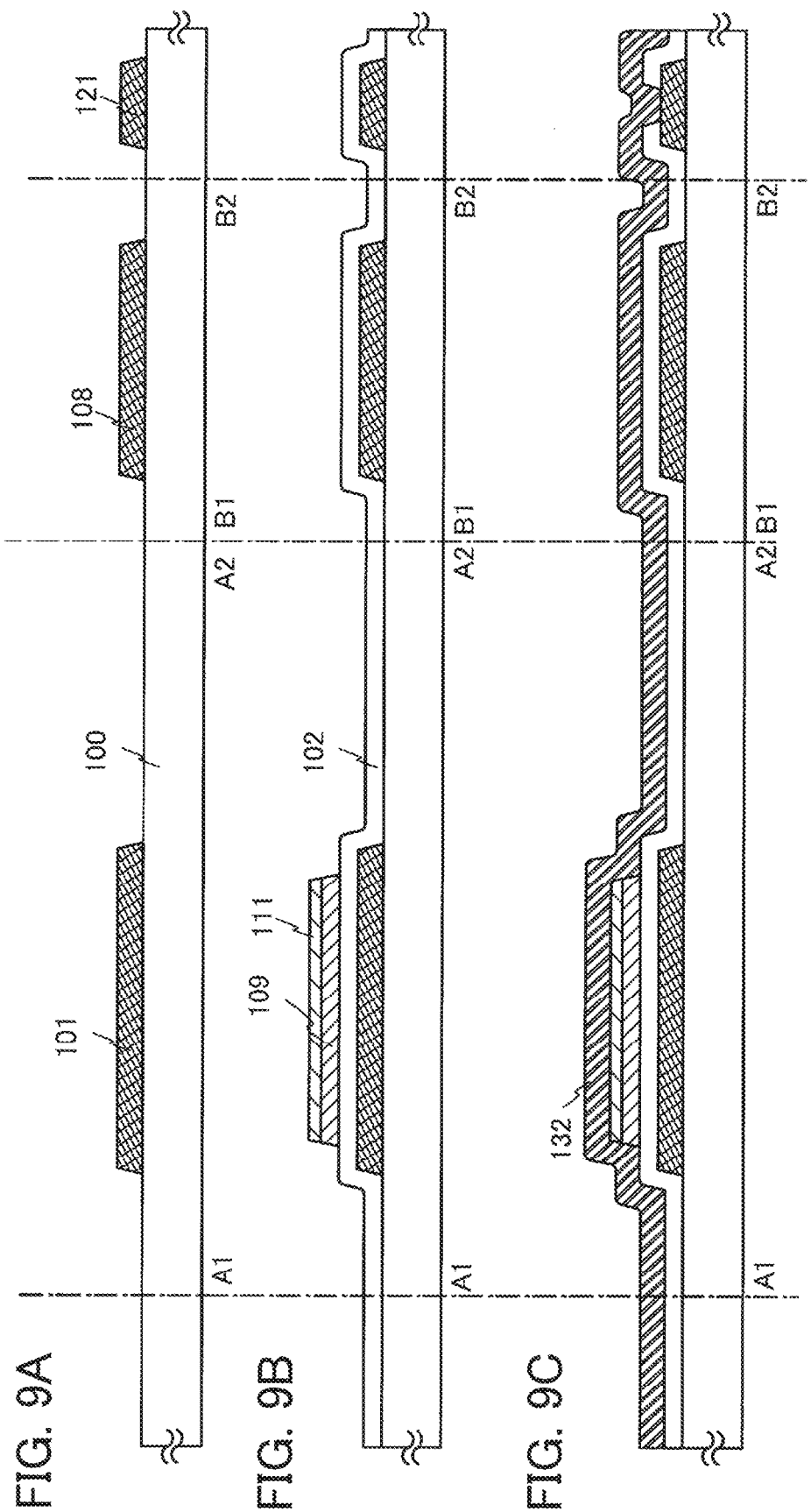

SEMICONDUCTOR DEVICE AND METHOD FOR MANUFACTURING THE SAME

CROSS-REFERENCE TO RELATED APPLICATIONS

This application is a continuation of U.S. application Ser. No. 18/098,769, filed Jan. 19, 2023, now allowed, which is a continuation of U.S. application Ser. No. 17/002,971, filed Aug. 26, 2020, now U.S. Pat. No. 11,563,124, which is a continuation of U.S. application Ser. No. 16/180,565, filed Nov. 5, 2018, now U.S. Pat. No. 10,763,372, which is a continuation of U.S. application Ser. No. 15/814,919, filed Nov. 16, 2017, now U.S. Pat. No. 10,153,380, which is a continuation of U.S. application Ser. No. 15/443,096, filed Feb. 27, 2017, now U.S. Pat. No. 10,170,632, which is a continuation of U.S. application Ser. No. 15/071,674, filed Mar. 16, 2016, now U.S. Pat. No. 9,601,603, which is a continuation of U.S. application Ser. No. 14/694,212, filed Apr. 23, 2015, now U.S. Pat. No. 9,318,512, which is a continuation of U.S. application Ser. No. 13/302,222, filed Nov. 22, 2011, now U.S. Pat. No. 9,029,851, which is a continuation of U.S. application Ser. No. 12/581,918, filed Oct. 20, 2009, now U.S. Pat. No. 8,067,775, which claims the benefit of a foreign priority application filed in Japan as Serial No. 2008-274540 on Oct. 24, 2008, all of which are incorporated by reference.

TECHNICAL FIELD

The present invention relates to a semiconductor device using an oxide semiconductor and a method for manufacturing the semiconductor device.

BACKGROUND ART

A thin film transistor formed over a flat plate such as a glass substrate is manufactured using amorphous silicon or polycrystalline silicon, as typically seen in a liquid crystal display device. A thin film transistor formed using amorphous silicon has low electric field effect mobility, but such a transistor can be formed over a glass substrate with a larger area. On the other hand, a thin film transistor formed using crystalline silicon has high electric field effect mobility, but a crystallization process such as laser annealing is necessary and such a transistor is not always suitable for a larger glass substrate.

In view of the foregoing, attention has been drawn to a technique by which a thin film transistor is formed using an oxide semiconductor, and such a transistor is applied to an electronic device or an optical device. For example, Patent Document 1 and Patent Document 2 disclose a technique by which a thin film transistor is manufactured using zinc oxide or an In—Ga—Zn—O-based oxide semiconductor as an oxide semiconductor film and such a transistor is used as a switching element or the like of an image display device.

REFERENCE

[Patent Document 1] Japanese Published Patent Application No. 2007-123861
[Patent Document 2] Japanese Published Patent Application No. 2007-096055

DISCLOSURE OF INVENTION

The electron field effect mobility of a thin film transistor in which a channel formation region is provided in an oxide semiconductor is higher than that of a thin film transistor using amorphous silicon. The oxide semiconductor film can be formed by a sputtering method or the like at a temperature of 300° C. or lower. Its manufacturing process is easier than that of a thin film transistor using polycrystalline silicon.

Such an oxide semiconductor is expected to be used for forming a thin film transistor over a glass substrate, a plastic substrate, or the like, and to be applied to a display device such as a liquid crystal display device, an electroluminescent display device, or electronic paper.

When the size of a display region of a display device is increased, the number of pixels is increased and thus the number of gate lines and signal lines is increased. In addition, as a display device has a higher definition, the number of pixels is increased and thus the number of gate lines and signal lines is increased. When the number of the gate lines and the signal lines is increased, it is difficult to mount IC chips including driver circuits for driving of the gate lines and the signal lines by bonding or the like, whereby manufacturing cost is increased.

Therefore, it is an object to reduce manufacturing cost by employing a thin film transistor using an oxide semiconductor in at least part of a driver circuit for driving a pixel portion.

In the case of employing a thin film transistor using an oxide semiconductor in at least part of a driver circuit for driving a pixel portion, high dynamic characteristics (on characteristics or frequency characteristics (referred to as f characteristics)) are required for the thin film transistor. It is another object to provide a thin film transistor having high dynamic characteristics (on characteristics) and to provide a driver circuit which enables high speed operation.

In addition, it is an object of an embodiment of the present invention to provide a semiconductor device provided with a highly reliable thin film transistor in which an oxide semiconductor layer is used for a channel.

Gate electrodes are provided above and below an oxide semiconductor layer to realize improvement of on characteristics and reliability of a thin film transistor.

Further, by controlling gate voltage applied to the upper and lower gate electrodes, threshold voltage can be controlled. The upper and lower gate electrodes may be electrically connected to each other so as to have the same potential, or the upper and lower gate electrodes may be connected to different wirings so as to have different potentials. For example, when the threshold voltage is set at 0 or close to 0 to reduce driving voltage, reduction of power consumption can be achieved. Alternatively, when the threshold voltage is set positive, the thin film transistor can function as an enhancement type transistor. Further alternatively, when the threshold voltage is set negative, the thin film transistor can function as a depletion type transistor.

For example, an inverter circuit including a combination of the enhancement type transistor and the depletion type transistor (hereinafter, such a circuit is referred to as an EDMOS circuit) can be used for a driver circuit. The driver circuit includes at least a logic circuit portion, and a switch portion or a buffer portion. The logic circuit portion has a circuit structure including the above EDMOS circuit. Further, a thin film transistor by which large on current can flow is preferably used for the switch portion or the buffer portion. A depletion type transistor or a thin film transistor including gate electrodes above and below an oxide semiconductor layer is used.

Thin film transistors having different structures can be formed over the same substrate without greatly increasing the number of steps. For example, an EDMOS circuit using a thin film transistor including gate electrodes above and below the oxide semiconductor layer may be formed for the driver circuit for high-speed driving, and a thin film transistor including a gate electrode only below the oxide semiconductor layer may be used for a pixel portion.

Note that an n-channel TFT whose threshold voltage is positive is referred to as an enhancement type transistor, and an n-channel TFT whose threshold voltage is negative is referred to as a depletion type transistor, throughout this specification.

Examples of a material for the gate electrode provided above the oxide semiconductor layer include an element selected from aluminum (Al), copper (Cu), titanium (Ti), tantalum (Ta), tungsten (W), molybdenum (Mo), chromium (Cr), neodymium (Nd), and scandium (Sc), and an alloy containing any of the above elements as its component, and any conductive film can be used without particular limitation. Further, the gate electrode is not limited to a single layer structure containing any of the above elements, and can have a stacked structure of two or more layers.

As a material for the gate electrode provided above the oxide semiconductor layer, the same material as a pixel electrode can be used (a transparent conductive film or the like can be used in a case of a transmissive display device). For example, the gate electrode provided above the oxide semiconductor layer can be formed in the same step as a step for forming the pixel electrode which is electrically connected to the thin film transistor in the pixel portion. Consequently, the thin film transistor provided with the gate electrodes above and below the oxide semiconductor layer can be formed without greatly increasing the number of steps. In addition, by providing the gate electrode above the oxide semiconductor layer, in a bias-temperature stress test (hereinafter, referred to as a BT test) for examining reliability of a thin film transistor, the amount of change in threshold voltage of the thin film transistor between before and after the BT test can be reduced. That is, provision of the gate electrode above the oxide semiconductor layer can improve the reliability.

One embodiment of the present invention disclosed in this specification is a semiconductor device including a first gate electrode over an insulating surface; a first insulating layer over the first gate electrode; an oxide semiconductor layer over the first insulating layer; a source electrode and a drain electrode over the oxide semiconductor layer; a second insulating layer covering the source electrode and the drain electrode; a second gate electrode over the second insulating layer, wherein the oxide semiconductor layer has a region whose thickness is smaller than that of a region overlapping with the source electrode or the drain electrode, and the second insulating layer is in contact with the region whose thickness is smaller in the oxide semiconductor layer.

The above-described structure can achieve at least one of the above-described objects.

In the above-described structure, a width of the second gate electrode is made larger than a width of the first gate electrode, whereby a gate voltage can be applied to the whole oxide semiconductor layer from the second gate electrode.

Alternatively, in the above-described structure, when a width of the first gate electrode is made smaller than a width of the second gate electrode, an area of the first gate electrode, which overlaps with the source electrode and the drain electrode is reduced, so that parasitic capacitance can be reduced. Further alternatively, a width of the first gate electrode is made larger than the region whose thickness is smaller in the oxide semiconductor layer while a width of the second gate electrode is made smaller than the region whose thickness is smaller in the oxide semiconductor, so that the second gate electrode is not overlapped with the source electrode or the drain electrode to reduce the parasitic capacitance more.

Another embodiment of the present invention is a semiconductor device including a pixel portion and a driver circuit, the pixel portion includes at least a first thin film transistor having a first oxide semiconductor layer, the driver circuit includes an EDMOS circuit in which at least a second thin film transistor having a second oxide semiconductor layer and a third thin film transistor having a third oxide semiconductor layer, and the third thin film transistor includes a first gate electrode below the third oxide semiconductor layer and a second gate electrode above the third oxide semiconductor layer.

In the above-described structure, when the first thin film transistor in the pixel portion is electrically connected to a pixel electrode and the pixel electrode is of the same material as the second gate electrode in the driver circuit, the semiconductor device can be manufactured without increasing the number of steps.

In the above-described structure, when the first thin film transistor in the pixel portion is electrically connected to a pixel electrode and the pixel electrode is formed of a different material from the second gate electrode in the driver circuit, for example, when the pixel electrode is formed of a transparent conductive film and the second gate electrode is formed of an aluminum film, resistance of the second gate electrode in the driver circuit can be reduced.

Further, a so-called dual-gate structure is provided, in which the third oxide semiconductor layer of the driver circuit overlaps with the first gate electrode with the first insulating layer therebetween and also overlaps with the second gate electrode with the second insulating layer therebetween.

As a semiconductor device having a driver circuit, besides a liquid crystal display device, a light-emitting display device using a light-emitting element and a display device using an electrophoretic display element, which is also referred to electronic paper, can be given.

Note that the term "display device" in this specification means an image display device, a light-emitting device, or a light source (including a lighting device). Further, the "display device" includes the following modules in its category: a module including a connector such as an flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

In a light-emitting display device using a light-emitting element, a plurality of thin film transistors are included in a pixel portion, and a portion in which a gate electrode of a thin film transistor is electrically connected to a source wiring or a drain wiring of another transistor is included in the pixel portion.

Since a thin film transistor is easily broken due to static electricity or the like, a protective circuit for protecting the driver circuit is preferably provided over the same substrate for a gate line or a source line. The protective circuit is preferably formed with a non-linear element including an oxide semiconductor.

The oxide semiconductor used in this specification is a thin film expressed by $InMO_3(ZnO)_m$ ($m>0$), and a thin film transistor using the thin film as a semiconductor layer is formed. Note that M denotes one metal element or a plurality of metal elements selected from Ga, Fe, Ni, Mn, and Co. For example, M denotes Ga in some cases; meanwhile, M denotes the above metal element such as Ni or Fe in addition to Ga (Ga and Ni or Ga and Fe) in other cases. Further, the above oxide semiconductor may contain Fe or Ni, another transitional metal element, or an oxide of the transitional metal as an impurity element in addition to the metal element contained as M. In this specification, this thin film is also referred to as an In—Ga—Zn—O-based non-single-crystal film.

The In—Ga—Zn—O-based non-single-crystal film is formed by a sputtering method, and is heated at 200° C. to 500° C., typically 300° C. to 400° C., for 10 to 100 minutes. Note that an amorphous structure is observed by XRD analysis as the crystal structure of the In—Ga—Zn—O-based non-single-crystal film analyzed.

An oxide semiconductor typified by the In—Ga—Zn—O-based non-single-crystal film is a material having a wide energy gap (Eg); therefore, even if two gate electrodes are provided above and below an oxide semiconductor layer, increase of off current can be suppressed.

Note that the ordinal numbers such as "first" and "second" in this specification are used for convenience and do not denote the order of steps and the stacking order of layers. In addition, the ordinal numbers in this specification do not denote particular names which specify the present invention.

By forming the thin film transistor using the oxide semiconductor interposed between the two gate electrodes provided above and below the oxide semiconductor in a peripheral circuit such as a gate line driver circuit or a source line driver circuit, or a pixel portion, manufacturing cost is reduced.

With the thin film transistor using the oxide semiconductor interposed between the two gate electrodes provided above and below the oxide semiconductor, in a BT test, the amount of change in threshold voltage of the thin film transistor between before and after the BT test can be reduced. That is, the thin film transistor includes the oxide semiconductor interposed between the two gate electrodes provided above and below the oxide semiconductor, whereby reliability of the thin film transistor can be improved.

BRIEF DESCRIPTION OF DRAWINGS

In the accompanying drawings:

FIGS. 9A to 9C are views illustrating a method for manufacturing a semiconductor device of Embodiment 4;

BEST MODE FOR CARRYING OUT THE INVENTION

Embodiments will be described below. The present invention is not limited to the description below and it is easily understood by those skilled in the art that the mode and details can be changed variously without departing from the scope and spirit of the present invention. Therefore, the present invention should not be interpreted as being limited to description in the embodiments below.

Embodiment 1

Figure 1A:
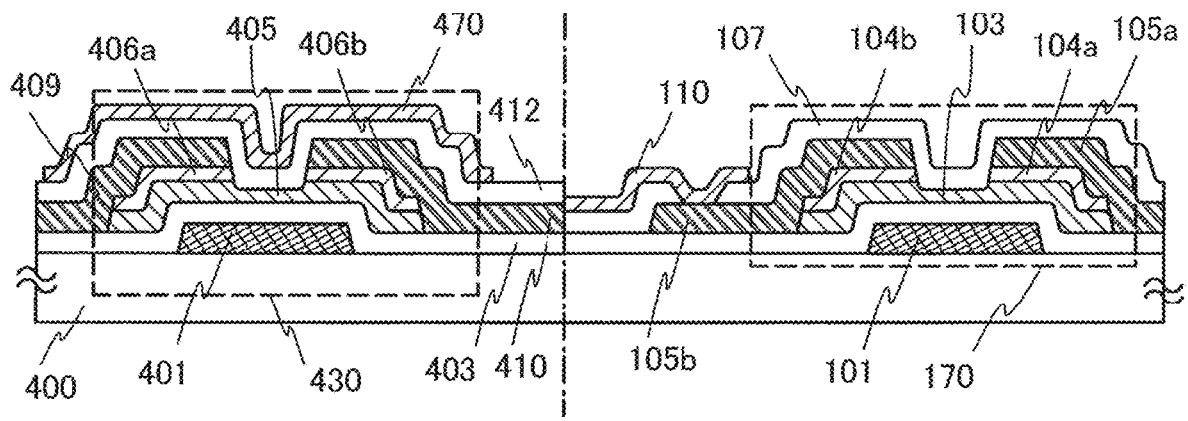
FIGS. 1A, 1B, and 1C are cross-sectional views illustrating an example of a display device of Embodiment 1, another example of a display device of Embodiment 1, and another example of a display device of Embodiment 1, respectively.

FIG. 1A illustrates an example in which a first thin film transistor 430 used for a driver circuit and a second thin film transistor 170 used for a pixel portion are provided over the same substrate. Note that FIG. 1A is also an example of a cross-sectional view of a display device.

The pixel portion and the driver circuit are formed over the same substrate. In the pixel portion, the second thin film transistors 170, which are enhancement type transistors, arranged in a matrix form are each used for switching on/off of voltage application to a pixel electrode 110. The second thin film transistor 170 arranged in the pixel portion is formed using an oxide semiconductor layer 103. As for electric characteristics of the second thin film transistor, on/off ratio is $10^9$ or more at a gate voltage±20 V; therefore, display contrast can be improved, and further, leakage current is small, whereby low power consumption driving can be realized. The on/off ratio is a ratio of on current to off current ($I_{on}/I_{off}$), and the higher the value of the $I_{on}/I_{off}$ is, the better switching characteristics is. Thus, high on/off ratio contributes to improvement of display contrast. Note that on current is current which flows between a source electrode and a drain electrode when a transistor is in an on state. Meanwhile, off current is current which flows between the source electrode and the drain electrode when the transistor is in an off state. For example, in an n-channel transistor, the off current is current which flows between a source electrode and a drain electrode when gate voltage is lower than threshold voltage of the transistor. Therefore, an enhancement type transistor is preferably used for the pixel portion to achieve high contrast and low-power-consumption driving.

In the driver circuit, at least one thin film transistor 430 including a first gate electrode 401 below an oxide semiconductor layer 405 and a second gate electrode 470 above the oxide semiconductor layer 405 is used. The second gate electrode 470 can also be called a back-gate electrode. When the back-gate electrode is formed, in a bias-temperature stress test (hereinafter, referred to as a BT test) for examining reliability of a thin film transistor, the amount of change in threshold voltage of the thin film transistor between before and after the BT test can be reduced.

A structure of this thin film transistor 430 is described with reference to FIG. 1A. The first gate electrode 401 provided over a substrate 400 having an insulating surface is covered with a first gate insulating layer 403, and the oxide semiconductor layer 405 is provided over the first gate insulating layer 403 overlapping with the first gate electrode 401. Over the oxide semiconductor layer 405, a first wiring 409 and a second wiring 410 are provided. The oxide semiconductor layer 405 includes a region whose thickness is smaller than the thickness of a region which serves as a source electrode or a drain electrode and overlaps with the first wiring 409 and the second wiring 410. A second gate insulating layer 412 is provided so as to be over and in contact with the region whose thickness is smaller in the oxide semiconductor layer 405. Further, the second gate electrode 470 is provided over the second gate insulating layer 412.

The oxide semiconductor layer 405 is formed, e.g., at argon gas flow rate of 10 sccm and oxygen flow rate of 5 sccm by a sputtering method using a target wherein $In_2O_3$: $Ga_2O_3$:ZnO=1:1:1 (In:Ga:Zn=1:1:0.5). In addition, an $n^+$ layer 406a is provided between the oxide semiconductor layer 405 and the first wiring 409, and an $n^+$ layer 406b is provided between the oxide semiconductor layer 405 and the second wiring 410.

In this embodiment, the $n^+$ layers 406a and 406b serving as source and drain regions are In—Ga—Zn—O-based non-single-crystal films, which are formed under deposition conditions different from the deposition conditions of the oxide semiconductor layer 405, and are oxide semiconductor layers having lower resistance. For example, the $n^+$ layers 406a and 406b formed of oxide semiconductor layers obtained at argon gas flow rate of 40 sccm have n-type conductivity and activation energy ($\Delta E$) of from 0.01 eV to 0.1 eV. Note that in this embodiment, the $n^+$ layers 406a and 406b are In—Ga—Zn—O-based non-single-crystal films, which include at least amorphous component. The $n^+$ layers 406a and 406b include crystal grains (nano crystals) in the amorphous component in some cases. The diameter of the crystal grains (nano crystals) included in the $n^+$ layers 406a and 406b is about 1 nm to 10 nm, typically about 2 nm to 4 nm.

Further, the first gate electrode 401 and the second gate electrode 470 may be electrically connected to each other so as to have the same potential. When the first gate electrode 401 and the second gate electrode 470 have the same potential, gate voltage can be applied from upper and lower sides of the oxide semiconductor layer, so that the amount of current which flows in an on state can be increased.

Further, by electrically connecting a control signal line for shifting the threshold voltage to a negative value to either the first gate electrode 401 or the second gate electrode 470, a depletion type TFT can be formed.

Alternatively, by electrically connecting a control signal line for shifting the threshold voltage to a positive value to either the first gate electrode 401 or the second gate electrode 470, an enhancement type TFT can be formed.

Further, there is no particular limitation on a combination of two thin film transistors used for the driver circuit, and a combination of a thin film transistor including one gate electrode as the depletion type TFT and a thin film transistor including two gate electrodes as the enhancement type TFT may be employed. In that case, a thin film transistor in the pixel portion has a structure in which gate electrodes are provided above and below the oxide semiconductor layer.

Alternatively, the thin film transistor in the pixel portion may have a structure in which gate electrodes are provided above and below the oxide semiconductor layer, and the enhancement type TFT and the depletion type TFT in the driver circuit may each have a structure in which gate electrodes are provided above and below the oxide semiconductor layer. In that case, a structure in which a control signal line for controlling the threshold voltage is electrically connected to either of the upper and lower gate electrodes and the connected gate electrode controls the threshold voltage is employed.

Note that in FIG. 1A, the second gate electrode 470 is formed of the same material as the pixel electrode 110 in the pixel portion, for example, using a transparent conductive film in a transmissive liquid crystal display device, in order to reduce the number of steps. However, there is no particular limitation on the second gate electrode 470. In addition, the example in which a width of the second gate electrode 470 is larger than a width of the first gate electrode 401 and also larger than a width of the oxide semiconductor layer is illustrated; however, there is no particular limitation on the width of the second gate electrode 470. Note that the width of the first gate electrode 401 is larger than that of the region whose thickness is smaller in the oxide semiconductor layer.

Figure 1B:
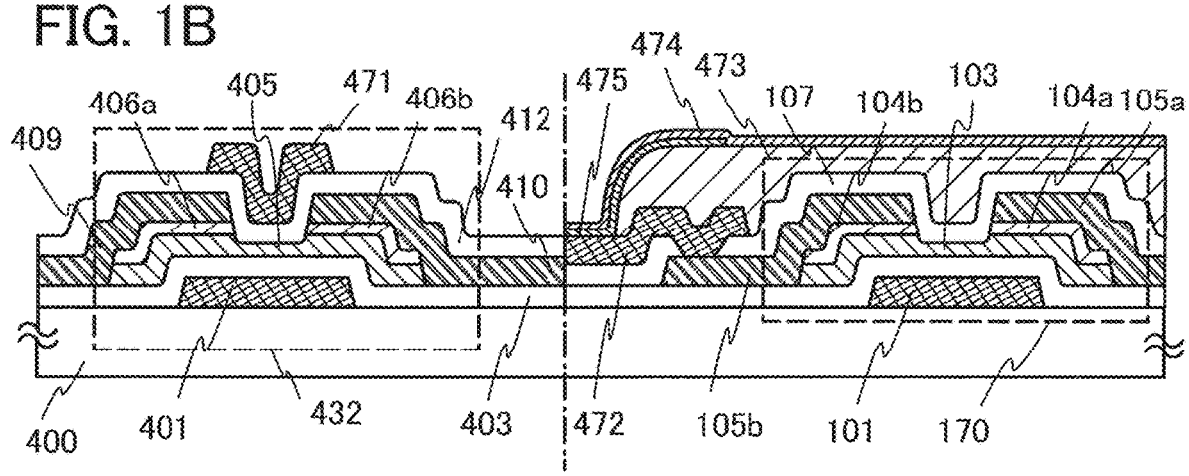

FIG. 1B illustrates an example different from FIG. 1A in the material and the width of the second gate electrode. Further, FIG. 1B is also an example of a display device in which the second thin film transistor 170 connected to an organic light-emitting element or an inorganic light-emitting element is included in the pixel portion.

In FIG. 1B, as a material for an electrode 471 which functions as a second gate electrode of a thin film transistor 432, a metal material (an element selected from aluminum (Al), copper (Cu), titanium (Ti), tantalum (Ta), tungsten (W), molybdenum (Mo), chromium (Cr), neodymium (Nd), and scandium (Sc), or an alloy containing any of the above-described elements as its component) is used. A width of the electrode 471 in the cross section is smaller than that of the second gate electrode 470 in FIG. 1A. Further, the width of the electrode 471 is smaller than a width of the oxide semiconductor layer. By reducing the width of the electrode 471, the overlapping area of the electrode 471 with the first wiring 409 and the second wiring 410 with the second gate insulating layer 412 therebetween can be reduced, so that parasitic capacitance can be reduced. Note that in FIG. 1B, the width of the electrode 471 is larger than that of the region whose thickness is smaller in the oxide semiconductor layer.

The light-emitting element includes at least a first electrode 472, a light-emitting layer 475, and a second electrode 474. In FIG. 1B, the electrode 471 is formed of the same material as the first electrode 472 in the pixel portion, for example, using aluminum or the like, in order to reduce the number of steps; however, there is no particular limitation on the electrode 471. Further, in FIG. 1B, an insulating layer 473 functions as a partition for insulating the first electrodes of the adjacent pixels from each other.

Figure 1C:
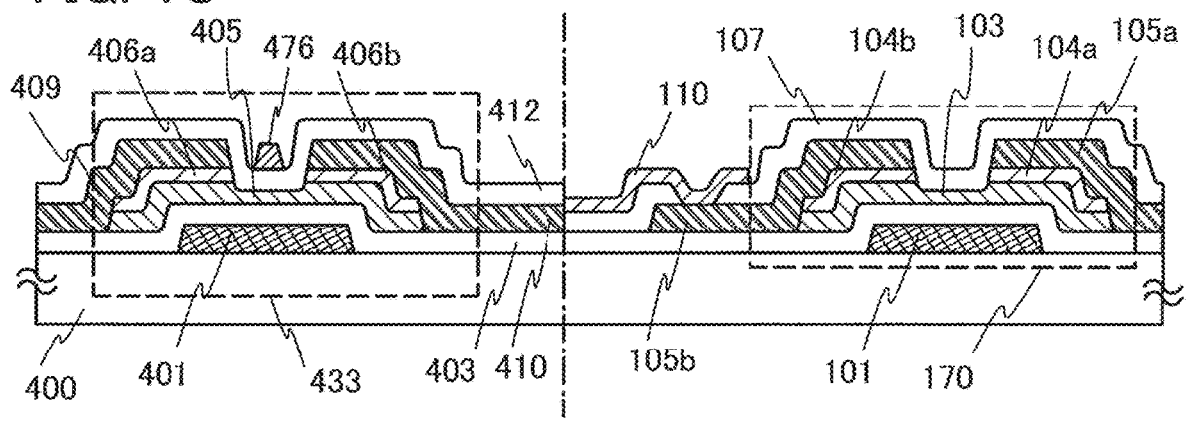

Further, FIG. 1C illustrates an example different from FIG. 1A in the material and the width of the second gate electrode. In FIG. 1C, as a material for an electrode 476 which functions as a second gate electrode of a thin film transistor 433, a metal material (an element selected from aluminum (Al), copper (Cu), titanium (Ti), tantalum (Ta), tungsten (W), molybdenum (Mo), chromium (Cr), neodymium (Nd), and scandium (Sc), or an alloy containing any of the above-described elements as its component) is used. A width of the second gate electrode in a cross section is smaller than that in FIG. 1B. When the width is still smaller than that in FIG. 1B, it is possible to form the second gate electrode so as not to overlap with the first wiring 409 and the second wiring 410 with the second gate insulating layer 412 therebetween, and thus the parasitic capacitance can further be reduced. The width of the electrode 476 illustrated in FIG. 1C is smaller than that of the region whose thickness is smaller in the oxide semiconductor. In forming the electrode 476 having such a small width, a process using wet etching or the like is preferably performed so that both ends of the electrode 476 are positioned on an inner portion than end portions of a resist mask. However, in FIG. 1C, since a metal material different from that of the pixel electrode 110 is used, one more photolithography process is added to form the electrode 476, and one more mask is needed.

By using the thin film transistor including the oxide semiconductor interposed between the two gate electrodes above and below the oxide semiconductor for a peripheral circuit such as a gate line driver circuit or a source line driver circuit, or a pixel portion, which is used for a liquid crystal display device, a light-emitting display device, or electronic paper, high speed driving or low power consumption can be achieved. Further, both the pixel portion and the driver circuit can be provided over the same substrate without greatly increasing the number of steps. By providing various circuits in addition to the pixel portion over the same substrate, manufacturing cost of a display device can be reduced.

Embodiment 2

Although one thin film transistor has been described as the thin film transistor in the driver circuit in Embodiment 1, an example of forming an inverter circuit of a driver circuit with use of two n-channel thin film transistors will be described below in Embodiment 2. A thin film transistor illustrated in FIG. 2A is the same as the thin film transistor 430 illustrated in FIG. 1A of Embodiment 1; therefore, the same parts are denoted by the same reference numerals.

The driver circuit for driving a pixel portion is formed using an inverter circuit, a capacitor, a resistor, and the like. When the inverter circuit is formed using two n-channel TFTs in combination, there are an inverter circuit having a combination of an enhancement type transistor and a depletion type transistor (hereinafter, referred to as an EDMOS circuit) and an inverter circuit having a combination of two enhancement type TFTs (hereinafter, referred to as an EEMOS circuit).

Figure 2A:
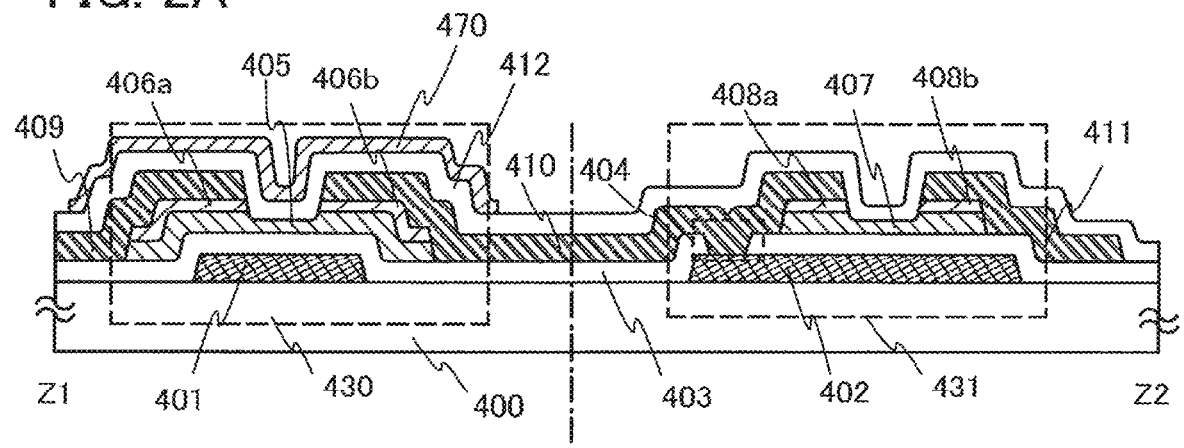
FIGS. 2A, 2B, and 2C are a cross-sectional view, an equivalent circuit diagram, and a top view of a semiconductor device of Embodiment 2, respectively.
Figure 2B:
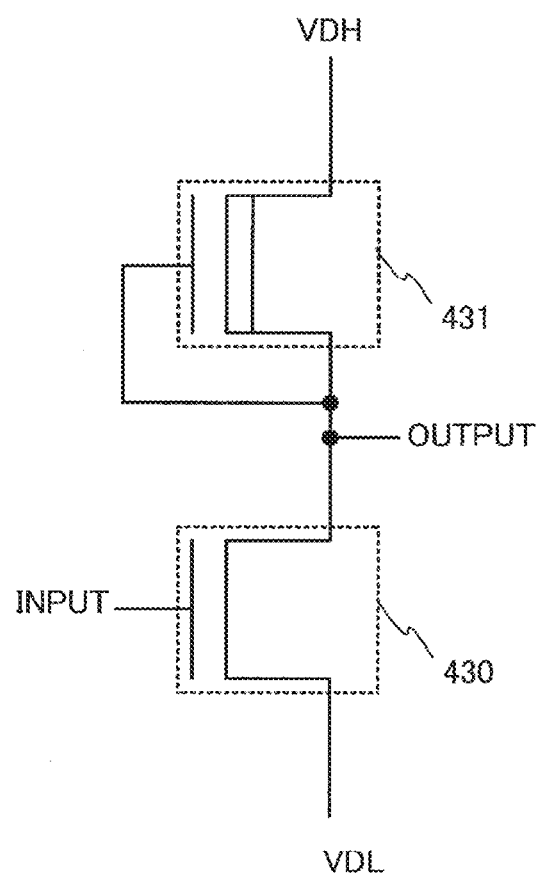
Figure 2C:
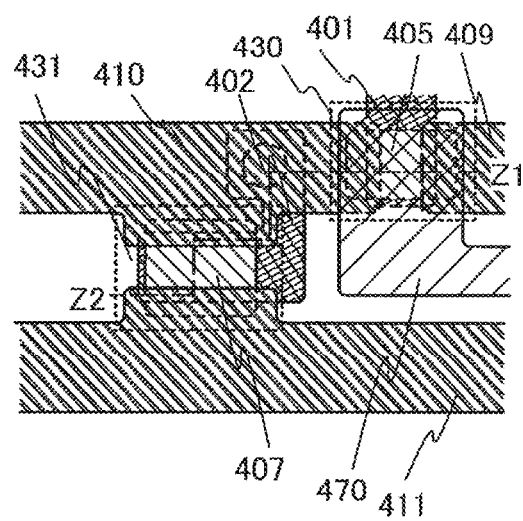

A cross-sectional structure of the inverter circuit of the driver circuit is illustrated in FIG. 2A. Note that the thin film transistor 430 and a second thin film transistor 431 illustrated in FIG. 2A to 2C are bottom-gate thin film transistors, and are examples of thin film transistors in which wirings are provided over a semiconductor layer with a source region and a drain region therebetween.

In FIG. 2A, the first gate electrode 401 and a gate electrode 402 are provided over the substrate 400. The first gate electrode 401 and the gate electrode 402 can be formed to have a single-layer structure or a stacked structure using a metal material such as molybdenum, titanium, chromium, tantalum, tungsten, aluminum, copper, neodymium, or scandium or an alloy material containing any of these as its main component.

As a two-layer stacked structure of the first gate electrode 401 and the gate electrode 402, for example, a two-layer stacked structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, or a two-layer structure in which a titanium nitride layer and a molybdenum layer are stacked is preferable. As a three-layer stacked structure, stacked layers of a tungsten layer or a tungsten nitride layer, an alloy of aluminum and silicon or an alloy of aluminum and titanium, and a titanium nitride layer or a titanium layer is preferable.

In addition, over the first gate insulating layer 403 covering the first gate electrode 401 and the gate electrode 402, an oxide semiconductor layer 405 and a second oxide semiconductor layer 407 are provided.

A first wiring 409 and a second wiring 410 are provided over the oxide semiconductor layer 405, and the second wiring 410 is directly connected to the gate electrode 402 through a contact hole 404 formed in the first gate insulating layer 403. Further, a third wiring 411 is provided over the second oxide semiconductor layer 407.

The thin film transistor 430 includes the first gate electrode 401 and the oxide semiconductor layer 405 overlapping with the first gate electrode 401 with the first gate insulating layer 403 therebetween. The first wiring 409 is a power supply line to which negative voltage VDL is applied (a negative power supply line). This power supply line may be a power supply line with a ground potential (a ground potential power supply line).

Further, the second thin film transistor 431 includes the gate electrode 402 and the second oxide semiconductor layer 407 overlapping with the gate electrode 402 with the first gate insulating layer 403 interposed therebetween. The third wiring 411 is a power supply line to which positive voltage VDH is applied (a positive power supply line).

In addition, an n$^+$ layer 408*a* is provided between the second oxide semiconductor layer 407 and the second wiring 410, and an n$^+$ layer 408*b* is provided between the second oxide semiconductor layer 407 and the third wiring 411.

Further, a top view of the inverter circuit of the driver circuit is illustrated in FIG. 2C. In FIG. 2C, a cross-section taken along a chain line Z1-Z2 corresponds to FIG. 2A.

Further, an equivalent circuit of the EDMOS circuit is illustrated in FIG. 2B. A circuit connection illustrated in FIG. 2A corresponds to that in FIG. 2B, and is an example in which the thin film transistor 430 is an enhancement type n-channel transistor while the second thin film transistor 431 is a depletion type n-channel transistor.

In this embodiment, in order that the thin film transistor 430 can serve as an enhancement type n-channel transistor, the second gate insulating layer 412 is provided over the oxide semiconductor layer 405 and the second gate electrode 470 is provided over the second gate insulating layer 412 so that threshold value of the thin film transistor 430 is controlled by voltage applied to the second gate electrode 470.

Further, the second gate insulating layer 412 also functions as a protective layer covering the second oxide semiconductor layer 407.

Note that the example in which the second wiring 410 is directly connected to the gate electrode 402 through the contact hole 404 formed in the first gate insulating layer 403 is illustrated in FIGS. 2A and 2C, but, without particular limitations, a connection electrode may be separately provided, thereby electrically connecting the second wiring 410 and the gate electrode 402.

Further, this embodiment mode can be freely combined with Embodiment 1.

Embodiment 3

In Embodiment 3, a display device will be described with reference to block diagrams and the like.

Figure 3A:
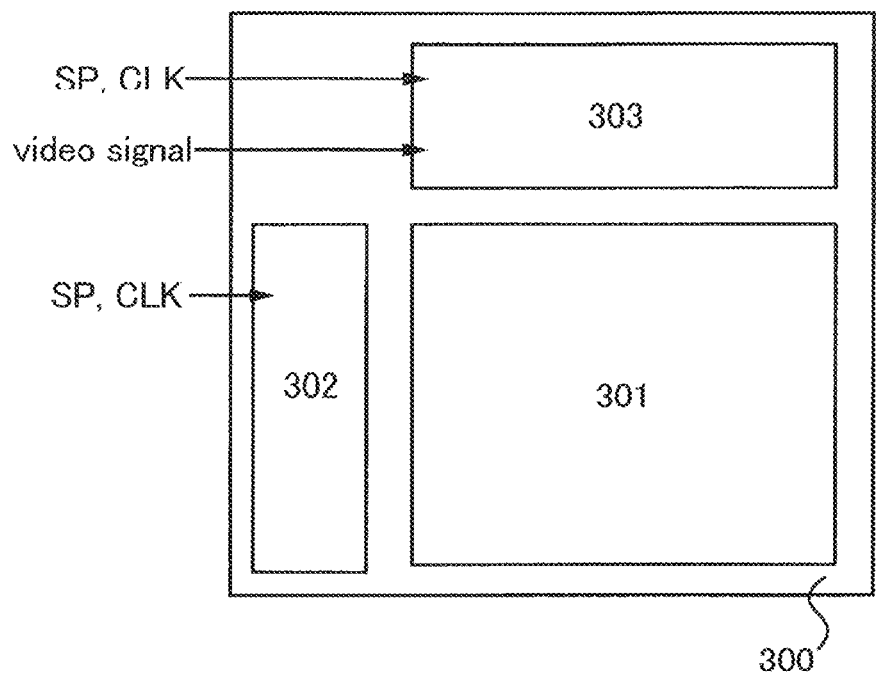
FIGS. 3A and 3B are block diagrams entirely illustrating display devices of Embodiment 3.

FIG. 3A illustrates an example of a block diagram of an active matrix liquid crystal display device. The liquid crystal display device illustrated in FIG. 3A includes, over a substrate 300, a pixel portion 301 having a plurality of pixels each provided with a display element; a scan line driver circuit 302 which controls a scan line connected to a gate electrode of each pixel; and a signal line driver circuit 303 which controls video signal input to a selected pixel.

Figure 3B:
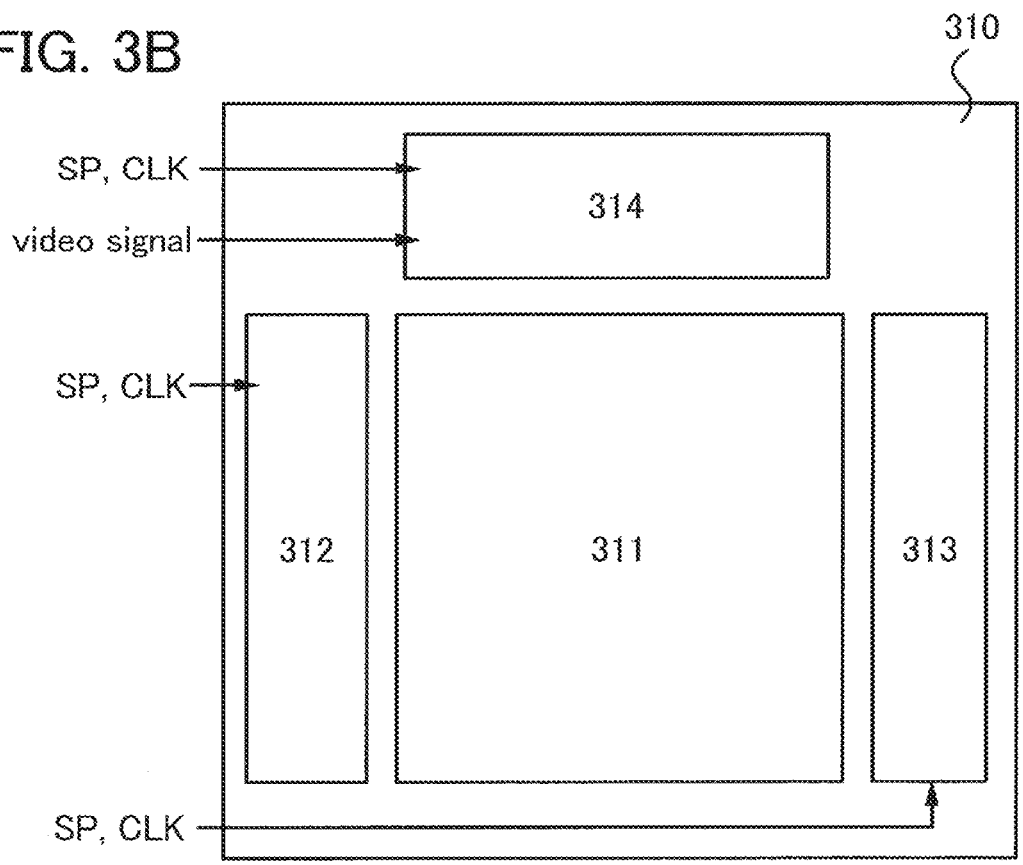

FIG. 3B illustrates an example of a block diagram of an active matrix light-emitting display device. The light-emitting display device illustrated in FIG. 3B includes, over a substrate 310, a pixel portion 311 having a plurality of pixels each provided with a display element; a first scan line driver circuit 312 and a second scan line driver circuit 313, each of which controls a scan line connected to a gate electrode of a pixel; and a signal line driver circuit 314 which controls video signal input to a selected pixel. In a case where two TFTs (thin film transistor) of a switching TFT and a current controlling TFT are arranged in one pixel, in the light-emitting display device illustrated in FIG. 3B, a signal which is input to a first scan line connected to a gate electrode of the switching TFT is generated in the first scan line driver circuit 312, and a signal which is input to a second scan line connected to a gate electrode of the current controlling TFT is generated in the second scan line driver circuit 313. Note that a structure in which the signal input to the first scan line and the signal input to the second scan line are generated in one scan line driver circuit may also be employed. Alternatively, for example, a plurality of the first scan lines used for controlling operation of a switching element may be provided in each pixel, depending on the number of TFTs included in the switching element. In this case, all signals which are input to the plurality of the first scan lines may be generated in one scan line driver circuit, or may be generated separately by a plurality of scan line driver circuits.

Note that modes in which the scan line driver circuit 302, the first scan line driver circuit 312, the second scan line driver circuit 313, and the signal line driver circuits 303 and 314 are formed in the display device are described here; however, part of the scan line driver circuit 302, the first scan line driver circuit 312, or the second scan line driver circuit 313 may be mounted with use of a semiconductor device such as an IC. Alternatively, part of the signal line driver circuits 303 or 314 may be mounted with a semiconductor device such as an IC.

Figure 4:
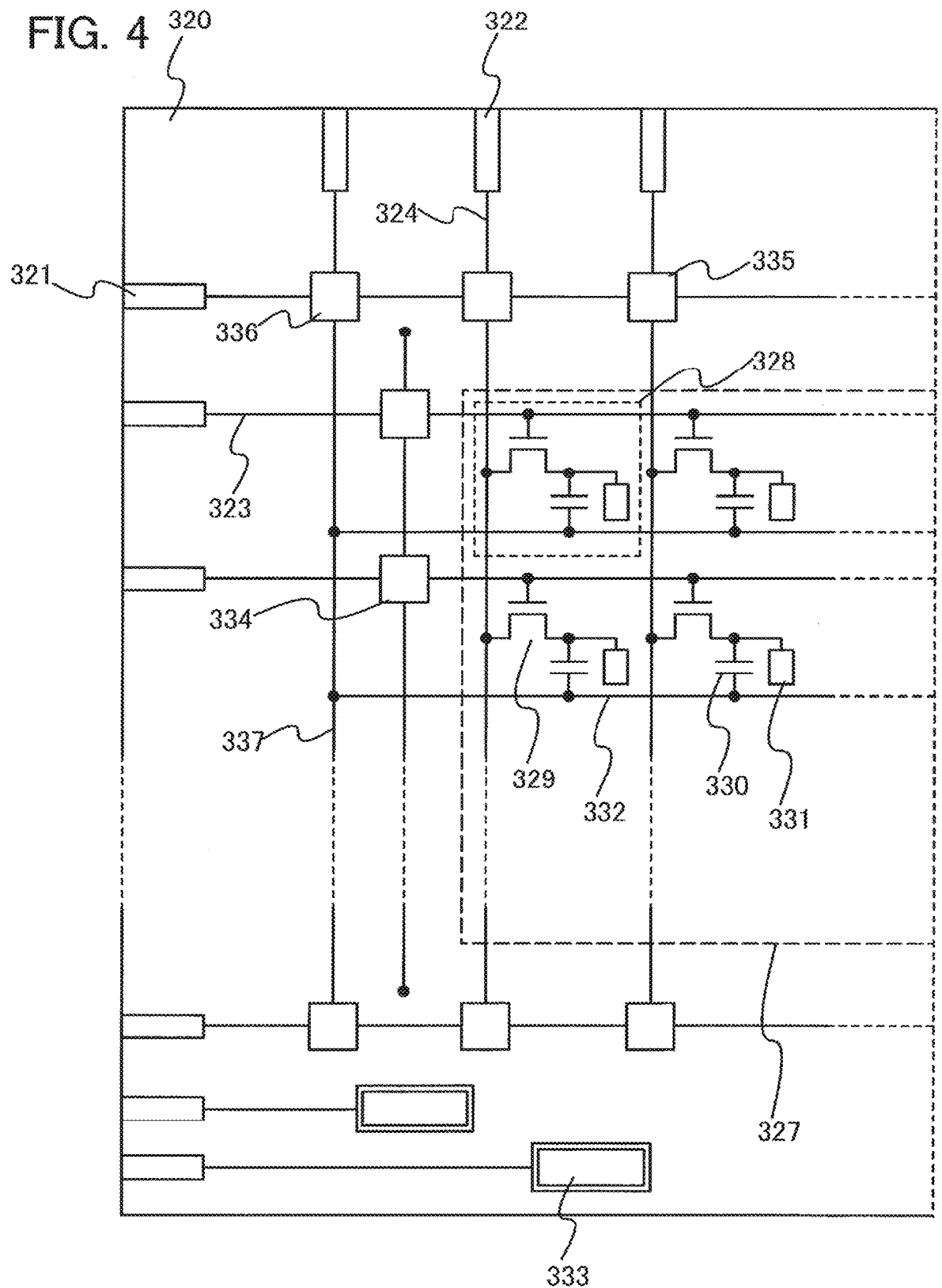
FIG. 4 is a diagram illustrating arrangement of a wiring, an input terminal, and the like in a display device of Embodiment 3.

FIG. 4 is a diagram illustrating a positional relation between a pixel portion and a protective circuit including a signal input terminal 321, a scan line 323, a signal line 324, and a non-linear element, which constitute the display device. A pixel portion 327 includes scan lines 323 and signal lines 324 which are arranged over a substrate 320 having an insulating surface so as to intersect with each other. Note that the pixel portion 327 corresponds to the pixel portion 301 and the pixel portion 311 illustrated in FIGS. 3A and 3B.

The pixel portion 301 is connected to the signal line driver circuit 303 by a plurality of signal lines S1 to Sm (not illustrated) which are arranged in columns and extended from the signal line driver circuit 303, and connected to the scan line driver circuit 302 by a plurality of scan lines G1 to Gn (not illustrated) which are arranged in rows and extended from the scan line driver circuit 302. The pixel portion 301 includes a plurality of pixels (not illustrated) arranged in a matrix form by the signal lines S1 to Sm and the scan lines G1 to Gn. Then, each pixel is connected to a signal line Sj (any one of the signal lines S1 to Sm) and a scan line G1 (any one of the scan lines G1 to Gn).

The pixel portion 327 includes a plurality of pixels 328 arranged in a matrix form. The pixel 328 includes a pixel TFT 329 connected to the scan line 323 and the signal line 324, a storage capacitor 330, and a pixel electrode 331.

The pixel structure here illustrates a case where one electrode of the storage capacitor 330 is connected to the pixel TFT 329 and the other electrode thereof is connected to a capacitor line 332. Further, the pixel electrode 331 serves as one electrode which drives a display element (a liquid crystal element, a light-emitting element, a contrast medium (electronic ink), or the like). The other electrode of such a display element is connected to a common terminal 333.

Some protective circuits are provided between the pixel portion 327 and signal line input terminals 322. In addition, other protective circuits are provided between the scan line driver circuit and the pixel portion 327. In this embodiment, a plurality of protective circuits are provided so that the pixel TFT 329 and the like are not broken when surge voltage due to static electricity or the like is applied to the scan line 323, the signal line 324, and a capacitor bus line 337. Therefore, the protective circuits are formed so that charge is released into a common wiring when the surge voltage is applied.

In this embodiment, an example in which a protective circuit 334, a protective circuit 335, and a protective circuit 336 are arranged on a scan line 323 side, on a signal line 324 side, and on a capacitor bus line 337 side, respectively is illustrated. Note that an arrangement position of the protective circuits is not limited thereto. In addition, in a case where the scan line driver circuit is not mounted with use of a semiconductor device such as an IC, the protective circuit 334 is not necessarily provided on the scan line 323 side.

By use of the TFT described in Embodiment 1 or Embodiment 2 for these circuits, the following advantages can be obtained.

The driver circuit is roughly divided into a logic circuit portion, and a switch portion or a buffer portion. A TFT provided in the logic circuit portion preferably has a structure in which control threshold voltage can be controlled. On the other hand, a TFT provided in the switch portion or the buffer portion preferably has large on current. By provision of a driver circuit including the TFTs described in Embodiment 1 or Embodiment 2, the threshold voltage of the TFT provided in the logic circuit portion can be controlled, and the on current of the TFT provided in the switch portion or the buffer portion can be increased. Furthermore, the TFTs described in Embodiment 1 or Embodiment 2 contribute to reducing an area occupied by the driver circuit and narrowing a frame.

A shift register circuit included in the scan line driver circuit is described below. A shift register circuit illustrated in FIG. 5 includes a plurality of flip-flop circuits 351, a control signal line 352, a control signal line 353, a control signal line 354, a control signal line 355, a control signal line 356, and a reset line 357.

Figure 5:
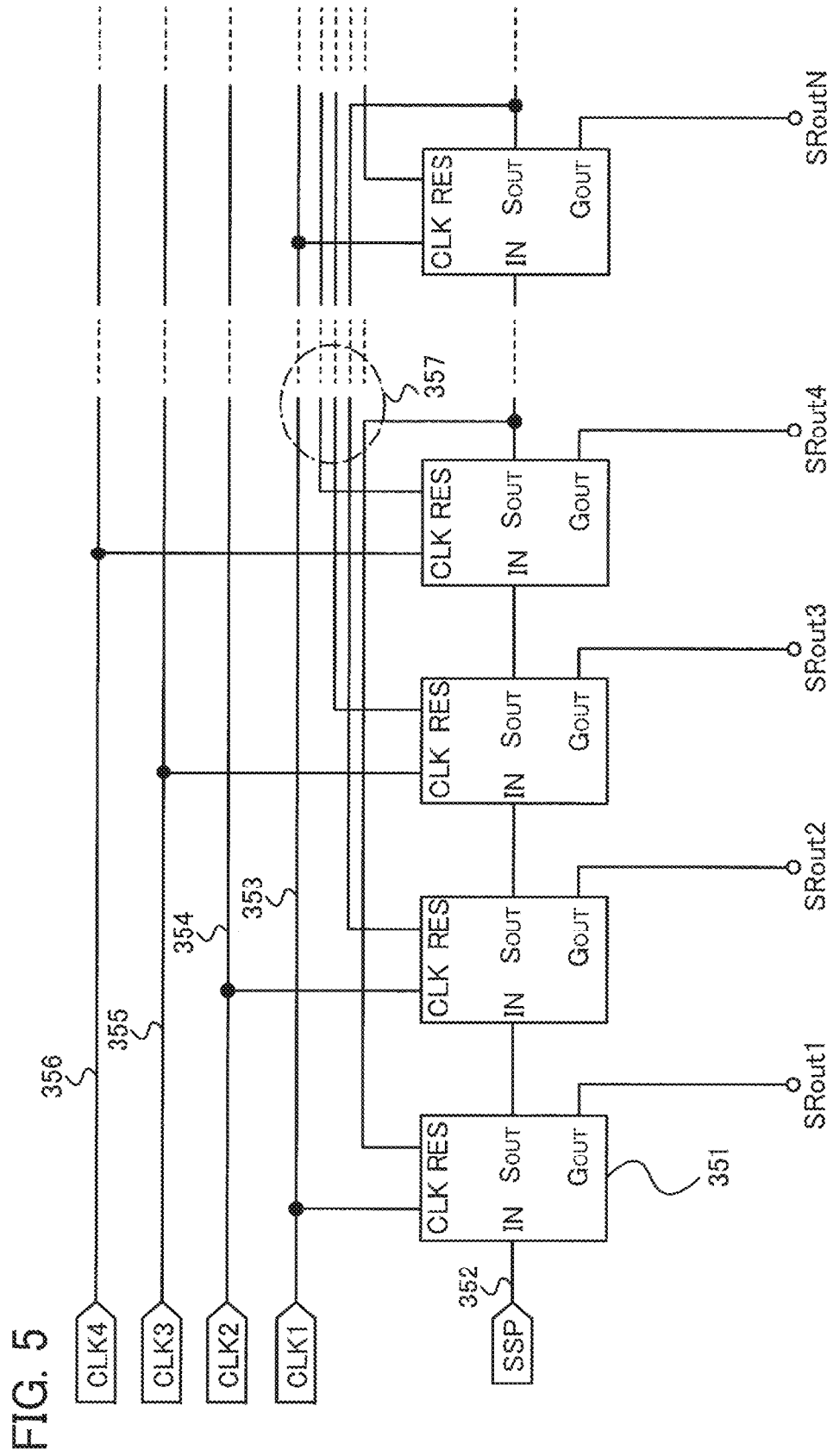
FIG. 5 is a block diagram illustrating a structure of a shift register circuit.

As illustrated in the shift register circuit of FIG. 5, in the flip-flop circuits 351, a start pulse SSP is input to an input terminal IN of the first stage through the control signal line 352, and an output signal terminal $S_{out}$ of the flip-flop circuit 351 of the preceding stage is connected to an input terminal IN of the next stage. Further, a reset terminal RES of the N-th stage (N is a natural number) is connected to an output signal terminal $S_{out}$ of the flip-flop circuit of the (N+3)th stage through the reset line 357. When it is assumed that a first clock signal CLK1 is input to a clock terminal CLK of the flip-flop circuit 351 of the N-th stage through the control signal line 353, a second clock signal CLK2 is input to the clock terminal CLK of the flip-flop circuit 351 of the (N+1)th stage through the control signal line 354. A third clock signal CLK3 is input to the clock terminal CLK of the flip-flop circuit 351 of the (N+2)th stage through the control signal line 355. A fourth clock signal CLK4 is input to the clock terminal CLK of the flip-flop circuit 351 of the (N+3)th stage through the control signal line 356. Then the first clock signal CLK1 is input to the clock terminal CLK of the flip-flop circuit 351 of the (N+4)th stage through the control signal line 353. In addition, the flip-flop circuit 351 of the N-th stage outputs an output $SR_{out}N$ of the flip flop circuit of the N-th stage from a gate output terminal $G_{out}$.

Note that connection between the flip-flop circuits 351, and a power source and a power supply line is not illustrated; however, each flip-flop circuit 351 is supplied with a power supply potential Vdd and a power supply potential GND through the power supply line.

Note that the power supply potential described in this specification corresponds to a potential difference when a reference potential is 0 V. Therefore, the power supply potential is also referred to as power supply voltage, or the power supply voltage is referred to as the power supply potential in some cases.

Note that in this specification, description that "A and B are connected to each other" includes a case where A and B are electrically connected to each other in addition to a case where A and B are directly connected to each other. Here, the description that "A and B are electrically connected to each other" includes the following cases: when an object having any electrical function exists between A and B, A and B have substantially the same potential via the object. Specifically, the description that "A and B are electrically connected to each other" includes cases where A and B are considered to have substantially the same potential in light of circuit operation, e.g., a case where A and B are connected through a switching element such as a TFT and electricity transmission through the switching element causes A and B to have substantially the same potential, a case where A and B are connected via a resistor and a potential difference between potentials generated at both ends of the resistor does not affect operation of a circuit including A and B, and the like.

Figure 6:
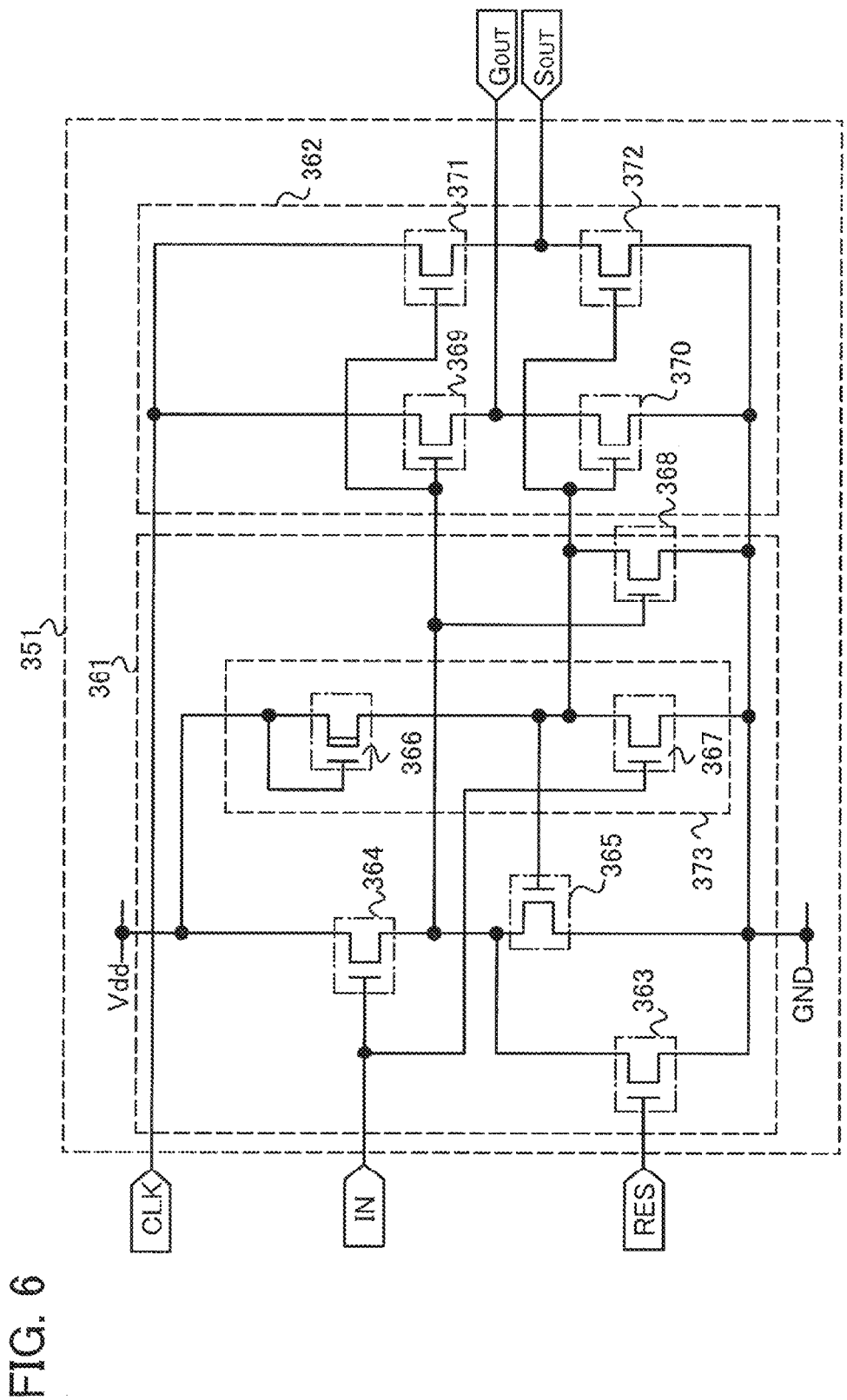
FIG. 6 is a diagram illustrating an example of a flip-flop circuit.

Next, FIG. 6 illustrates one mode of the flip-flop circuit 351 included in the shift register circuit illustrated in FIG. 5. The flip-flop circuit 351 illustrated in FIG. 6 includes a logic circuit portion 361 and a switch portion 362. The logic circuit portion 361 includes TFTs 363 to 368. Further, the switch portion 362 includes TFTs 369 to 372. Note that the logic circuit portion is a circuit for switching a signal that is output to a switch portion, which is a circuit in the next stage, in response to a signal that is input from an external portion. In addition, the switch portion is a circuit for switching on/off of a TFT which functions as a switch in response to a signal input from an external portion and a control circuit portion, and for outputting current depending on the size and the structure of the TFT.

In the flip-flop circuit 351, an input terminal IN is connected to a gate terminal of the TFT 364 and a gate terminal of the TFT 367. A reset terminal RES is connected to a gate terminal of the TFT 363. A clock terminal CLK is connected to a first terminal of the TFT 369 and a first terminal of the TFT 371. A power supply line through which the power supply potential Vdd is supplied is connected to a first terminal of the TFT 364, and a gate terminal and a second terminal of the TFT 366. A power supply line through which the power supply potential GND is supplied is connected to a second terminal of the TFT 363, a second terminal of the TFT 365, a second terminal of the TFT 367, a second terminal of the TFT 368, a second terminal of the TFT 370, and a second terminal of the TFT 372. Further, a first terminal of the TFT 363, a second terminal of the TFT 364, a first terminal of the TFT 365, a gate terminal of the TFT 368, a gate terminal of the TFT 369, and a gate terminal of the TFT 371 are connected to each other. A first terminal of the TFT 366 is connected to a gate terminal of the TFT 365, a first terminal of the TFT 367, a first terminal of the TFT 368, a gate terminal of the TFT 370, and a gate terminal of the TFT 372. In addition, a gate output terminal $G_{out}$ is connected to a second terminal of the TFT 369 and a first terminal of the TFT 370. An output signal terminal $S_{out}$ is connected to a second terminal of the TFT 371 and a first terminal of the TFT 372.

Note that a case where the TFTs 363 to 372 are all n-channel TFTs is described here.

Note that a TFT is an element having at least three terminals of a gate, a drain, and a source, and has a channel formation region between a drain region and a source region. Current can flow through the drain region, the channel formation region, and the source region. Here, the source and the drain may be exchanged with each other in some cases depending on a structure, operation conditions of the TFT, or the like; therefore, it is difficult to determine which the source is or which the drain is. Therefore, regions functioning as the source and the drain are not referred to as a source and a drain but referred to, for example, as a first terminal and a second terminal, respectively, in some cases. In such a case, a terminal functioning as a gate is referred to as a gate terminal.

Figure 7:
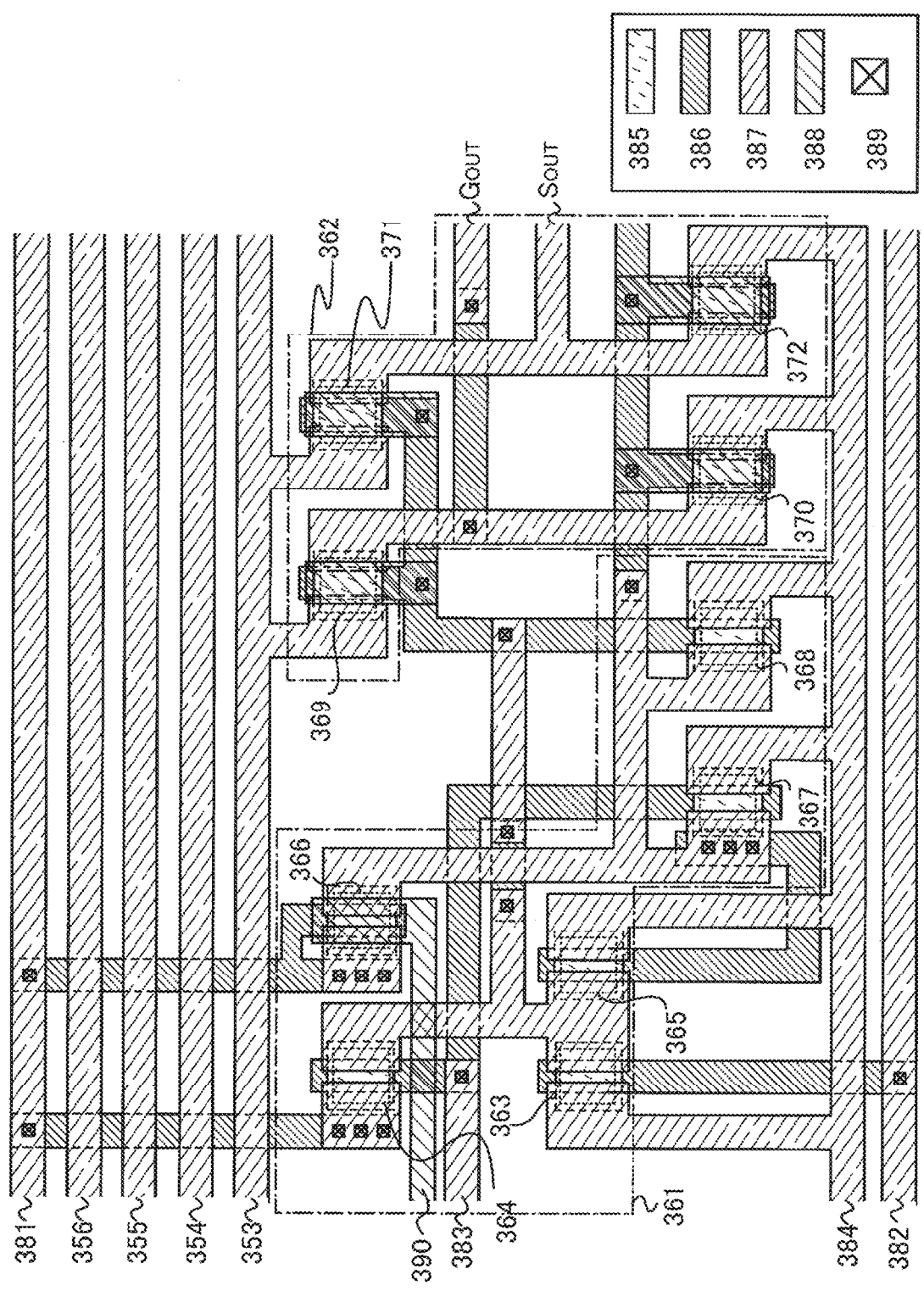
FIG. 7 is a view illustrating a layout view (a top view) of the flip-flop circuit.

Next, FIG. 7 illustrates an example of a layout view of the flip-flop circuit 351 illustrated in FIG. 6.

The flip-flop circuit of FIG. 7 includes a power supply line 381 through which the power supply potential Vdd is supplied, a reset line 382, the control signal line 353, the control signal line 354, the control signal line 355, the control signal line 356, a control signal line 383, a power supply line 384 through which the power supply potential GND is supplied, the logic circuit portion 361, and the switch portion 362. The logic circuit portion 361 includes the TFTs 363 to 368. The switch portion 362 includes the TFTs 369 to 372. In FIG. 7, a wiring connected to the gate output terminal $G_{out}$ and a wiring connected to the output signal terminal $S_{out}$ are also illustrated.

FIG. 7 illustrates a semiconductor layer 385, a first wiring layer 386, a second wiring layer 387, a third wiring layer 388, and a contact hole 389. Note that the first wiring layer 386 may be formed with a layer of a gate electrode, the second wiring layer 387 may be formed with a layer of source and drain electrodes of a TFT, and the third wiring layer 388 may be formed with a layer of a pixel electrode in the pixel portion. However, without being limited to this example, the third wiring layer 388 may be formed as a layer different from the layer of the pixel electrode for example.

Note that connections between circuit elements in FIG. 7 are as illustrated in FIG. 6. Note that FIG. 7 illustrates the flip-flop circuit to which the first clock signal is input; therefore, connections to the control signal lines 354 to 356 are not illustrated.

In the layout view of the flip-flop circuit of FIG. 7, by controlling threshold voltage of the TFT 366 or the TFT 367 included in the logic circuit portion 361, an EDMOS circuit 373 can be formed. Typically, the EDMOS circuit 373 in which the TFT 366 is a depletion type and the TFT 367 is an enhancement type is formed, and the TFTs 369 to 372 included in the switch portion 362 are dual-gate TFTs or depletion type TFTs. Note that in FIG. 6, the TFT 366 and the TFT 367 in the EDMOS circuit 373 are different from the TFTs in the EDMOS circuit illustrated in FIGS. 2A to 2C in a connection position of the gate electrode of the depletion type TFT.

The TFT 366 or the TFT 367 is formed so as to be a dual-gate TFT and a potential of a back-gate electrode is controlled, so that a depletion type TFT or an enhancement type TFT can be formed.

In FIG. 7, a control signal line 390 which has the same potential as a back-gate electrode for controlling the threshold voltage of the TFT 366 is separately provided to form a depletion type. The TFT 366 is a dual-gate TFT, and a potential of the back-gate electrode is different from a potential of the power supply line 381 through which the power supply potential Vdd that is applied to the gate electrode is supplied.

FIG. 7 illustrates an example in which the TFTs 369 to 372 are dual-gate TFTs and the back-gate electrodes and the gate electrodes have the same potentials, and a potential of each of the back-gate electrodes is the same potential as that of the power supply line through which the power supply potential Vdd that is applied to the gate electrode is supplied.

In this manner, TFTs arranged in the pixel portion and the driver circuit of the display device can be formed using only n-channel TFTs in which an oxide semiconductor layer is used.

Further, the TFT 366 in the logic circuit portion 361 is a TFT for supplying current in response to the power supply potential Vdd. The TFT 366 is formed to be a dual-gate TFT or a depletion type TFT to increase the flowing current, whereby miniaturization of the TFT can be achieved without reducing performance.

Further, in the TFTs included in the switch portion 362, the amount of current flowing in the TFTs can be increased and switching of on/off can be performed at high speed; therefore, an area occupied by the TFTs can be reduced without reducing performance. Accordingly, an area occupied by the circuit including the TFTs can also be reduced. Note that the TFTs 369 to 372 in the switch portion 362 may be formed to be dual-gate TFTs such that the semiconductor layer 385 is interposed between the first wiring layer 386 and the third wiring layer 388 as illustrated in the drawing.

The example that the dual-gate TFTs each have a structure in which the semiconductor layer 385 is interposed between the first wiring layer 386 and the third wiring layer 388 which have the same potential by being connected to each other through the contact hole 389 is illustrated in FIG. 7. However, there is no particular limitation; for example, a structure in which a control signal line is separately provided for the third wiring layer 388 to control a potential of the third wiring layer 388 independently from the first wiring layer 386 may be employed.

Note that in the layout view of the flip-flop circuit illustrated in FIG. 7, the shapes of the channel formation regions of the TFTs 363 to 372 may be U shapes (reversed C shapes or horseshoe shapes). In addition, although all the TFTs have the same size in FIG. 7, the size of each TFT which is connected to the output signal terminal $S_{out}$ or the gate output terminal $G_{out}$ may be changed as appropriate in accordance with the amount of a load of a subsequent stage.

Figure 8:
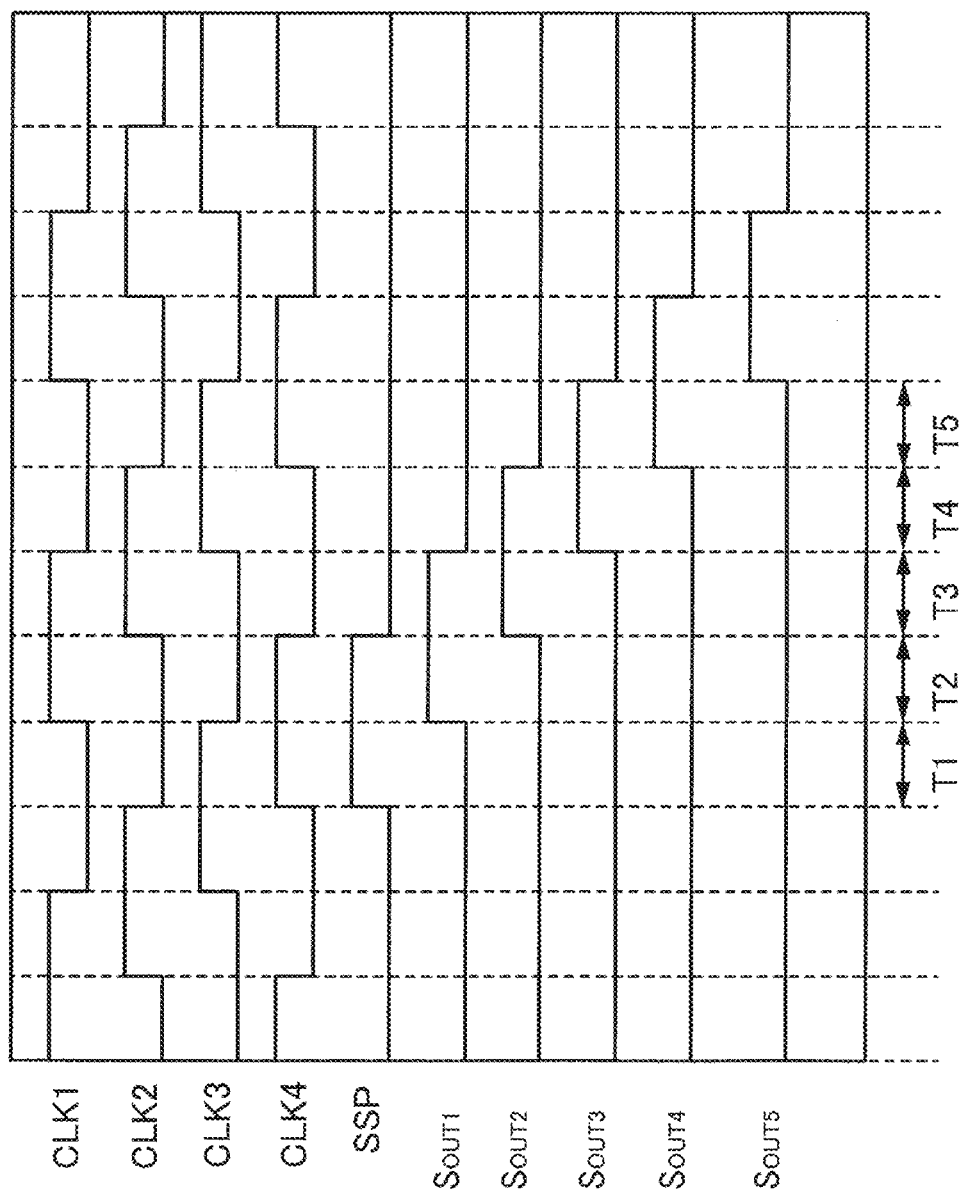
FIG. 8 is a diagram illustrating a timing chart for showing operation of a shift register circuit.

Next, operation of the shift register circuit illustrated in FIG. 5 is described with reference to a timing chart illustrated in FIG. 8. FIG. 8 illustrates the start pulse SSP and the first to fourth clock signals CLK1 to CLK4, which are supplied to the control signal lines 352 to 356 illustrated in FIG. 5, respectively, and the Sout1 to Sout5 output from the output signal terminals $S_{out}$ of the flip-flop circuits of the first to fifth stages. Note that in description of FIG. 8, the reference numerals denoting the respective elements in FIG. 6 and FIG. 7 are used.

Note that FIG. 8 is a timing chart in the case where each TFT included in the flip-flop circuits is an n-channel TFT. Further, the first clock signal CLK1 is shifted from the fourth clock signal CLK4 by ¼ wavelength (a section divided by dotted lines) as illustrated.

First, in a period T1, the start pulse SSP is input to the flip-flop circuit of the first stage at an H level, and the logic circuit portion 361 turns the TFTs 369 and 371 on and the TFTs 370 and 372 off in the switch portion. At this time, since the first clock signal CLK1 is at an L level, the Sout 1 is at an L level.

Note that in the period T1, signals are not input to the IN terminals of the flip-flop circuits of the second and subsequent stages, so that the flip-flop circuits output L levels without operation. Note that description is made assuming that each flip-flop circuit of the shift register circuit outputs an L level in an initial state.

Next, in a period T2, the logic circuit portion 361 controls the switch portion 362 in the flip-flop circuit of the first stage in a manner similar to the period T1. In the period T2, the first clock signal CLK1 is at an H level, and thus the Sout 1 is at an H level. Further, in the period T2, the Sout 1 is input to the IN terminal of the flip-flop circuit of the second stage at an H level, and the logic circuit portion 361 turns the TFTs 369 and 371 on and the TFTs 370 and 372 off in the switch portion. At this time, since the second clock signal CLK2 is at an L level, the Sout 2 is at an L level.

Note that in the period T2, signals are not input to the IN terminals of the flip-flop circuits of the third and subsequent stages, so that the flip-flop circuits output L levels without operation.

Next, in a period T3, the logic circuit portion 361 controls the switch portion 362 so that a state of the period T2 is held in the flip-flop circuit of the first stage. Therefore, in the period T3, the first clock signal CLK1 is at an H level and the Sout 1 is at an H level. Further, in the period T3, the logic circuit portion 361 controls the switch portion 362 in the flip-flop circuit of the second stage in a manner similar to the period T2. In the period T3, since the second clock signal CLK2 is at an H level, the Sout 2 is at an H level. In addition, the Sout 2 is input to the IN terminal of the flip-flop circuit of the third stage at an H level in the period T3, and the logic circuit portion 361 turns the TFTs 369 and 371 on and the TFTs 370 and 372 off in the switch portion. At this time, the third clock signal CLK3 is at an L level, and thus the Sout 3 is at an L level.

Note that in the period T3, signals are not input to the IN terminals of the flip-flop circuits of the fourth and subsequent stages, so that the flip-flop circuits output L levels without operation.

Next, in the period T4, the logic circuit portion 361 controls the switch portion 362 so that a state of the period T3 is held in the flip-flop circuit of the first stage. Therefore, in the period T4, the first clock signal CLK1 is at an L level and the Sout 1 is at an L level. Further, in the period T4, the logic circuit portion 361 controls the switch portion 362 so that a state of the period T3 is held in the flip-flop circuit of the second stage. Therefore, in the period T4, the second clock signal CLK2 is at an H level and Sout 2 is at an H level. In addition, in the period T4, the logic circuit portion 361 controls the switch portion 362 in the flip-flop circuit of the third stage in a manner similar to the period T3. In the period T4, since the third clock signal CLK3 is at an H level, the Sout 3 is at an H level. The Sout 3 is input to the IN terminal of the flip-flop circuit of the fourth stage at an H level in the period T4, and the logic circuit portion 361 turns the TFTs 369 and 371 on and the TFTs 370 and 372 off in the switch portion 362. At this time, since the fourth clock signal CLK4 is at an L level, the Sout 4 is at an L level.

Note that in the period T4, signals are not input to the IN terminals of the flip-flop circuits of the fifth and subsequent stages, so that the flip-flop circuits output L levels without operation.

Next, in a period T5, the logic circuit portion 361 controls the switch portion 362 so that a state of the period T3 is held in the flip-flop circuit of the second stage. Therefore, in the period T5, the second clock signal CLK2 is at an L level and the Sout 2 is at an L level. Further, in the period T5, the logic circuit portion 361 controls the switch portion 362 so that a state of the period T4 is held in the flip-flop circuit of the third stage. Therefore, in the period T5, the third clock signal CLK3 is at an H level and the Sout 3 is at an H level. In addition, in the period T5, the logic circuit portion 361 controls the switch portion 362 in the flip-flop circuit of the fourth stage in a manner similar to the period T4. In the period T5, since the fourth clock signal CLK4 is at an H level, the Sout 4 is at an H level. The flip-flop circuits of the fifth and subsequent stages have a wiring connection and a timing of signals to be input similar to those of the flip-flop circuits of the first to fourth stages; therefore, description thereof is omitted.

As illustrated in the shift register circuit of FIG. 5, the Sout 4 also functions as a reset signal of the flip-flop circuit of the first stage. In the period T5, the Sout 4 is at an H level and this signal is input to the reset terminal RES of the flip-flop circuit of the first stage. When the reset signal is input, the TFTs 369 and 371 are turned off and the TFTs 370 and 372 are turned on in the switch portion 362. Then, the Sout 1 of the flip-flop circuit of the first stage outputs an L level until input of the next start pulse SSP.

By the above-described operation, in the flip-flop circuits of the second and subsequent stages, the logic circuit portions are also reset based on the reset signals which are output from the flip-flop circuits of subsequent stages. As shown by the Souts 1 to 5, a shift register circuit in which signals having waveforms shifted by ¼ wavelength of the clock signals are output can be formed.

When the flip-flop circuit has a structure in which an EDMOS circuit that is a combination of an enhancement type TFT and a depletion type TFT is provided in the logic circuit portion and a dual-gate TFT is provided in the switch portion, the amount of current flowing in the TFTs included in the logic circuit portion 361 can be increased and an area occupied by the TFTs and furthermore, an area occupied by the circuit including the TFTs can be reduced without reduction in performance. Further, in the TFT included in the switch portion 362, the amount of current flowing in the TFTs can be increased and switching of on/off can be performed at high speed; therefore, an area occupied by the TFTs and furthermore, an area occupied by the circuit including the TFTs can be reduced without reduction in performance. Accordingly, a narrower frame, downsizing, high performance of a display device can be achieved.

Further, a latch circuit, a level shifter circuit, or the like can be provided in the signal line driver circuit illustrated in FIGS. 3A and 3B. A buffer portion is provided in the last stage through which a signal is transmitted from the signal line driver circuit to the pixel portion, and an amplified signal is transmitted from the signal line driver circuit to the pixel portion. Thus, when a TFT having large on current, typically a dual-gate TFT or a depletion type TFT is provided in the buffer portion, an area of the TFT can be reduced and an area occupied by the signal line driver circuit can be reduced. Accordingly, a narrow frame, downsizing, and high performance of a display device can be achieved. Note that since high-speed operation is required for the shift register which is part of the signal line driver circuit, the shift register is preferably mounted on a display device by use of an IC or the like.

In addition, this embodiment can be freely combined with Embodiment 1 or Embodiment 2.

Embodiment 4

In Embodiment 4, a method for manufacturing a display device including the second thin film transistor 170 described in Embodiment 1 will be described with reference to FIGS. 9A to 9C, FIGS. 10A to 10C, FIG. 11, FIG. 12, FIG. 13, FIG. 14, FIGS. 15A, 15B, 15C, and 15D, and FIG. 16.

In FIG. 9A, a glass substrate of barium borosilicate glass, aluminoborosilicate glass, or the like can be used as a substrate 100 having a light-transmitting property.

Next, after a conductive layer is formed over an entire surface of the substrate 100, a resist mask is formed by a first photolithography step. Then, unnecessary portions are removed by etching, thereby forming wirings and electrodes (a gate wiring including the gate electrode 101, a capacitor wiring 108, and a first terminal 121). At this time, etching is performed so that at least an end portion of the gate electrode

Figure 11:
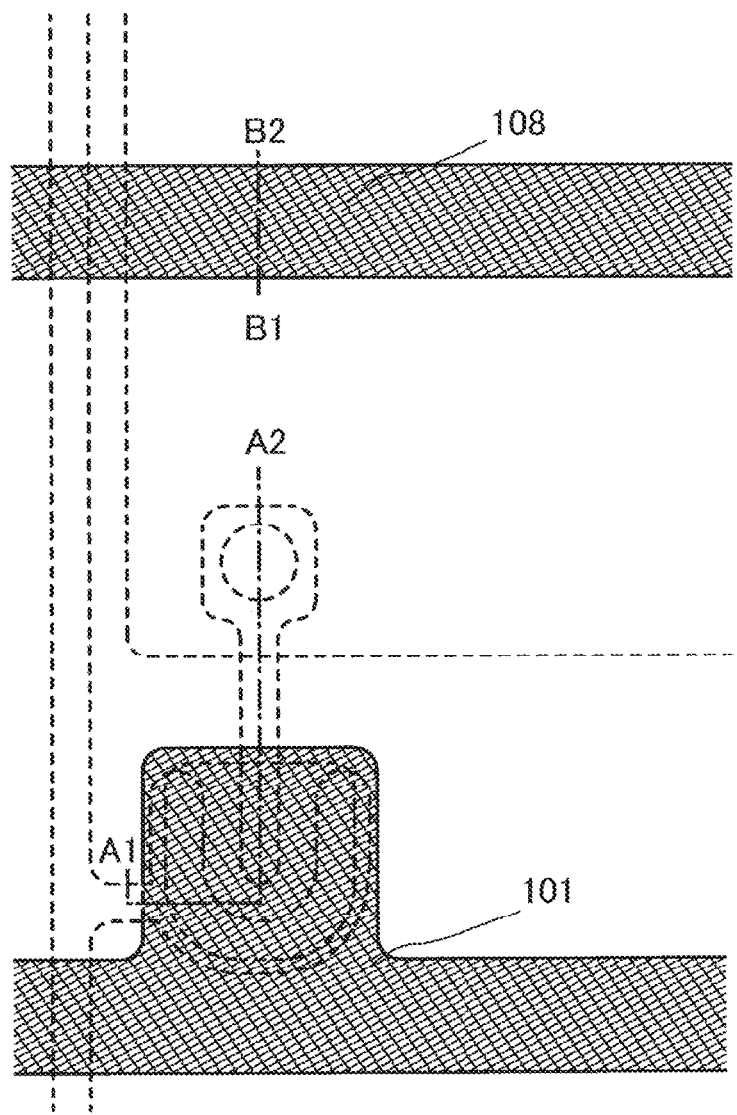
FIG. 11 is a view illustrating a method for manufacturing the semiconductor device of Embodiment 4.

101 is tapered. A cross-sectional view at this stage is illustrated in FIG. 9A. Note that FIG. 11 is a top view at this stage.

The gate wiring including the gate electrode 101, the capacitor wiring 108, and the first terminal 121 in the terminal portion are desirably formed of a low-resistant conductive material such as aluminum (Al) or copper (Cu). However, aluminum itself has the disadvantages of low heat resistance, being easily corroded, and the like; thus, it is used in combination with a conductive material having heat resistance. As the conductive material having heat resistance, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy film containing a combination of any of these elements, or a nitride containing any of these elements as its component.

Then, the gate insulating layer 102 is entirely formed over the gate electrode 101. The gate insulating layer 102 is formed to a thickness of 50 nm to 400 nm by a sputtering method or the like. When yield of the thin film transistor is prioritized, the thickness of the gate insulating layer 102 is preferably large.

For example, as the gate insulating layer 102, a silicon oxide film is formed to a thickness of 100 nm by a sputtering method. It is needless to say that the gate insulating layer 102 is not limited to such a silicon oxide film, and another insulating film such as a silicon oxynitride film, a silicon nitride film, an aluminum oxide film, an aluminum nitride film, an aluminum oxynitride film, or a tantalum oxide film may be used to form a single-layer structure or a stacked structure. When a silicon oxynitride film, a silicon nitride film, or the like is used as the gate insulating layer 102, an impurity from the glass substrate, sodium for example, can be preventing from diffusing into and entering an oxide semiconductor to be formed later.

Note that dust adhering to the surface of the gate insulating layer is preferably removed by reverse sputtering where plasma is generated by introduction of an argon gas, before the oxide semiconductor film is formed. In addition, nitrogen, helium or the like may be used instead of an argon atmosphere. Alternatively, the reserve sputtering may be conducted in an argon atmosphere to which oxygen, hydrogen, $N_2O$ and/or the like are/is added. Still alternatively, it may be conducted in an argon atmosphere to which $Cl_2$, $CF_4$, and/or the like are/is added.

Next, the first oxide semiconductor film (first In—Ga—Zn—O-based non-single-crystal film in this embodiment) is formed over the gate insulating layer 102. The first In—Ga—Zn—O-based non-single-crystal film formed without being exposed to air after the plasma treatment, can avoid the trouble that dust or moisture adheres to the interface between the gate insulating layer and the semiconductor film. Here, the In—Ga—Zn—O-based non-single-crystal film is formed in an argon atmosphere or an oxygen atmosphere under the condition where the target is an oxide semiconductor target including In (indium), Ga (gallium), and Zn (zinc) ($In_2O_3:Ga_2O_3:ZnO=1:1:1$) with a diameter of 8 inches, the distance between the substrate and the target is set at 170 mm, the pressure is set at 0.4 Pa, and the direct current (DC) power supply is set at 0.5 kW. Note that a pulse direct current (DC) power supply is preferable because dust can be reduced and the film thickness can be uniform. The thickness of the first In—Ga—Zn—O-based non-single-crystal film is set to from 5 nm to 200 nm. The thickness of the first In—Ga—Zn—O-based non-single-crystal film in this embodiment is 100 nm.

Next, a second oxide semiconductor film (second In—Ga—Zn—O-based non-single-crystal film in this embodiment) is formed by a sputtering method without being exposed to air. Here, sputtering deposition is performed under the condition where a target includes indium oxide ($In_2O_3$), gallium oxide ($Ga_2O_3$), and zinc oxide (ZnO) at a ratio of 1:1:1 (=$In_2O_3:Ga_2O_3:ZnO$), the pressure in a deposition chamber is set at 0.4 Pa, the electric power is set at 500 W, the deposition temperature is set to room temperature, and the argon gas flow rate is set at 40 sccm. Although the target of $In_2O_3:Ga_2O_3:ZnO=1:1:1$ is used intentionally, an In—Ga—Zn—O-based non-single-crystal film including a crystal grain which has a size of 1 nm to 10 nm just after the film formation is obtained in some cases. It can be said that control of the presence or absence of crystal grains and the density of crystal grains and adjustment of the diameter of the crystal grain within 1 nm to 10 nm can be done by adjusting as appropriate, the deposition condition of reactive sputtering, such as the target composition ratio, the deposition pressure (0.1 Pa to 2.0 Pa), the electric power (250 W to 3000 W: 8 inchesφ), the temperature (room temperature to 100° C.), or the like. The thickness of the second In—Ga—Zn—O-based non-single-crystal film is set to 5 nm to 20 nm. Needless to say, the size of a grain included in the film does not exceed the film thickness. In this embodiment, the second In—Ga—Zn—O-based non-single-crystal film has a thickness of 5 nm.

The first In—Ga—Zn—O-based non-single-crystal film is formed under the different conditions from the second In—Ga—Zn—O-based non-single-crystal film. For example, as compared with the oxygen gas flow rate and the argon gas flow rate in the deposition condition of the second In—Ga—Zn—O-based non-single-crystal film, the oxygen gas flow rate in the deposition condition of the first In—Ga—Zn—O-based non-single-crystal film is increased. Specifically, the second In—Ga—Zn—O-based non-single-crystal film is formed in a rare gas (such as argon or helium) atmosphere (or a gas including oxygen at 10% or less and argon at 90% or more), while the first In—Ga—Zn—O-based non-single-crystal film is formed in an oxygen atmosphere (or the oxygen gas flow rate is equal to or larger than the argon gas flow rate).

The second In—Ga—Zn—O-based non-single-crystal film may be formed in the same chamber as the chamber where the reverse sputtering is performed previously, or may be formed in a different chamber from the chamber where the reverse sputtering is performed previously.

Examples of sputtering include an RF sputtering in which a high-frequency power source is used for a sputtering power source, a DC sputtering, and a pulsed DC sputtering in which a bias is applied in a pulsed manner.

In addition, there is also a multi-source sputtering apparatus in which a plurality of targets of different materials can be set. With the multi-source sputtering apparatus, films of different materials can be deposited to be stacked in the same chamber, or a plurality of kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with use of microwaves is used without using glow discharge.

Furthermore, as a deposition method by sputtering, there are also a reactive sputtering in which a target substance and a sputtering gas component are chemically reacted with each other during deposition to form a thin compound film thereof, and a bias sputtering in which voltage is also applied to a substrate during deposition.

Figure 12:
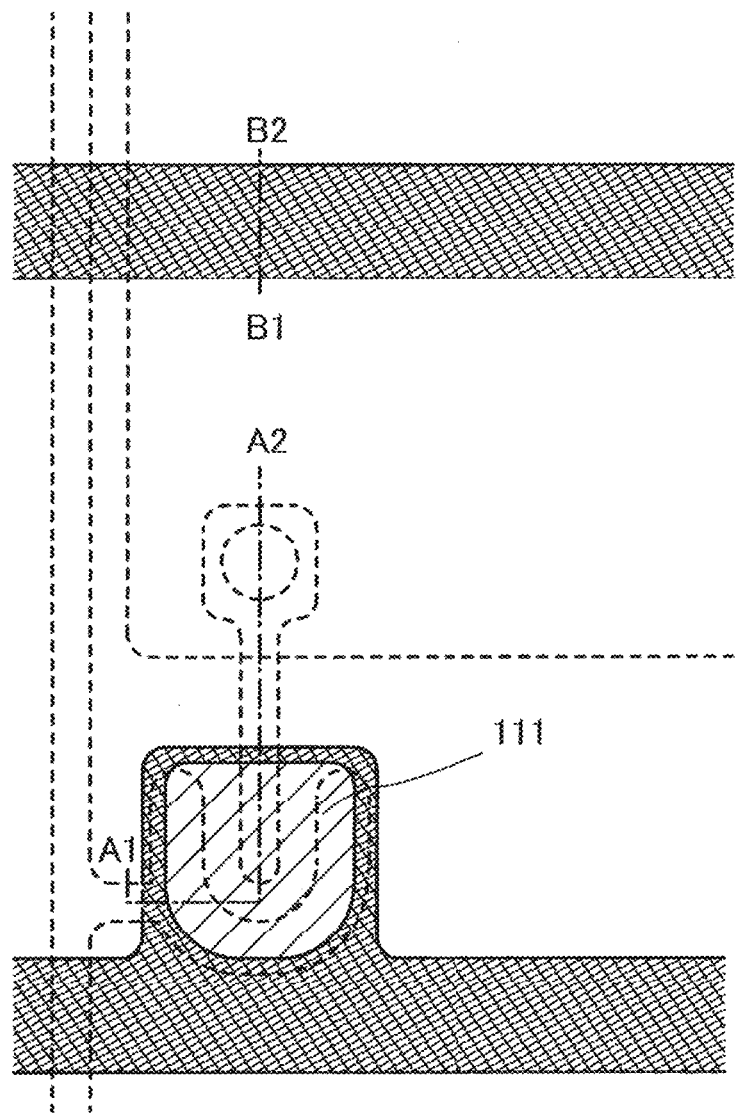
FIG. 12 is a view illustrating a method for manufacturing the semiconductor device of Embodiment 4.

Next, a second photolithography step is performed to form a resist mask, and the first In—Ga—Zn—O-based non-single-crystal film and the second In—Ga—Zn—O-based non-single-crystal film are etched. Here, unnecessary portions are removed by wet etching using ITO07N (manufactured by KANTO CHEMICAL CO., INC.), thereby forming the oxide semiconductor film 109 that is the first In—Ga—Zn—O-based non-single-crystal film and an oxide semiconductor film 111 that is the second In—Ga—Zn—O-based non-single-crystal film. Note that this etching step may be dry etching without being limited to wet etching. A cross-sectional view at this stage is illustrated in FIG. 9B. Note that FIG. 12 is a top view at this stage.

Next, a third photolithography step is conducted to form a resist mask, and unnecessary portions are removed by etching to form a contact hole which reaches an electrode layer or a wiring made of the same materials as the gate electrode layer. The contact hole is provided for direct connection with a conductive film to be formed later. For example, in the driving circuit portion, a contact hole is formed when a thin film transistor whose gate electrode layer is direct contact with the source or drain electrode layer or a terminal that is electrically connected to a gate wiring of a terminal portion is formed. In this embodiment, the example of forming the contact hole for direct connection with the conductive film to be formed later by the third photolithography step is described, but there is no particular limitation and the contact hole which reaches the gate electrode layer may be formed later at the same process as a contact hole for connection with the pixel electrode, and electrical connection may be performed with use of the same material as the pixel electrode. In the case where electrical connection is performed with use of the same material as the pixel electrode, one mask can be reduced.

Then, a conductive film 132 formed from a metal material is formed over the oxide semiconductor film 109 and the oxide semiconductor film 111 by a sputtering method or a vacuum evaporation method. A cross-sectional view at this stage is illustrated in FIG. 9C.

As the material of the conductive film 132, there are an element selected from Al, Cr, Ta, Ti, Mo, and W, an alloy containing any of these elements as its component, an alloy containing a combination of any of these elements, and the like. If heat treatment at 200° C. to 600° C. is performed, the conductive film preferably has heat resistance enough to withstand the heat treatment. Since aluminum itself has the disadvantages of low heat resistance, being easily corroded, and the like, it is used in combination with a conductive material having heat resistance. As the conductive material having heat resistance, which is combined with aluminum, it is possible to use an element selected from titanium (Ti), tantalum (Ta), tungsten (W), molybdenum (Mo), chromium (Cr), neodymium (Nd), and scandium (Sc), an alloy containing any of these elements as its component, an alloy containing a combination of any of these elements, or a nitride containing any of these elements as its component.

Here, the conductive film 132 has a single-layer structure of a titanium film. The conductive film 132 may also have a two-layer structure in which a titanium film is stacked on an aluminum film. Alternatively, the conductive film 132 may have a three-layer structure in which a titanium (Ti) film, an aluminum film containing neodymium (Nd) (an Al—Nd film), and a titanium (Ti) film are stacked in order.

Further alternatively, the conductive film 132 may have a single-layer structure of an aluminum film containing silicon.

Next, a fourth photolithography step is performed to form a resist mask 131, and unnecessary portions are removed by etching to form the source and drain electrode layers 105a and 105b, the n$^+$ layers 104a and 104b serving as the source and drain regions, and a connection electrode 120. This etching step is performed by wet etching or dry etching. For example, when an aluminum film or an aluminum alloy film is used as the conductive film 132, wet etching can be performed using a solution in which phosphoric acid, acetic acid, and nitric acid are mixed.

Figure 10A:
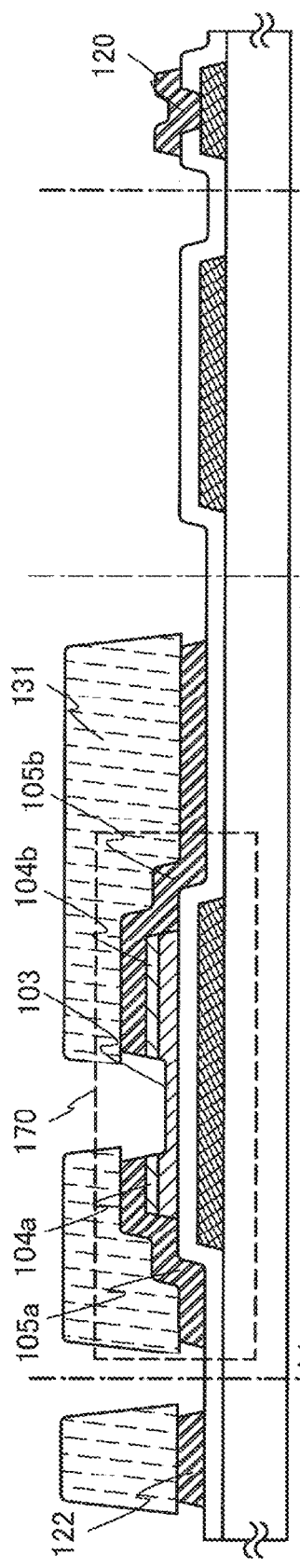
FIGS. 10A to 10C are views illustrating a method for manufacturing the semiconductor device of Embodiment 4.
Figure 13:
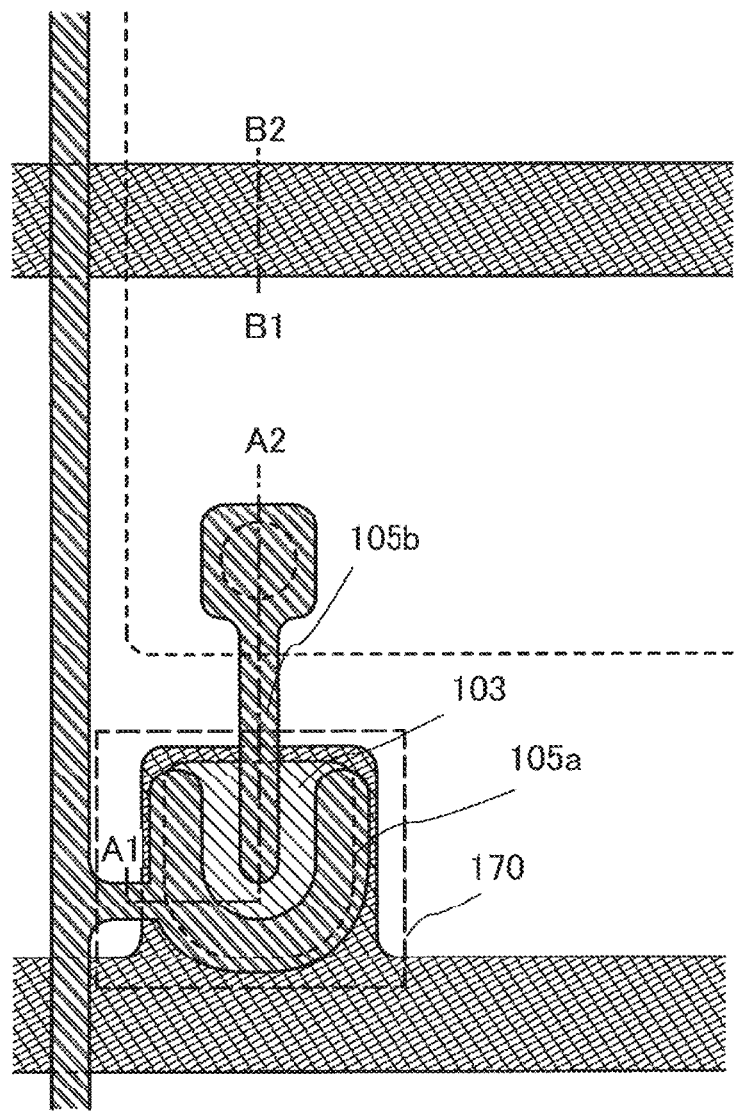
FIG. 13 is a view illustrating a method for manufacturing the semiconductor device of Embodiment 4.

Here, with use of an ammonia hydrogen peroxide mixture (hydrogen peroxide:ammonia:water=5:2:2), the conductive film 132 made of titanium (Ti) is wet-etched to form the source and drain electrode layers 105a and 105b, and the oxide semiconductor film 111 is wet-etched to form the n$^+$ layers 104a and 104b. In this etching step, an exposed region of the oxide semiconductor film 109 is partially etched to be an oxide semiconductor layer 103. In this manner, a channel region of the oxide semiconductor layer 103 between the n$^+$ layers 104a and 104b is a region whose thickness is smaller. In FIG. 10A, formation of the source and drain electrode layers 105a and 105b and the n$^+$ layers 104a and 104b by etching are simultaneously conducted using an ammonia hydrogen peroxide mixture; therefore, the end portions of the source and drain electrode layers 105a and 105b are aligned with the end portions of the n$^+$ layers 104a and 104b, so that the end portions are continuous. In addition, wet etching allows the layers to be etched isotropically, so that the end portions of the source and drain electrode layers 105a and 105b are recessed from the resist mask 131. Through the above steps, the second thin film transistor 170 including the oxide semiconductor layer 103 as its channel formation region can be formed. A cross-sectional view at this stage is illustrated in FIG. 10A. Note that FIG. 13 is a top view at this stage.

Then, heat treatment is preferably performed at 200° C. to 600° C., and typically, 300° C. to 500° C. Here, heat treatment at 350° C. for one hour is performed in a furnace in a nitrogen atmosphere. This heat treatment involves the rearrangement at the atomic level in the In—Ga—Zn—O-based non-single-crystal film. The heat treatment (including light annealing) in this step is important because the strain that inhibits the movement of carriers can be released. Note that there is no particular limitation on the timing of the heat treatment, and the heat treatment may be performed at any time after the deposition of the second In—Ga—Zn—O-based non-single-crystal film, for example, after the formation of a pixel electrode.

Furthermore, the exposed channel formation region of the oxide semiconductor layer 103 may be subjected to oxygen radical treatment, so that a normally-off thin film transistor can be obtained. In addition, the radical treatment can repair damage due to the etching of the oxide semiconductor layer 103. The radical treatment is preferably performed in an atmosphere of $O_2$ or $N_2O$, and preferably an atmosphere of $N_2$, He, or Ar each containing oxygen. The radical treatment may also be performed in an atmosphere in which $Cl_2$ and/or $CF_4$ is added to the above atmosphere. Note that the radical treatment is preferably performed with no bias applied.

In the fourth photolithography step, a second terminal 122 that is made of the same material as the source and drain electrode layers 105a and 105b is left in the terminal portion. Note that the second terminal 122 is electrically connected to a source wiring (a source wiring including the source and drain electrode layers 105*a* and 105*b*).

In addition, in the terminal portion, the connection electrode 120 is directly connected to the first terminal 121 of the terminal portion through a contact hole formed in the gate insulating film. Note that although not illustrated here, a source or drain wiring of the thin film transistor of the driver circuit is directly connected to the gate electrode through the same steps as the above-described steps.

Further, by use of a resist mask having regions with plural thicknesses (typically, two different thicknesses) which is formed using a multi-tone mask, the number of resist masks can be reduced, resulting in simplified process and lower costs.

Next, the resist mask 131 is removed, and a protective insulating layer 107 is formed to cover the second thin film transistor 170. For the protective insulating layer 107, a single layer or a stacked layer of a silicon nitride film, a silicon oxide film, a silicon oxynitride film, an aluminum oxide film, an aluminum nitride film, an aluminum oxynitride film, a tantalum oxide film, and/or the like, which are/is obtained by a sputtering method or the like can be used. In the thin film transistor in part of the driver circuit, the protective insulating layer 107 functions as a second gate insulating layer and a second gate electrode is formed thereover. The protective insulating layer 107 has a thickness of 50 nm to 400 nm. When yield of the thin film transistor is prioritized, the thickness of the protective insulating layer 107 is preferably large. Further, when a silicon oxynitride film, a silicon nitride film, or the like is used as the protective insulating layer 107, impurities attached for some reason after the formation of the protective insulating layer 107, e.g., sodium, can be prevented from diffusing into and entering the oxide semiconductor.

Then, a fifth photolithography step is performed to form a resist mask, and the protective insulating layer 107 is etched to form a contact hole 125 reaching the drain electrode layer 105*b*.

Figure 10B:
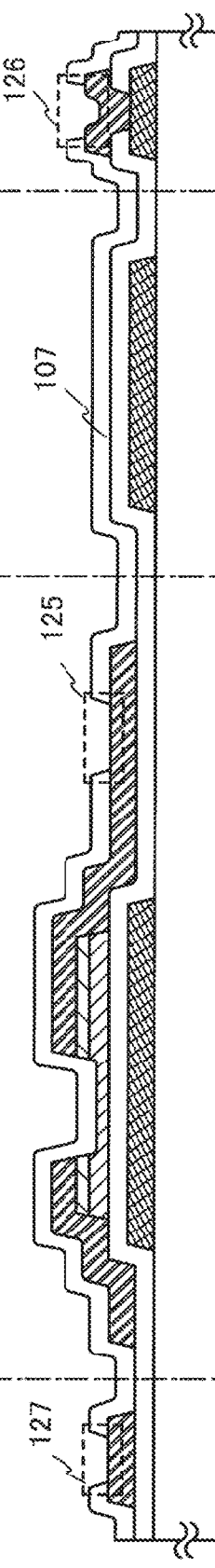

In addition, a contact hole 126 reaching the connection electrode 120 and a contact hole 127 reaching the second terminal 122 are also formed by this etching. A cross-sectional view at this stage is illustrated in FIG. 10B.

Next, the resist mask is removed, and then a transparent conductive film is formed. The transparent conductive film is formed of indium oxide ($In_2O_3$), indium oxide-tin oxide alloy ($In_2O_3$—$SnO_2$, abbreviated to ITO), or the like by a sputtering method, a vacuum evaporation method, or the like. Such a material is etched with a hydrochloric acid-based solution. However, since a residue is easily generated particularly in etching ITO, indium oxide-zinc oxide alloy ($In_2O_3$—$ZnO$) may be used to improve etching processability.

Next, a sixth photolithography step is performed to form a resist mask, and unnecessary portions are removed by etching, thereby forming the pixel electrode 110 in the pixel portion. In the sixth photolithography step, in the driver circuit, the same material as that of the pixel electrode 110 is used for part of the circuit to form an electrode layer (a back-gate electrode) for controlling the threshold value over the oxide semiconductor layer. Note that the thin film transistor having the back-gate electrode is described in Embodiment 1 with reference to FIG. 1A; therefore, detailed description thereof is omitted here.

In the sixth photolithography step, a storage capacitor is formed from the capacitor wiring 108 and the pixel electrode 110 by using the gate insulating layer 102 and the protective insulating layer 107 in the capacitor portion as dielectrics.

Note that an example in which the storage capacitor is formed from the capacitor wiring 108 and the pixel electrode 110 by using the gate insulating layer 102 and the protective insulating layer 107 as the dielectrics is described here. However, there is no particular limitation and a structure may also be employed in which an electrode formed of the same material as the source electrode or the drain electrode is provided above the capacitor wiring and a storage capacitor is formed from the electrode and the capacitor wiring by using the gate insulating layer 102 therebetween as a dielectric, thereby electrically connecting the electrode and the pixel electrode.

Furthermore, in the sixth photolithography step, the first terminal and the second terminal are covered with the resist mask so that transparent conductive films 128 and 129 are left in the terminal portion. The transparent conductive films 128 and 129 function as electrodes or wirings connected to an FPC. The transparent conductive film 128 formed over the connection electrode 120 which is directly connected to the first terminal 121 is a connection terminal electrode which functions as an input terminal of the gate wiring. The transparent conductive film 129 formed over the second terminal 122 is a connection terminal electrode which functions as an input terminal of the source wiring.

Figure 10C:
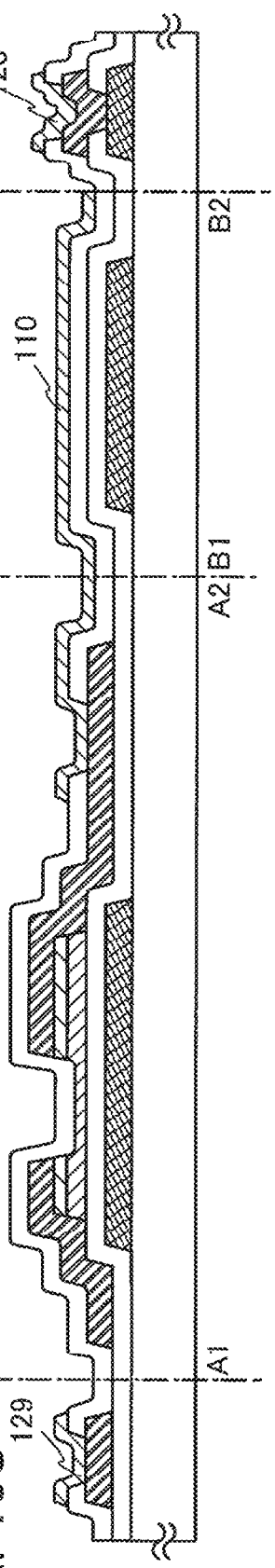
Figure 14:
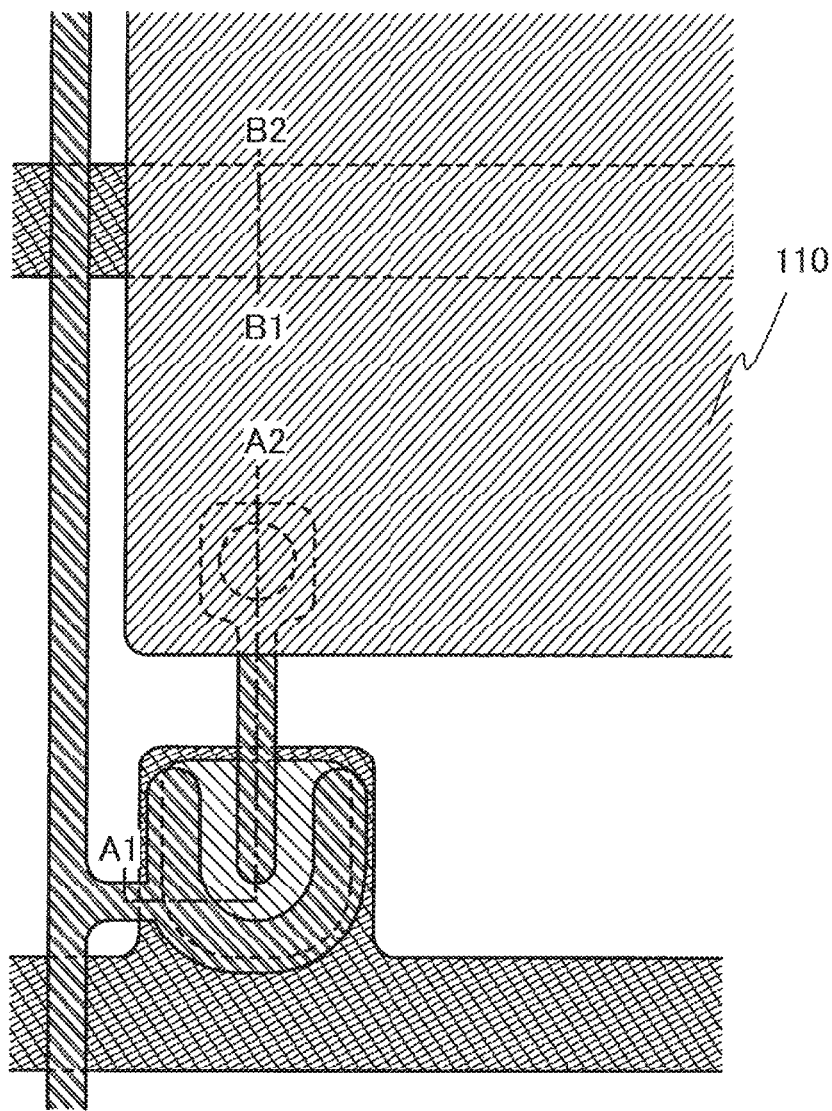
FIG. 14 is a view illustrating the semiconductor device of Embodiment 4.

Then, the resist mask is removed. A cross-sectional view at this stage is illustrated in FIG. 10C. Note that FIG. 14 is a top view at this stage.

Figure 15A:
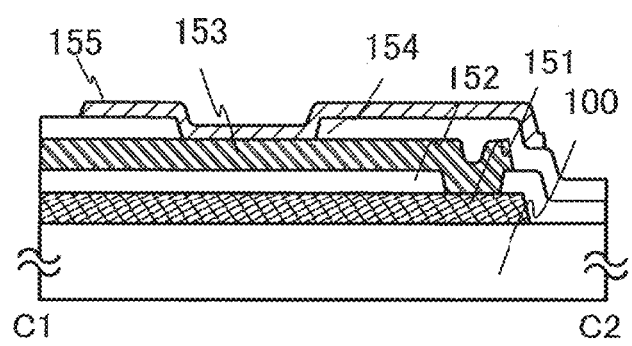
FIGS. 15A, 15B, 15C, and 15D are views illustrating semiconductor devices of Embodiment 4.
Figure 15B:
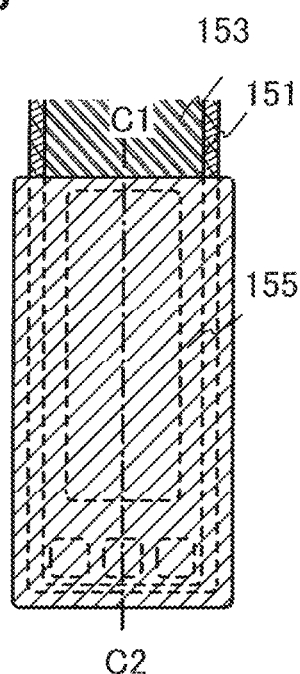

FIGS. 15A and 15B respectively illustrate a cross-sectional view and a top view of a gate wiring terminal portion at this stage. FIG. 15A is a cross-sectional view taken along line C1-C2 of FIG. 15B. In FIG. 15A, a transparent conductive film 155 formed over a protective insulating film 154 is a connection terminal electrode functioning as an input terminal. Further, in the terminal portion of FIG. 15A, a first terminal 151 made of the same material as the gate wiring and a connection electrode 153 made of the same material as the source wiring overlap with each other with a gate insulating layer 152 therebetween, and are in direct contact with each other so as to be electrically connected. In addition, the connection electrode 153 and the transparent conductive film 155 are in direct contact with each other through a contact hole provided in the protective insulating film 154 so as to be electrically connected.

Figure 15C:
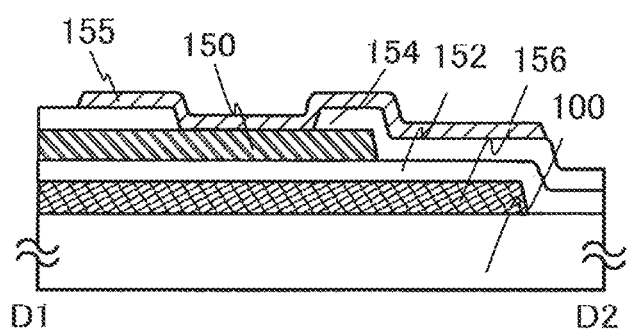
Figure 15D:
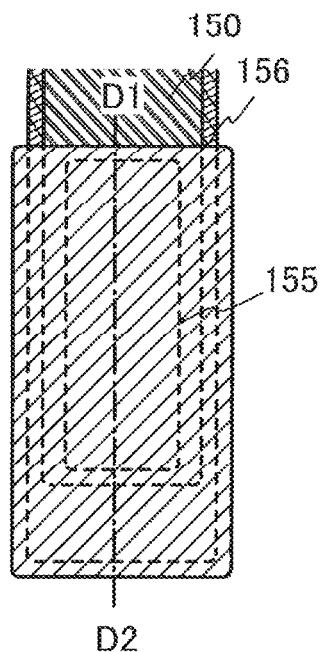

FIGS. 15C and 15D respectively illustrate a cross-sectional view and a top view of a source wiring terminal portion. FIG. 15C is a cross-sectional view taken along line D1-D2 of FIG. 15D. In FIG. 15C, the transparent conductive film 155 formed over the protective insulating film 154 is a connection terminal electrode functioning as an input terminal. Further, in the terminal portion of FIG. 15C, an electrode 156 made of the same material as the gate wiring is formed below a second terminal 150 which is electrically connected to the source wiring and overlaps with the second terminal 150 with the gate insulating layer 152 interposed therebetween. The electrode 156 is not electrically connected to the second terminal 150, and a capacitor to prevent noise or static electricity can be formed if the potential of the electrode 156 is set to a potential different from that of the second terminal 150, such as floating, GND, or 0 V. The second terminal 150 is electrically connected to the transparent conductive film 155 with the protective insulating film 154 therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. The number of each of the terminals may be any number, and the number of the terminals may be determined by a practitioner as appropriate.

Through these six photolithography steps, the second thin film transistor 170 which is a bottom-gate n-channel thin film transistor and the storage capacitor can be completed using the six photomasks. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

When electrical connection to the gate wiring by using the same material as the pixel electrode is conducted, the third photolithography step can be omitted. Therefore, through the five photolithography steps, the second thin film transistor which is a bottom-gate n-channel thin film transistor and the storage capacitor can be completed using the five photomasks.

Further, when a material of the second gate electrode is different from a material of the pixel electrode as illustrated in FIG. 1C, one photolithography step is added, so that one photomask is added.

In the case of manufacturing an active matrix liquid crystal display device, an active matrix substrate and a counter substrate provided with a counter electrode are bonded to each other with a liquid crystal layer interposed therebetween. Note that a common electrode electrically connected to the counter electrode on the counter substrate is provided over the active matrix substrate, and a fourth terminal electrically connected to the common electrode is provided in the terminal portion. The fourth terminal is provided so that the common electrode is set to a fixed potential such as GND or 0 V.

Figure 16:
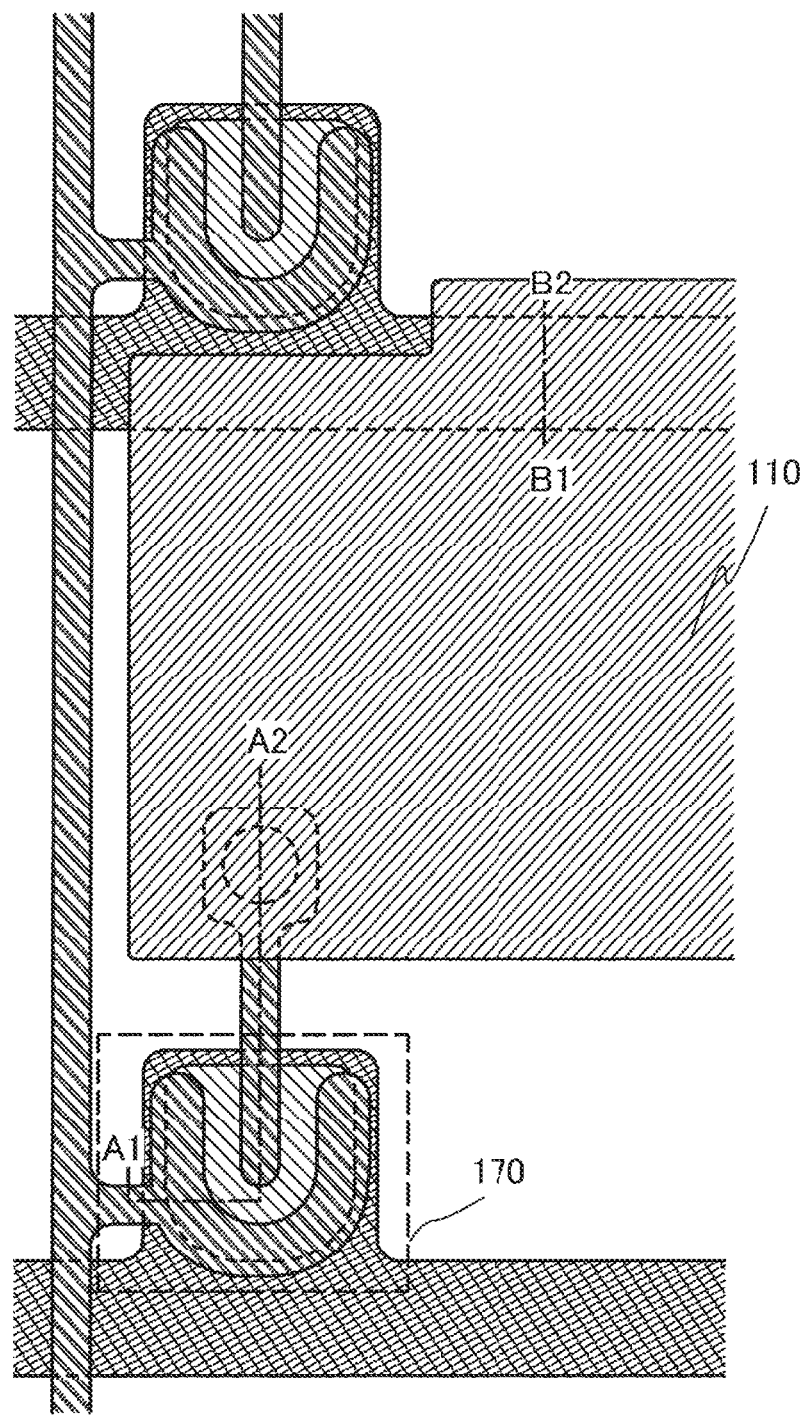
FIG. 16 is a view illustrating the semiconductor device of Embodiment 4.

Further, the pixel structure is not limited to that of FIG. 14, and an example of a top view which is different from FIG. 14 is illustrated in FIG. 16. FIG. 16 illustrates an example in which a capacitor wiring is not provided but a pixel electrode overlaps with a gate wiring of an adjacent pixel, with a protective insulating film and a gate insulating layer therebetween to form a storage capacitor. In that case, the capacitor wiring and the third terminal connected to the capacitor wiring can be omitted. Note that in FIG. 16, the same parts as those in FIG. 14 are denoted by the same reference numerals.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Alternatively, a driving method called double-frame rate driving may be employed in which the vertical cycle is 1.5 or 2 times as long as usual to improve the moving-image characteristics.

Further alternatively, in order to improve the moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

The n-channel transistor obtained in this embodiment uses an In—Ga—Zn—O-based non-single-crystal film for its channel formation region and has favorable dynamic characteristics. Accordingly, these driving methods can be applied in combination with the n-channel transistor of this embodiment.

In manufacturing a light-emitting display device, one electrode (also referred to as a cathode) of an organic light-emitting element is set to a low power supply potential such as GND or 0 V; thus, a terminal portion is provided with a fourth terminal for setting the cathode to a low power supply potential such as GND or 0 V. Also in manufacturing a light-emitting display device, a power supply line is provided in addition to a source wiring and a gate wiring. Accordingly, the terminal portion is provided with a fifth terminal electrically connected to the power supply line.

With use of the thin film transistor using the oxide semiconductor in a gate line driver circuit or a source line driver circuit, manufacturing cost is reduced. Then, by directly connecting a gate electrode of the thin film transistor used in the driver circuit with a source wiring or a drain wiring, the number of contact holes can be reduced, so that a display device in which an area occupied by the driver circuit is reduced can be provided.

Accordingly, by applying this embodiment, a display device with excellent electric characteristics can be provided at lower cost.

This embodiment can be freely combined with any of Embodiment 1, Embodiment 2, and Embodiment 3.

Embodiment 5

In Embodiment 5, an example of electronic paper as a semiconductor device will be described.

Figure 17:
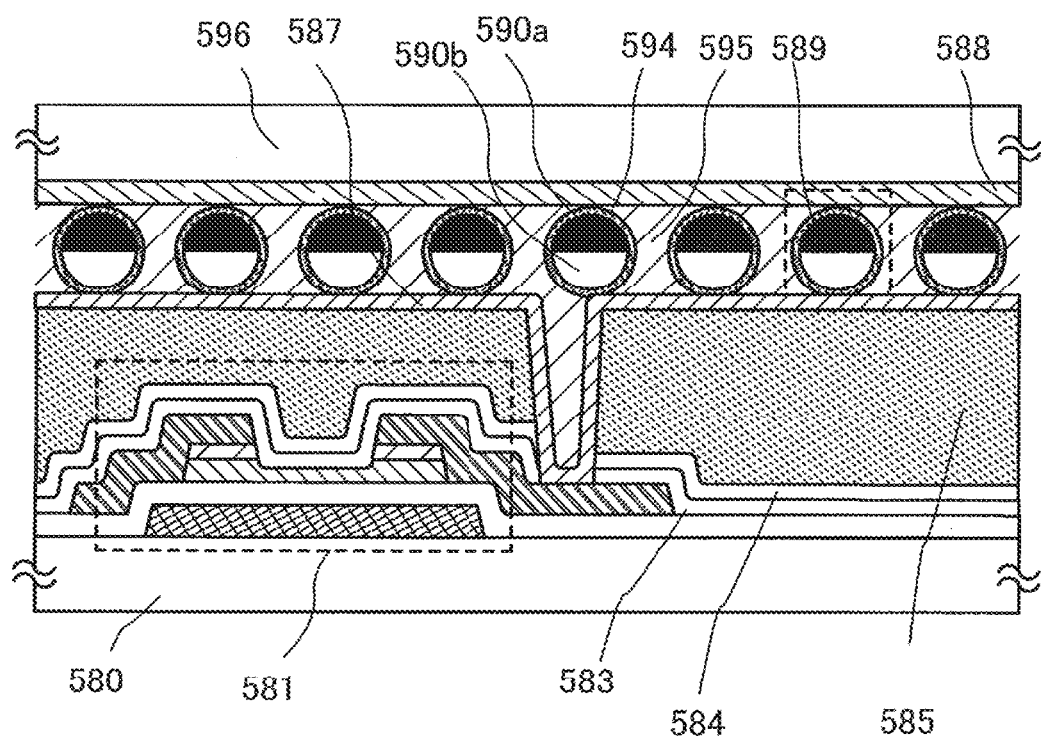
FIG. 17 is a cross-sectional view illustrating a semiconductor device of Embodiment 5.

FIG. 17 illustrates active matrix electronic paper as an example, which is different from a liquid crystal display device. A thin film transistor 581 used in a pixel portion of the semiconductor device can be formed in a manner similar to the thin film transistor of the pixel portion described in Embodiment 4 and is a thin film transistor including an In—Ga—Zn—O-based non-single-crystal film as a semiconductor layer. In addition, as described in Embodiment 1, the pixel portion and a driver circuit can be formed over the same substrate, and thereby electronic paper with low manufacturing cost can be realized.

The electronic paper in FIG. 17 is an example of a display device using a twisting ball display system. The twisting ball display system refers to a method in which spherical particles each colored in black or white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor with a bottom gate structure provided, and a source or drain electrode layer thereof is in contact with a first electrode layer 587 in an opening formed in insulating layers 583, 584, 585, whereby the thin film transistor 581 is electrically connected to the first electrode layer 587. Between the first electrode layer 587 and a second electrode layer 588, spherical particles 589 each having a black region 590a, a white region 590b, and a cavity 594 filled with liquid, around the regions, are provided between a pair of substrates 580 and 596. A space around the spherical particles 589 is filled with a filler 595 such as a resin (see FIG. 17).

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, electronic paper, which can be manufactured at lower cost, as a semiconductor device can be manufactured.

This embodiment can be combined with any content of Embodiment 1 or Embodiment 2 as appropriate.

Embodiment 6

In Embodiment 6, an example of a light-emitting display device as a semiconductor device will be described. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 18:
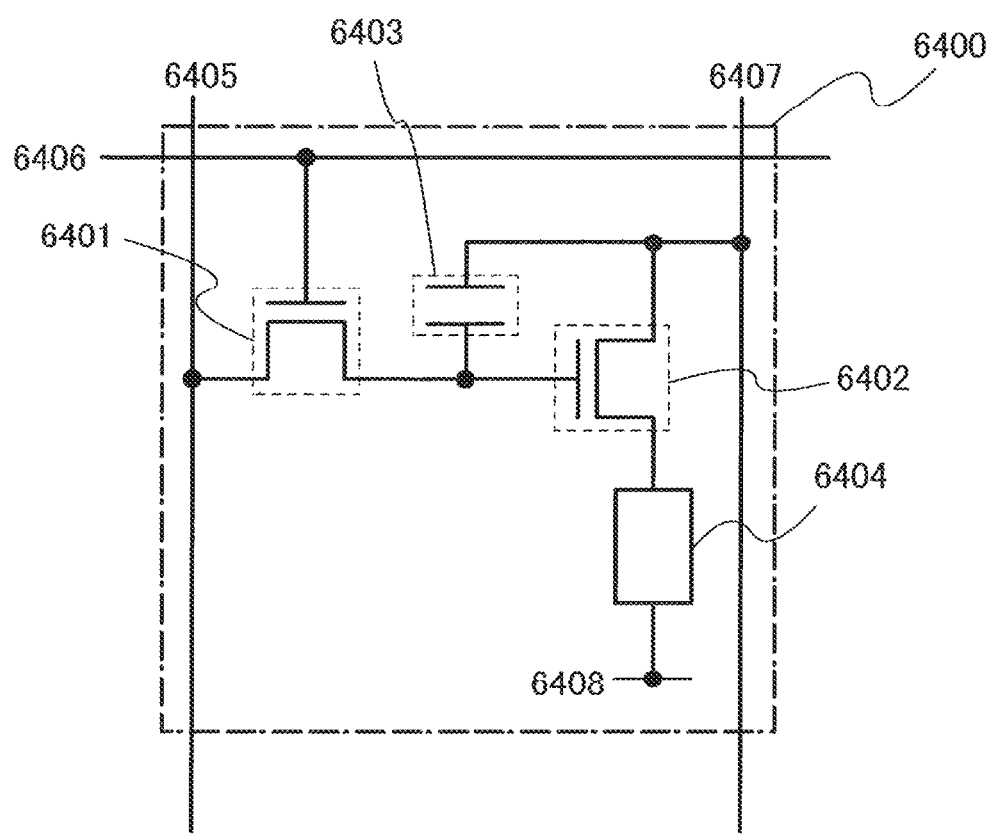
FIG. 18 is a diagram illustrating a pixel equivalent circuit of a semiconductor device of Embodiment 6.

FIG. 18 illustrates an example of a pixel structure to which digital time grayscale driving can be applied, as an example of a semiconductor device.

A structure and operation of a pixel to which digital time grayscale driving can be applied are described. In this embodiment, one pixel includes two n-channel transistors each of which includes an oxide semiconductor layer (an In—Ga—Zn—O-based non-single-crystal film) as its channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to (voltage of the power supply line+ Vth of the driver transistor 6402) is applied to the signal line 6405.

In a case of performing analog grayscale driving instead of digital time grayscale driving, the same pixel structure as that in FIG. 18 can be used by changing signal input.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 18 is not limited thereto. For example, a switch, a resistor, a capacitor, a transistor, a logic circuit, or the like may be added to the pixel illustrated in FIG. 18.

Next, structures of the light-emitting element will be described with reference to FIGS. 19A to 19C. A cross-sectional structure of a pixel will be described by taking a case where the driving TFT is the thin film transistor 170 illustrated in FIG. 1B as an example. Driving TFTs 7001, 7011, and 7021 used for semiconductor devices illustrated in FIGS. 19A to 19C can be formed in a manner similar to the thin film transistor 170 described in Embodiment 1 and are thin film transistors which include In—Ga—Zn—O-based non-single-crystal films as their semiconductor layers and which have excellent electric characteristics.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure illustrated in FIG. 18 can be applied to a light-emitting element having any of these emission structures.

A light-emitting element having a top emission structure will be described with reference to FIG. 19A.

Figure 19A:
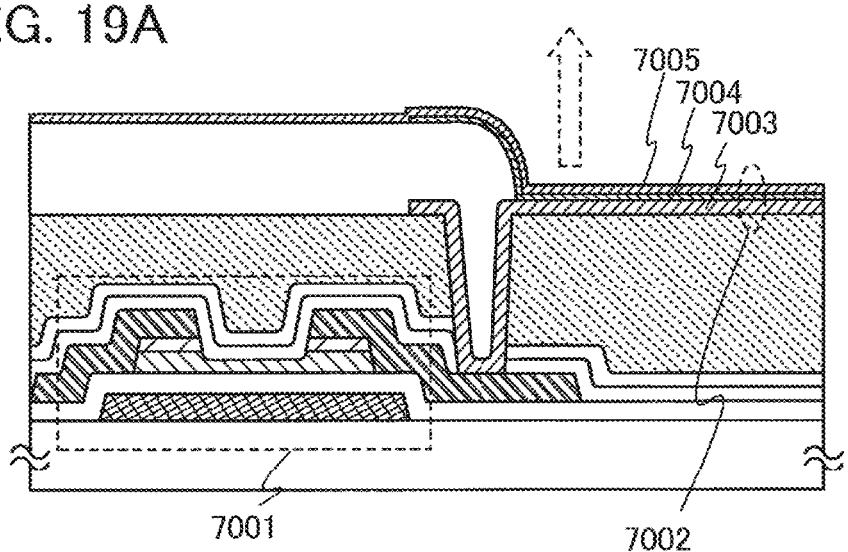
FIGS. 19A to 19C are cross-sectional views illustrating semiconductor devices of Embodiment 6.

FIG. 19A is a cross-sectional view of a pixel in the case where the driving TFT 7001 is the thin film transistor 170 illustrated in FIG. 1B and light is emitted from a light-emitting element 7002 to an anode 7005 side. In FIG. 19A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is preferably used. The light-emitting layer 7004 may be formed using a single layer or a plurality of layers stacked. When the light-emitting layer 7004 is formed using a plurality of layers, the light-emitting layer 7004 is formed by stacking an electron-injecting layer, an electron-transporting layer, a light-emitting layer, a hole-transporting layer, and a hole-injecting layer in this order over the cathode 7003. It is not necessary to form all of these layers. The anode 7005 is formed using a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 19A, light is emitted from the light-emitting element 7002 to the anode 7005 side as indicated by an arrow.

A second gate electrode provided over the oxide semiconductor layer in the driver circuit is preferably formed from the same material as the cathode 7003, which leads to simplification of the process.

Next, a light-emitting element having a bottom emission structure will be described with reference to FIG. 19B. FIG. 19B is a cross-sectional view of a pixel in the case where the driving TFT 7011 is the thin film transistor 170 illustrated in FIG. 1A and light is emitted from a light-emitting element 7012 to a cathode 7013 side. In FIG. 19B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, a variety of materials can be used as in the case of FIG. 19A as long as they are conductive materials having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 19A, the light-emitting layer 7014 may be formed using either a single layer or a plurality of layers stacked. The anode 7015 is not required to transmit light, but can be formed using a light-transmitting conductive material as in the case of FIG. 19A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 19B, light is emitted from the light-emitting element 7012 to the cathode 7013 side as indicated by an arrow.

A second gate electrode provided over the oxide semiconductor layer in the driver circuit is preferably formed from the same material as the cathode 7013, which leads to simplification of the process.

Next, a light-emitting element having a dual emission structure will be described with reference to FIG. 19C. In FIG. 19C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 19A, the cathode 7023 can be formed using a variety of conductive materials as long as they have a low work function. The cathode 7023 is formed to have a thickness that can transmit light. For example, a film of Al having a thickness of 20 nm can be used as the cathode 7023. As in FIG. 19A, the light-emitting layer 7024 may be formed using either a single layer or a plurality of layers stacked. The anode 7025 can be formed using a light-transmitting conductive material as in the case of FIG. 19A.

The light-emitting element 7022 corresponds to a region where the cathode 7023, the light-emitting layer 7024, and the anode 7025 overlap with one another. In the case of the pixel illustrated in FIG. 19C, light is emitted from the light-emitting element 7022 to both the anode 7025 side and the cathode 7023 side as indicated by arrows.

A second gate electrode provided over the oxide semiconductor layer in the driver circuit is preferably formed from the same material as the conductive film 7027, which leads to simplification of the process. Further, the second gate electrode provided over the oxide semiconductor layer in the driver circuit is preferably formed with a stack of the same materials as the conductive film 7027 and the cathode 7023, thereby lowering wiring resistance as well as simplification of the process.

Note that, although the organic EL elements are described here as the light-emitting elements, an inorganic EL element can also be provided as a light-emitting element.

In this embodiment, the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 19B:
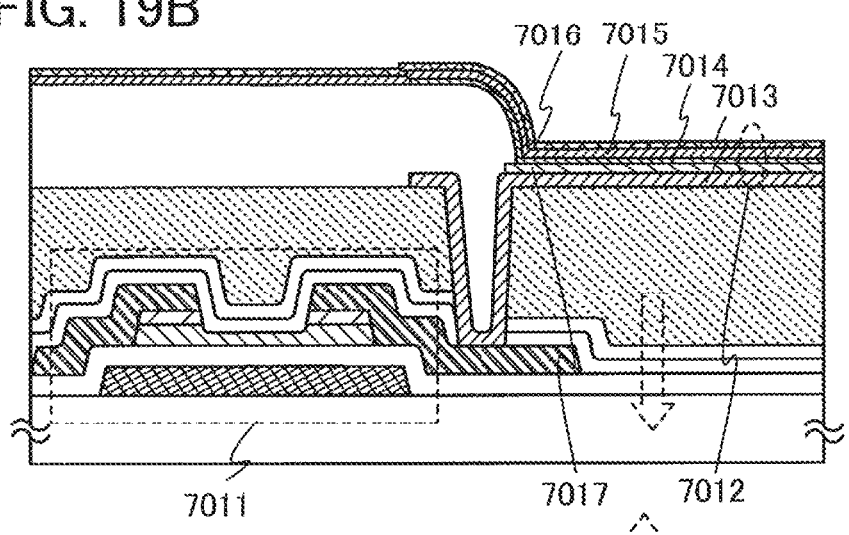
Figure 19C:
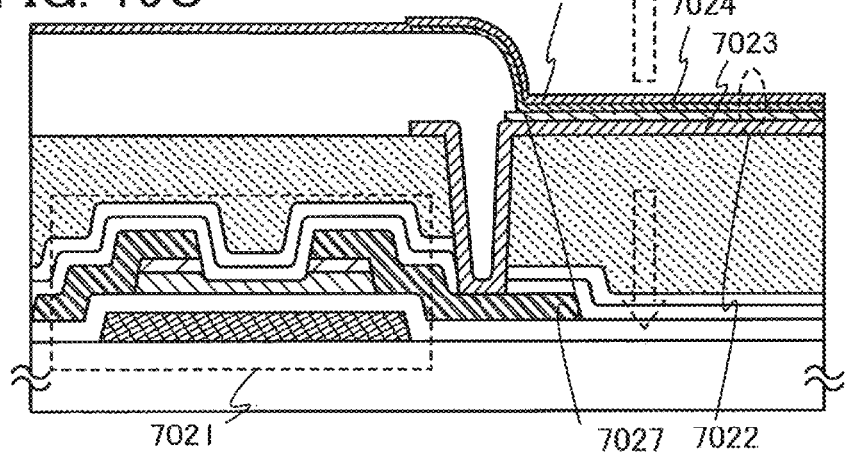

A semiconductor device described in this embodiment is not limited to the structures illustrated in FIGS. 19A to 19C and can be modified in various ways based on the spirit of techniques disclosed.

Figure 20A:
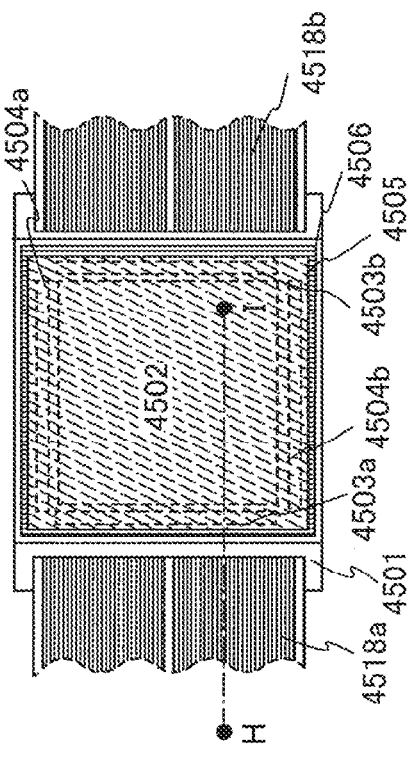
FIGS. 20A and 20B are a top view and a cross-sectional view illustrating a semiconductor device of Embodiment 6, respectively.
Figure 20B:
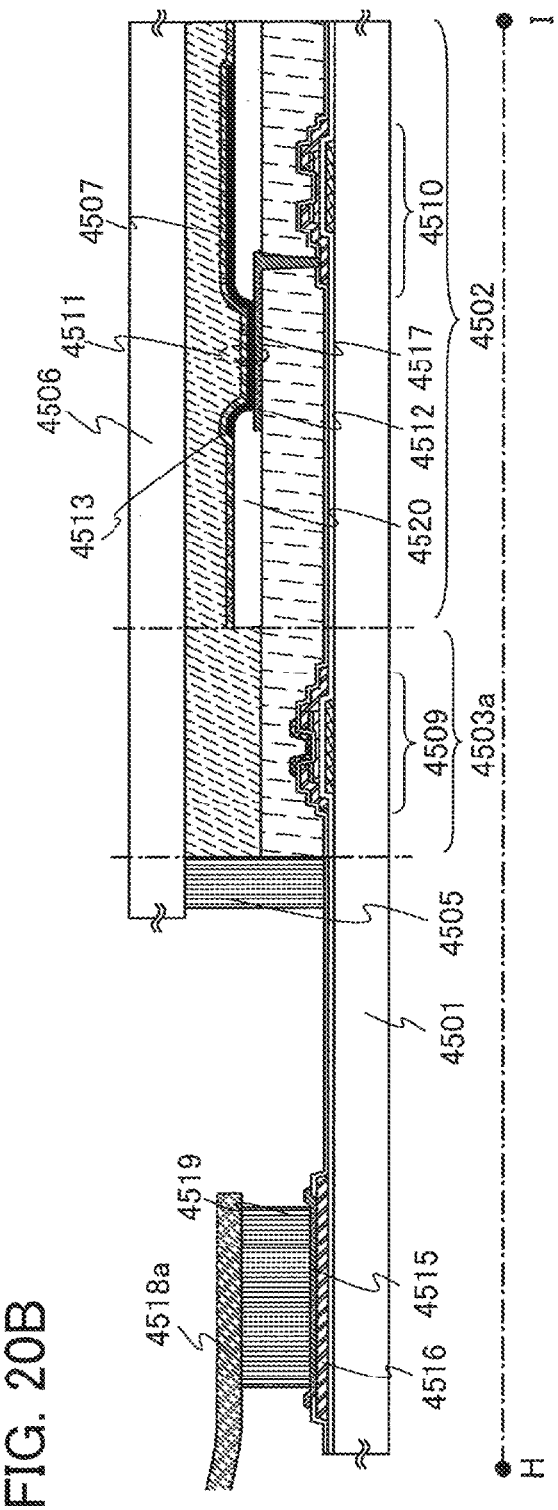

Next, a top view and a cross section of a light-emitting display panel (also referred to as a light-emitting panel), which is one embodiment of a semiconductor device, will be described with reference to FIGS. 20A and 20B. FIG. 20A is the top view of a panel in which a thin film transistor and a light-emitting element formed over a first substrate are sealed between the first substrate and a second substrate with a sealant. FIG. 20B is a cross-sectional view taken along a line H-I of FIG. 20A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503*a* and 4503*b*, and the scan line driver circuits 4504*a* and 4504*b* formed over the first substrate 4501 each include a plurality of thin film transistors. In FIG. 20B, a thin film transistor 4510 included in the pixel portion 4502 and a thin film transistor 4509 included in the signal line driver circuit 4503*a* are illustrated as an example.

For each of the thin film transistors 4509 and 4510, a highly reliable thin film transistor including an In—Ga—Zn—O-based non-single-crystal film as its semiconductor layer as described in Embodiment 1 can be applied. In addition, the thin film transistor 4509 includes gate electrodes above and below the semiconductor layer as described in Embodiment 1 with reference to FIG. 1B.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that a structure of the light-emitting element 4511 is a stacked-layer structure of the first electrode layer 4517, the electroluminescent layer 4512, and the second electrode layer 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

In this embodiment, a connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518*a* via an anisotropic conductive film 4519.

The second substrate 4506 located in the direction in which light is extracted from the light-emitting element 4511 should have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scan line driver circuits 4504a and 4504b may be provided by mounting driver circuits formed using a single crystal semiconductor film or polycrystalline semiconductor film over a single-crystal substrate or an insulating substrate separately prepared. In addition, only the signal line driver circuits or part thereof, or the scan line driver circuits or part thereof may be separately formed and mounted. This embodiment is not limited to the structure illustrated in FIGS. 20A and 20B.

Through this process, a display device (display panel) can be manufactured at lower manufacturing cost.

This embodiment can be combined with any content of Embodiment 1 or Embodiment 2 as appropriate.

Embodiment 7

Figure 21A:
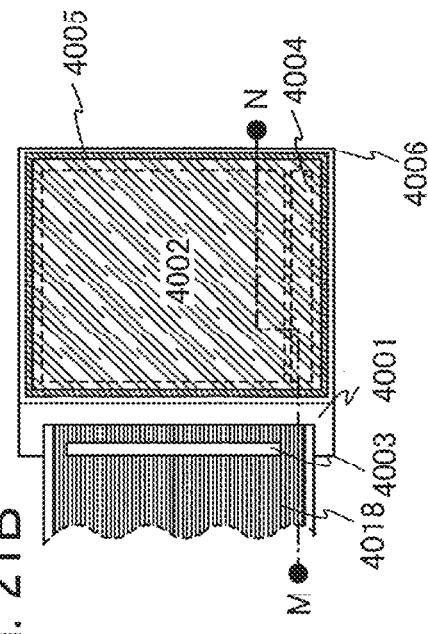
FIGS. 21A and 21B are top views and FIG. 21C is a cross-sectional view illustrating a semiconductor device of Embodiment 7.
Figure 21B:
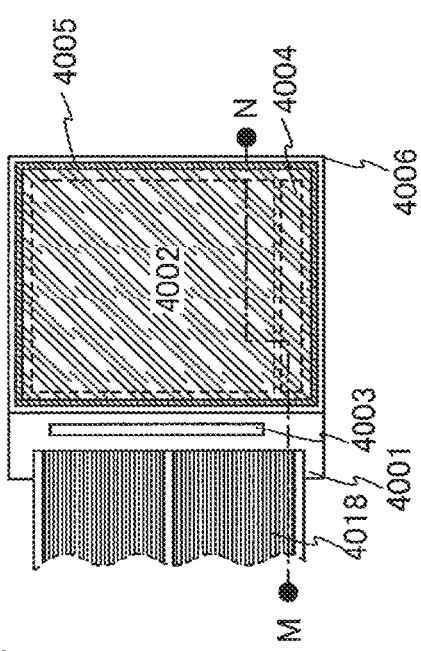
Figure 21C:
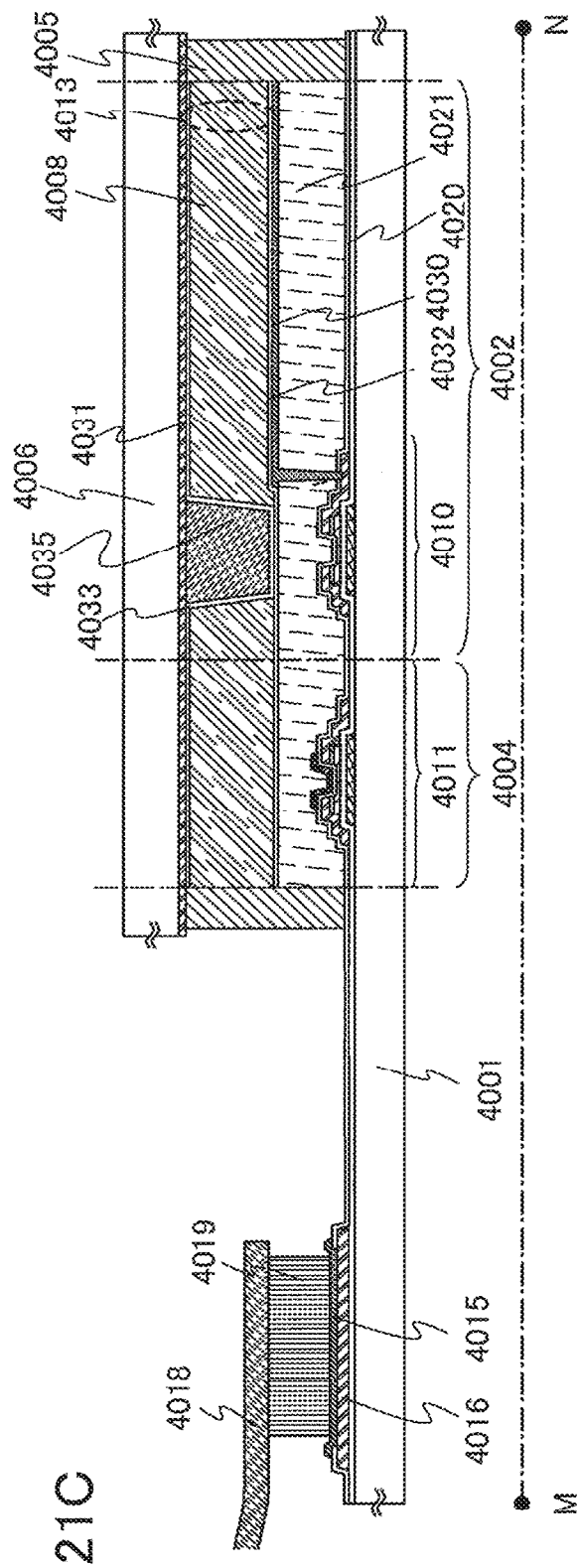

In this embodiment, a top view and a cross section of a liquid crystal display panel, which is one embodiment of a semiconductor device, will be described with reference to FIGS. 21A, 21B and 21C. FIGS. 21A and 21B are top views of a panel in which highly reliable thin film transistors 4010 and 4011 each including the In—Ga—Zn—O-based non-single-crystal film as its semiconductor layer as described in Embodiment 1 and a liquid crystal element 4013, which are formed over a first substrate 4001 are sealed between the first substrate 4001 and a second substrate 4006 with a sealant 4005. FIG. 21C is a cross-sectional view taken along a line M-N of FIGS. 21A and 21B.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 21A illustrates an example of mounting the signal line driver circuit 4003 by a COG method, and FIG. 21B illustrates an example of mounting the signal line driver circuit 4003 by a TAB method.

The pixel portion 4002 and the scan line driver circuit 4004 provided over the first substrate 4001 include a plurality of thin film transistors. FIG. 21C illustrates the thin film transistor 4010 included in the pixel portion 4002 and the thin film transistor 4011 included in the scan line driver circuit 4004. Over the thin film transistors 4010 and 4011, insulating layers 4020 and 4021 are provided.

Each of the thin film transistors 4010 and 4011 can be the thin film transistor including an In—Ga—Zn—O-based non-single-crystal film as its semiconductor layer described in Embodiment 1. The thin film transistor 4011 corresponds to the thin film transistor having a back gate electrode described in Embodiment 2 with reference to FIG. 2A.

A pixel electrode layer 4030 included in the liquid crystal element 4013 is electrically connected to the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that the first substrate 4001 and the second substrate 4006 can be formed of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

Reference numeral 4035 denotes a columnar spacer obtained by selectively etching an insulating film and is provided to control the distance between the pixel electrode layer 4030 and the counter electrode layer 4031 (a cell gap). Further, a spherical spacer may also be used. In addition, the counter electrode layer 4031 is electrically connected to a common potential line formed over the same substrate as the thin film transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes liquid crystal exhibiting a blue phase and a chiral agent have such characteristics that the response time is 10 μs to 100 μs, which is short, the alignment process is unnecessary because the liquid crystal composition has optical isotropy, and viewing angle dependency is small.

Although the example of a transmissive liquid crystal display device is described in this embodiment, one embodiment of the present invention can also be applied to a reflective liquid crystal display device and a transflective liquid crystal display device.

While an example of the liquid crystal display device in which the polarizing plate is provided on the outer side of the substrate (on the viewer side) and the coloring layer and the electrode layer used for a display element are provided on the inner side of the substrate in that order is described in this embodiment, the polarizing plate may be provided on the inner side of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided.

In this embodiment, in order to reduce surface unevenness of the thin film transistor and to improve reliability of the thin film transistor, the thin film transistor obtained in Embodiment 1 is covered with the insulating layers (the insulating layer 4020 and the insulating layer 4021) functioning as a protective film or a planarizing insulating film. Note that the protective film is provided to prevent entry of contaminant impurities such as organic substance, metal, or moisture existing in air and is preferably a dense film. The protective film may be formed with a single layer or a stacked layer of a silicon oxide film, a silicon nitride film, a silicon oxynitride film, a silicon nitride oxide film, an aluminum oxide film, an aluminum nitride film, aluminum oxynitride film, and/or an aluminum nitride oxide film by a sputtering method. Although an example in which the protective film is formed by a sputtering method is described in this embodiment, there is no particular limitation and the protective film may be formed by a variety of methods such as PCVD. In part of the driver circuit, the protective film serves as a second gate insulating layer, and a thin film transistor having a back gate over the second gate insulating layer is provided.

In this embodiment, the insulating layer 4020 having a stacked-layer structure is formed as a protective film. Here, as a first layer of the insulating layer 4020, a silicon oxide film is formed by a sputtering method. The use of a silicon oxide film as a protective film has an effect of preventing hillock of an aluminum film.

As a second layer of the protective film, an insulating layer is formed. In this embodiment, as the second layer of the insulating layer 4020, a silicon nitride film is formed by a sputtering method. The use of the silicon nitride film as the protective film can prevent mobile ions of sodium or the like from entering a semiconductor region and changing electrical characteristics of the TFT.

After the protective film is formed, the semiconductor layer may be subjected to annealing (300° C. to 400° C.). In addition, the back gate is formed after the protective film is formed.

The insulating layer 4021 is formed as the planarizing insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

Note that a siloxane-based resin is a resin formed from a siloxane material as a starting material and having the bond of Si—O—Si. The siloxane-based resin may include as a substituent an organic group (e.g., an alkyl group or an aryl group) or a fluoro group. In addition, the organic group may include a fluoro group.

A formation method of the insulating layer 4021 is not particularly limited, and the following method can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. In a case of forming the insulating layer 4021 using a material solution, annealing (300° C. to 400° C.) of the semiconductor layer may be performed at the same time as a baking step. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, indium tin oxide to which silicon oxide is added, or the like.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed from the same conductive film as that of the pixel electrode layer 4030 included in the liquid crystal element 4013, and a terminal electrode 4016 is formed from the same conductive film as that of the source and drain electrode layers of the thin film transistors 4010 and 4011.

The connection terminal electrode 4015 is electrically connected to a terminal included in the FPC 4018 via an anisotropic conductive film 4019.

FIGS. 21A and 21B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 22:
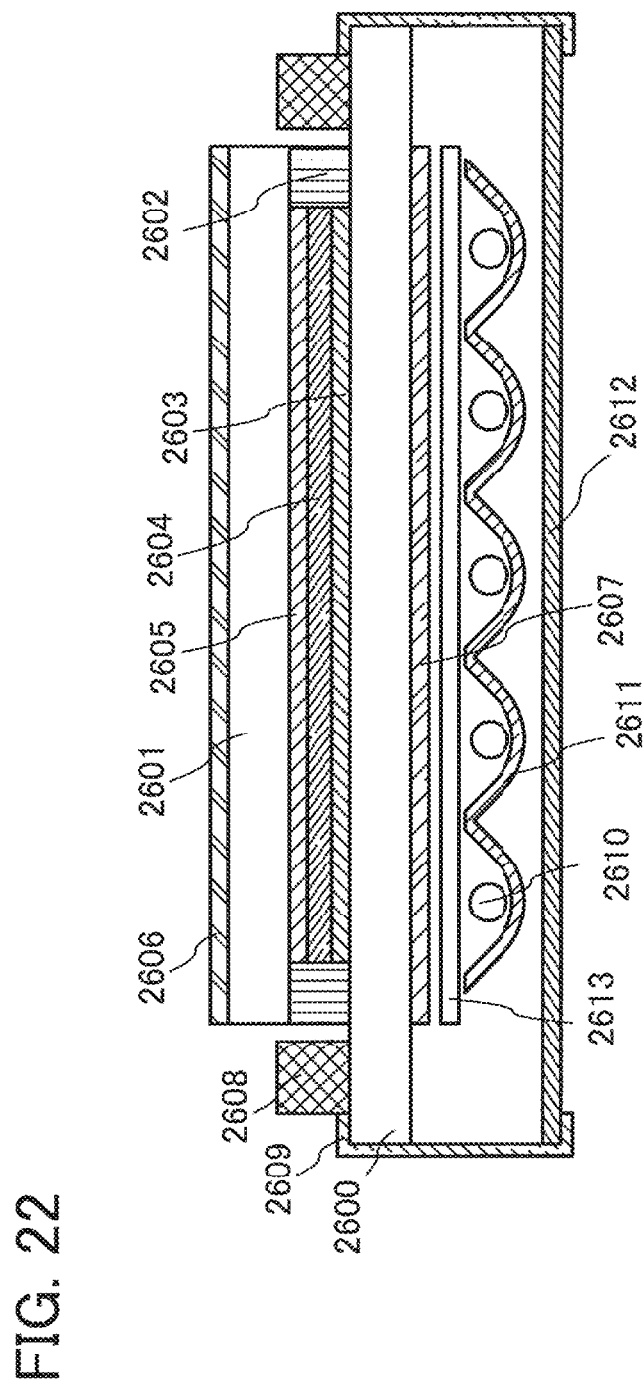
FIG. 22 is a cross-sectional view illustrating a semiconductor device of Embodiment 7.

FIG. 22 illustrates an example in which a liquid crystal display module is formed as a semiconductor device by using a TFT substrate 2600.

FIG. 22 illustrates an example of a liquid crystal display module, in which the TFT substrate 2600 and a counter substrate 2601 are fixed to each other with a sealant 2602, and a pixel portion 2603 including a TFT or the like, a display element 2604 including a liquid crystal layer, and a coloring layer 2605 are provided between the substrates to form a display region. The coloring layer 2605 is necessary to perform color display. In the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611, and a circuit substrate 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Through this process, a liquid crystal display device as a semiconductor device can be manufactured at lower manufacturing cost.

This embodiment can be combined with any content of Embodiment 1, 2 or 3 as appropriate.

Embodiment 8

A semiconductor device according to one embodiment of the present invention can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 23A:
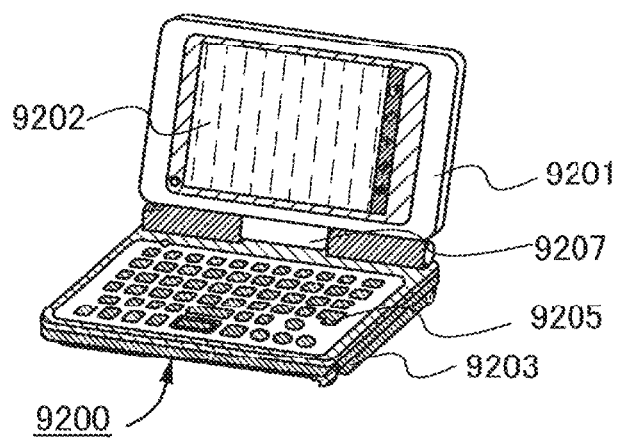
FIGS. 23A to 23D are external views illustrating examples of electronic devices.

FIG. 23A illustrates an example of a portable information terminal device 9200. The portable information terminal device 9200 incorporates a computer and thus can process various types of data. An example of the portable information terminal device 9200 is a personal digital assistant.

The portable information terminal device 9200 has two housings, a housing 9201 and a housing 9203. The housing 9201 and the housing 9203 are joined with a joining portion 9207 such that the portable information terminal device 9200 can be foldable. A display portion 9202 is incorporated in the housing 9201, and the housing 9203 includes a keyboard 9205. Needless to say, the structure of the portable information terminal device 9200 is not limited to the above structure, and the structure may include at least a thin film transistor having a back gate electrode, and additional accessory may be provided as appropriate. A driver circuit and a pixel portion are formed over the same substrate, which leads to reduction of the manufacturing cost. Thus, a portable information terminal device having a thin film transistor having high electric characteristics can be realized.

Figure 23B:
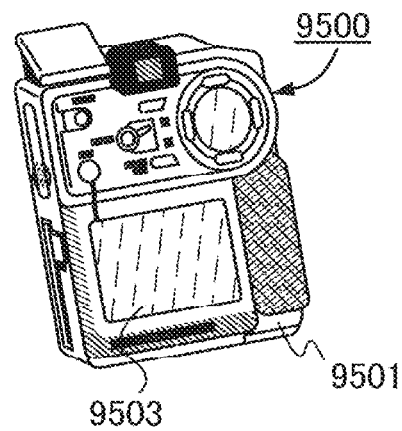

FIG. 23B illustrates an example of a digital video camera 9500. The digital video camera 9500 includes a display portion 9503 incorporated in a housing 9501 and various operation portions. Needless to say, the structure of the digital video camera 9500 is not limited to the above structure, and the structure may include at least a thin film transistor having a back gate electrode, and additional accessory may be provided as appropriate. A driver circuit and a pixel portion are formed over the same substrate, which leads to reduction of the manufacturing cost. Thus, a digital video camera having a thin film transistor having high electric characteristics can be realized.

Figure 23C:
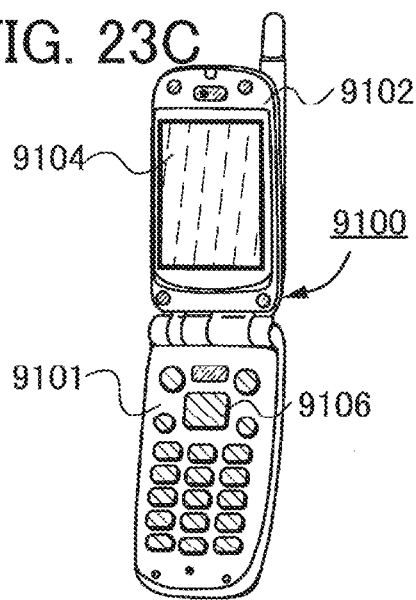

FIG. 23C illustrates an example of a mobile phone 9100. The mobile phone 9100 has two housings, a housing 9102 and a housing 9101. The housing 9102 and the housing 9101 are joined with a joining portion such that the mobile phone is foldable. A display portion 9104 is incorporated in the housing 9102, and the housing 9101 includes operation keys 9106. Needless to say, the structure of the mobile phone 9100 is not limited to the above structure, and the structure may include at least a thin film transistor having a back gate electrode, and additional accessory may be provided as appropriate. A driver circuit and a pixel portion are formed over the same substrate, which leads to reduction of the manufacturing cost. Thus, a mobile phone having a thin film transistor having high electric characteristics can be realized.

Figure 23D:
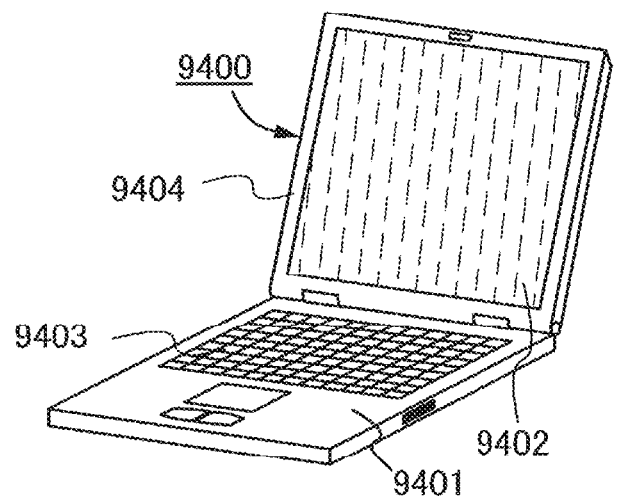

FIG. 23D illustrates an example of a portable computer 9400. The computer 9400 has two housings, a housing 9401 and a housing 9404. The housing 9401 and the housing 9404 are joined such that the computer can be open and closed. A display portion 9402 is incorporated in the housing 9401, and the housing 9404 includes a key board 9403 or the like. Needless to say, the structure of the computer 9400 is not particularly limited to the above structure, and the structure may include at least a thin film transistor having a back gate electrode, and additional accessory may be provided as appropriate. A driver circuit and a pixel portion are formed over the same substrate, which leads to reduction of the manufacturing cost. Thus, a computer having a thin film transistor having high electric characteristics can be realized.

Figure 24A:
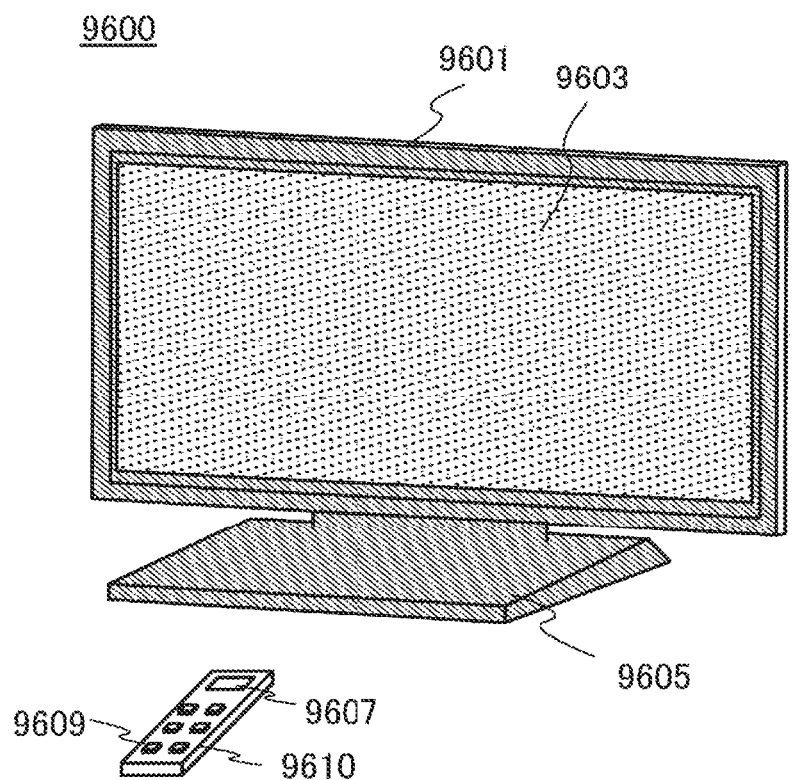
FIGS. 24A and 24B are external views illustrating examples of a television device and a digital photo frame, respectively.

FIG. 24A illustrates an example of a television set 9600. In the television set 9600, a display portion 9603 is incorporated in a housing 9601. The display portion 9603 can display images. Further, the housing 9601 is supported by a stand 9605 in FIG. 24A.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

Figure 24B:
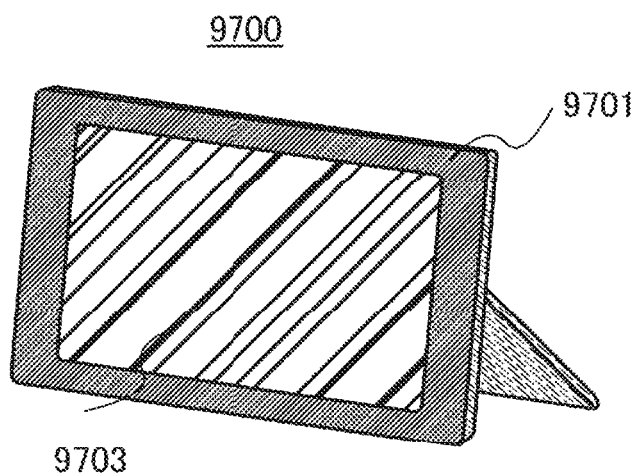

FIG. 24B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 25A:
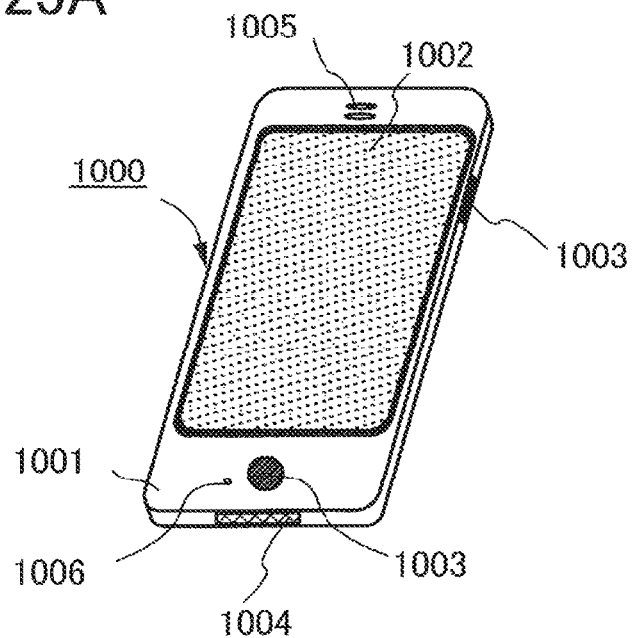
FIGS. 25A and 25B are external views illustrating examples of mobile phones.

FIG. 25A illustrates an example of a mobile phone 1000 which is different from that illustrated in FIG. 23C. The mobile phone 1000 includes a display portion 1002 incorporated in a housing 1001, an operation button 1003, an external connection port 1004, a speaker 1005, a microphone 1006 and the like.

In the mobile phone 1000 illustrated in FIG. 25A, data can be input when a person touches the display portion 1002 with his/her finger or the like. In addition, operations such as phone call or mailing can be conducted when a person touches the display portion 1002 with his/her finger or the like.

There are mainly three screen modes of the display portion 1002: the first mode is a display mode mainly for displaying an image; the second mode is an input mode mainly for inputting data such as text; and the third mode is a display-and-input mode in which two modes of the display mode and the input mode are combined.

For example, in a case of calling or mailing, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone 1000, display in the screen of the display portion 1002 can be automatically switched by determining the installation direction of the mobile phone 1000 (whether the mobile phone 1000 is placed horizontally or vertically for a landscape mode or a portrait mode).

The screen modes are switched by touching the display portion 1002 or operating the operation button 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 25B:
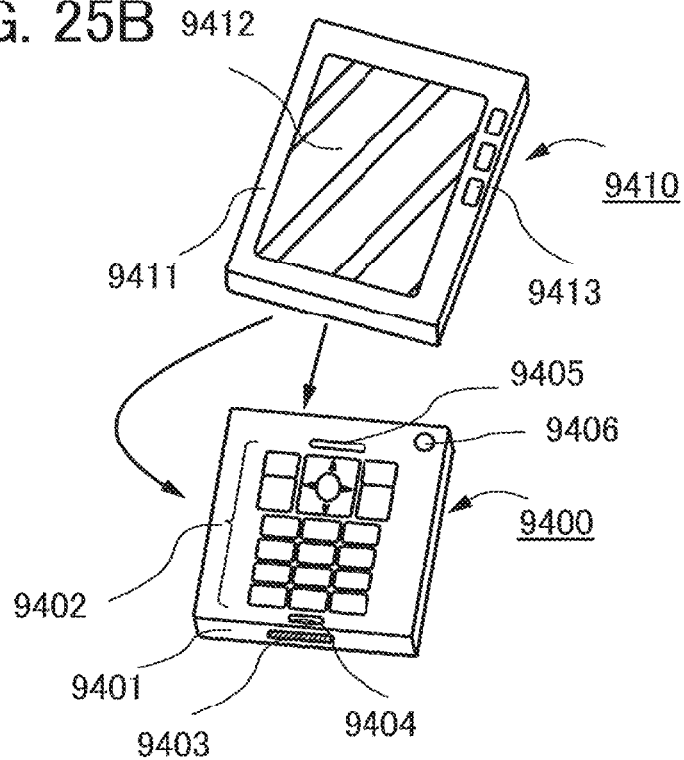

FIG. 25B illustrates another example of a mobile phone. The mobile phone in FIG. 25B has a display device 9410 in a housing 9411, which includes a display portion 9412 and operation buttons 9413, and a communication device 9400 in a housing 9401, which includes operation buttons 9402, an external input terminal 9403, a microphone 9404, a speaker 9405, and a light-emitting portion 9406 that emits light when a phone call is received. The display device 9410 which has a display function can be detached from or attached to the communication device 9400 which has a phone function, in two directions represented by the allows. Thus, the display device 9410 and the communication device 9400 can be attached to each other along their short sides or long sides. In addition, when only the display function is needed, the display device 9410 can be detached from the communication device 9400 and used alone. Images or input information can be transmitted or received by wireless or wire communication between the communication device 9400 and the display device 9410, each of which has a rechargeable battery.

Embodiment 9

In this embodiment, an example of a display device including a thin film transistor in which a wiring and an oxide semiconductor layer are in contact with each other is described with reference to FIG. 26. It is to be noted that the same portions in FIG. 26 as those in FIG. 1A will be described with use of the same reference numerals.

Figure 26:
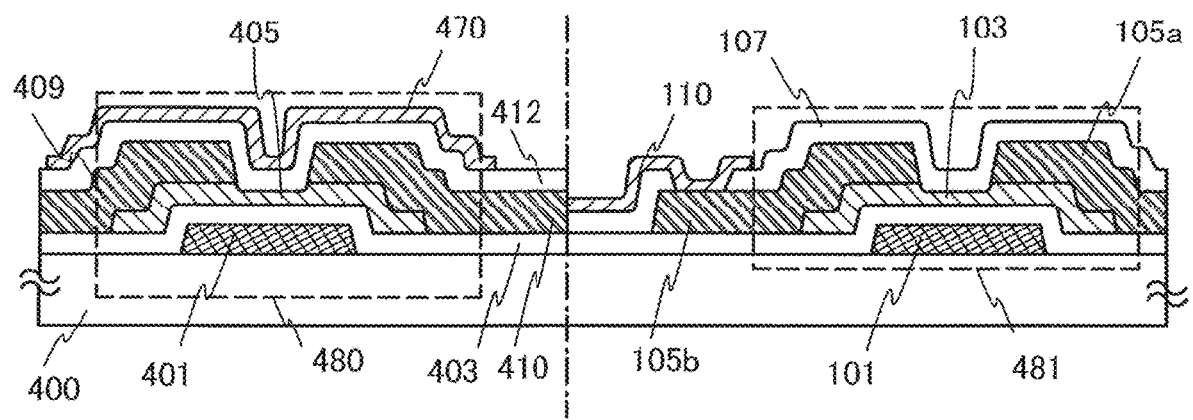
FIG. 26 is a cross-sectional view illustrating a semiconductor device of Embodiment 9.

A first thin film transistor 480 illustrated in FIG. 26 is a thin film transistor used in a driver circuit, in which a first wiring 409 and a second wiring 410 are provided in contact with an oxide semiconductor layer 405. The first thin film transistor 480 includes a first gate electrode 401 below the oxide semiconductor layer 405 and a second gate electrode 470 above the oxide semiconductor layer 405.

In addition, a second thin film transistor 481 is a thin film transistor used in a pixel portion, in which source or drain electrode layers 105a and 105b are provided in contact with the oxide semiconductor layer 103.

The semiconductor device of this embodiment has a structure in which the wiring and the oxide semiconductor layer are in contact with each other, and thus the number of steps can be reduced as compared with that of Embodiment 1.

This embodiment can be combined with any structure of the other embodiments.

This application is based on Japanese Patent Application serial no. 2008-274540 filed with Japanese Patent Office on Oct. 24, 2008, the entire contents of which are hereby incorporated by reference.

REFERENCE NUMERAL

100: substrate, 101: gate electrode, 102: gate insulating layer, 103: oxide semiconductor layer, 104a, 104b: n' layer, 105a, 105b: source or drain electrode layer, 107: protective insulating layer, 108: capacitor wiring, 109: oxide semiconductor film, 110: pixel electrode, 111: oxide semiconductor film, 120: connection electrode, 121: first terminal, 122: second terminal, 125: contact hole, 126: contact hole, 127: contact hole, 128: transparent conductive film, 129: transparent conductive film, 131: resist mask, 132: conductive film, 150: second terminal, 151: first terminal, 152: gate insulating layer, 153: connection electrode, 154: protective insulating film, 155: transparent conductive film, 156: electrode, 170: second thin film transistor, 400: substrate: 401: first gate electrode, 402: gate electrode, 403: first gate insulating layer, 404: contact hole, 405: oxide semiconductor layer, 407: oxide semiconductor layer, 409: first wiring, 410: second wiring, 411: third wiring, 412: second gate insulating layer, 430: first thin film transistor, 431: second thin film transistor, 432: thin film transistor, 433: thin film transistor, 470: second gate electrode, 471: electrode, 472: first electrode, 473: insulating layer, 474: second electrode, 475: light-emitting layer, 476: electrode, 581: thin film transistor, 583: insulating layer, 584: insulating layer, 585: insulating layer, 587: first electrode layer, 588: second electrode layer, 589; spherical particle, 594: cavity, 595: filler.

The invention claimed is:

1. A semiconductor device comprising:
a first transistor, a second transistor, a third transistor, a fourth transistor, and a fifth transistor,
wherein one of a source and a drain of the first transistor is electrically connected to a gate line,
wherein the other of the source and the drain of the first transistor is electrically connected to a clock signal line,
wherein one of a source and a drain of the second transistor is electrically connected to the gate line,
wherein the other of the source and the drain of the second transistor is electrically connected to a first power supply line,
wherein one of a source and a drain of the third transistor is electrically connected to a gate electrode of the second transistor,
wherein the other of the source and the drain of the third transistor is electrically connected to the first power supply line,
wherein a gate electrode of the third transistor is electrically connected to one of a source and a drain of the fourth transistor,
wherein the other of the source and the drain of the fourth transistor is electrically connected to the first power supply line,
wherein a gate electrode of the fourth transistor is electrically connected to the gate electrode of the second transistor,
wherein one of a source and a drain of the fifth transistor is electrically connected to the gate electrode of the third transistor,
wherein the other of the source and the drain of the fifth transistor is electrically connected to a second power supply line,
wherein a gate electrode of the fifth transistor is electrically connected to a first signal line,
wherein the semiconductor device further comprises:
a first conductive layer comprising a region which functions a gate electrode of the first transistor;
a second conductive layer comprising a region which functions as the one of the source and the drain of the third transistor; and
a third conductive layer comprising a region which functions as the gate electrode of the fourth transistor, and
wherein the first conductive layer is electrically connected to the third conductive layer through the second conductive layer.

2. The semiconductor device according to claim 1, further comprising:
a fourth conductive layer comprising a region which functions as the gate electrode of the third transistor,
wherein the second conductive layer comprises a region overlapping with the fourth conductive layer in a region where the second conductive layer does not overlap with a semiconductor layer included in the third transistor.

3. The semiconductor device according to claim 1, wherein, when the first power supply line is in a conduction state with at least the gate electrode of the first transistor and the gate electrode of the third transistor through a channel formation region of the fourth transistor, a potential of the first power supply line is input to at least the gate electrode of the first transistor and the gate electrode of the third transistor through the channel formation region of the fourth transistor, and
wherein, when the second power supply line is in a conduction state with at least the gate electrode of the first transistor and the gate electrode of the third transistor through a channel formation region of the fifth transistor, a potential of the second power supply line is input to at least the gate electrode of the first transistor and the gate electrode of the third transistor through the channel formation region of the fifth transistor.

4. The semiconductor device according to claim 1, further comprising a sixth transistor,
wherein one of a source and a drain of the sixth transistor is electrically connected to a gate electrode of the third transistor,
wherein the other of the source and the drain of the sixth transistor is electrically connected to the first power supply line, and
wherein a gate electrode of the sixth transistor is electrically connected to a second signal line.

5. The semiconductor device according to claim 4,
wherein, when the first power supply line is in a conduction state with at least the gate electrode of the first transistor and the gate electrode of the third transistor through a channel formation region of the sixth transistor, a potential of the first power supply line is input to at least the gate electrode of the first transistor and the gate electrode of the third transistor through the channel formation region of the sixth transistor.

6. The semiconductor device according to claim 1,
wherein at least one of the first transistor, the second transistor, the third transistor, the fourth transistor, and the fifth transistor comprises an oxide semiconductor in a channel formation region.

7. The semiconductor device according to claim 1,
wherein the second conductive layer comprises a region positioned over the first conductive layer and a region positioned over the third conductive layer.

8. A semiconductor device comprising:
a first transistor, a second transistor, a third transistor, a fourth transistor, a fifth transistor, and a sixth transistor,
wherein one of a source and a drain of the first transistor is electrically connected to a gate line,
wherein the other of the source and the drain of the first transistor is electrically connected to a clock signal line,
wherein one of a source and a drain of the second transistor is electrically connected to the gate line,
wherein one of a source and a drain of the third transistor is electrically connected to a gate electrode of the second transistor,
wherein the other of the source and the drain of the third transistor is electrically connected to a power supply line,
wherein a gate electrode of the third transistor is electrically connected to a first signal line,
wherein one of a source and a drain of the fourth transistor is electrically connected to a gate electrode of the first transistor,
wherein the other of the source and the drain of the fourth transistor is electrically connected to the power supply line, wherein a gate electrode of the fourth transistor is electrically connected to the gate electrode of the second transistor, wherein one of a source and a drain of the fifth transistor is electrically connected to the gate electrode of the first transistor, wherein a gate electrode of the fifth transistor is electrically connected to the first signal line, wherein one of a source and a drain of the sixth transistor is electrically connected to the gate electrode of the second transistor, wherein the other of the source and the drain of the sixth transistor is electrically connected to a first wiring, wherein a gate electrode of the sixth transistor is electrically connected to the first wiring, wherein the semiconductor device further comprises:
- a first conductive layer comprising a region which functions as a gate electrode of the second transistor;
- a second conductive layer comprising a region which functions as the one of the source and the drain of the third transistor;
- a third conductive layer comprising a region which functions as the gate electrode of the fourth transistor; and
- a fourth conductive layer comprising a region which functions as the gate electrode of the third transistor, wherein the first conductive layer is electrically connected to the third conductive layer through the second conductive layer, and wherein the second conductive layer overlaps with the fourth conductive layer in a region where the second conductive layer does not overlap with a semiconductor layer of the third transistor.

9. The semiconductor device according to claim 8, wherein, when the other of the source and the drain of the second transistor is in a conduction state with the gate line at least through a channel formation region of the second transistor, a potential that makes the gate line low is input to the gate line at least through the channel formation region of the second transistor, and wherein when the other of the source and the drain of the fifth transistor is in a conduction state with the gate electrode of the first transistor at least through a channel formation region of the fifth transistor, a potential that makes the first transistor on is input to the gate electrode of the first transistor through at least the channel formation region of the fifth transistor.

10. The semiconductor device according to claim 8, further comprising:
- a seventh transistor,
- wherein one of a source and a drain of the seventh transistor is electrically connected to the gate electrode of the first transistor,
- wherein the other of the source and the drain of the seventh transistor is electrically connected to the power supply line, and
- wherein the gate electrode of the seventh transistor is electrically connected to a second signal line.

11. The semiconductor device according to claim 8, wherein at least one of the first transistor, the second transistor, the third transistor, the fourth transistor, the fifth transistor, and the sixth transistor comprises an oxide semiconductor in a channel formation region.

12. The semiconductor device according to claim 8, further comprising:
- a seventh transistor,
- wherein one of a source and a drain of the seventh transistor is electrically connected to the gate electrode of the first transistor,
- wherein the other of the source and the drain of the seventh transistor is electrically connected to the power supply line,
- wherein the gate electrode of the seventh transistor is electrically connected to a second signal line, and
- wherein at least one of the first transistor, the second transistor, the third transistor, the fourth transistor, the fifth transistor, and the sixth transistor comprises an oxide semiconductor in a channel formation region.

13. The semiconductor device according to claim 8, wherein the second conductive layer comprises a region positioned over the first conductive layer, and wherein the second conductive layer comprises a region positioned over the third conductive layer.

* * * * *